United States Patent
Fukami

(10) Patent No.: US 8,023,315 B2
(45) Date of Patent: Sep. 20, 2011

(54) MAGNETORESISTIVE EFFECT ELEMENT AND MAGNETIC RANDOM ACCESS MEMORY

(75) Inventor: Shunsuke Fukami, Tokyo (JP)

(73) Assignee: NEC Corporation, Tokyo (JP)

( * ) Notice: Subject to any disclaimer, the term of this patent is extended or adjusted under 35 U.S.C. 154(b) by 52 days.

(21) Appl. No.: 12/526,994

(22) PCT Filed: Jan. 10, 2008

(86) PCT No.: PCT/JP2008/050196
§ 371 (c)(1),
(2), (4) Date: Oct. 6, 2009

(87) PCT Pub. No.: WO2008/099626
PCT Pub. Date: Aug. 21, 2008

(65) Prior Publication Data
US 2010/0091555 A1    Apr. 15, 2010

(30) Foreign Application Priority Data
Feb. 13, 2007 (JP) .................. 2007-031769

(51) Int. Cl.
*G11C 11/15* (2006.01)
(52) U.S. Cl. .......... 365/158; 365/157; 365/173
(58) Field of Classification Search .......... 365/157
See application file for complete search history.

(56) References Cited

U.S. PATENT DOCUMENTS

| | | | |
|---|---|---|---|
| 6,545,906 B1 | 4/2003 | Savtchenko et al. | |
| 6,888,742 B1 | 5/2005 | Nguyen et al. | |
| 6,956,765 B2 * | 10/2005 | Saito et al. | 365/158 |
| 7,064,974 B2 | 6/2006 | Suzuki et al. | |
| 7,184,301 B2 | 2/2007 | Sugibayashi et al. | |
| 7,459,737 B2 * | 12/2008 | Ohmori et al. | 257/295 |
| 7,768,824 B2 * | 8/2010 | Yoshikawa et al. | 365/173 |
| 2005/0002229 A1 | 1/2005 | Matsutera et al. | |

FOREIGN PATENT DOCUMENTS

| | | | |
|---|---|---|---|
| JP | 2004153070 A | 5/2004 | |
| JP | 2004172614 A | 6/2004 | |
| JP | 2004179183 A | 6/2004 | |
| JP | 2004348934 A | 12/2004 | |
| JP | 2005109470 A | 4/2005 | |
| JP | 2005191032 A | 7/2005 | |
| JP | 2005223086 A | 8/2005 | |
| JP | 2005277147 A | 10/2005 | |
| JP | 2005294340 A | 10/2005 | |

OTHER PUBLICATIONS

International Search Report for PCT/JP2008/050196 mailed Apr. 15, 2008.
Notice of Allowance for U.S. Appl. No. 11/996,711 mailed Dec. 7, 2010.

* cited by examiner

*Primary Examiner* — Tan T. Nguyen

(57) ABSTRACT

A magnetic random access memory has a laminating structure including: a magnetization free layer; an insulating layer; and a magnetization fixed layer. The magnetization free layer includes: a sense layer; a first bonding layer being adjacent to the sense layer; and a storage layer being adjacent to the first bonding layer on an opposite side to the sense layer. At least a part of the sense layer and the storage layer is magnetically coupled to one another through the first bonding layer. A magnetic anisotropy of the storage layer is larger than that of the sense layer. A product of a saturation magnetization and a volume of the sense layer is larger than that of the storage layer. According to such a structure, a magnetic random access memory can be provided in which a current for writing is reduced while enough thermal stability is maintained.

27 Claims, 52 Drawing Sheets

MAGNETORESISTIVE EFFECT ELEMENT AND MAGNETIC RANDOM ACCESS MEMORY

This application is the National Phase of PCT/JP2008/050196, filed Jan. 10, 2008, which is based on and claims priority from Japanese Patent Application No. 2007-31769 filed on Feb. 13, 2007. The disclosure of the Japanese Patent Application is incorporated herein by reference.

TECHNICAL FIELD

The present invention relates to a magnetoresistive effect element and a magnetic random access memory. This application is based on Japanese Patent Application No. 2007-31769 filed on Feb. 13, 2007. The disclosure of the Japanese Patent Application is incorporated herein by reference.

BACKGROUND ART

In recent years, a magnetic random access memory (MRAM) has been proposed and studies of MRAM have been actively made toward practical application. The magnetic random access memory operates as a nonvolatile random access memory by using a magnetic body as a storage element, ensures rewrite resistance of $10^{15}$ times or more and can perform switching on a time scale of a few nanoseconds or less. In consideration with these conditions, there is demand that the magnetic random access memory can act as a high-speed nonvolatile random access memory operating at a few 100 MHz or higher.

The magnetic random access memory is formed of a magnetoresistive effect element. The magnetoresistive effect element includes a magnetization free layer, an insulating layer and a magnetization fixed layer, and the magnetization fixed layer is generally adjacent to an antiferromagnetic layer. The magnetization free layer, the insulating layer and the magnetization fixed layer are laminated in this order to form magnetic tunnel junction (MTJ). The magnetization fixed layer includes a relatively hard ferromagnet and its magnetization direction is fixed at substantially one direction by the antiferromagnetic layer provided adjacent to the magnetization fixed layer. The magnetization fixed layer acts as reference in reading. Meanwhile, the magnetization free layer includes a relatively soft ferromagnet and magnetic anisotropy is provided so that its magnetization direction may be parallel or antiparallel to magnetization of the magnetization fixed layer. The magnetization free layer functions as an information storage site. The insulating layer is made of an insulating material. Information "0" or "1" is stored in the magnetic random access memory depending on whether magnetization of the magnetization free layer is parallel or antiparallel to that of the magnetization fixed layer.

To read the information in the magnetic random access memory, a magnetoresistive effect is utilized. That is, the information is read by passing a current passing through the MTJ and detecting a difference between resistance values of MTJ due to a difference between magnetization of the magnetization free layer and magnetization of the magnetization fixed layer in relative angle.

Meanwhile, various methods of writing information into the magnetic random access memory have been proposed. The methods are broadly divided into a magnetic field write method and a spin injection write method.

According to the spin injection write method, by changing a direction of the current passing through the MTJ, the magnetization of the magnetization free layer is reversed through spin torque transfer with respect to the magnetization of the magnetization fixed layer. According to the spin injection write method, a current required for writing is proportional to the area of the MTJ. Accordingly, as the area of the MTJ is smaller, the value of the current required for writing becomes smaller. In other words, the spin injection write method has a good scaling property and is expected as means capable of achieving a large-capacity magnetic random access memory.

However, according to the spin injection write method, a relatively large current passes through the MTJ in writing, possibly resulting in poor rewrite resistance property. Withstanding pressure of the insulating layer is also cited as an applicational problem. Furthermore, spin injection magnetization reversal takes relatively longer time than magnetization reversal by magnetic field, which is disadvantageous for a high-speed operation. In other words, there are various problems in realizing a high-speed and high-reliability random access memory according to the spin injection write method.

On the other hand, magnetization reversal by a magnetic field occurs in a nanosecond or less, and since no large current passes through the insulating layer, reliability is assured, reliability is assured. Thus, for the magnetic random access memory capable of operating at high speed, it is desired to use the magnetic field write method.

Generally, according to the magnetic field write method in the magnetic random access memory, a magnetic field induced when a current passes to a write interconnection disposed in a vicinity of the MTJ is utilized. In most magnetic random access memories according to currently studied and developed magnetic field write methods, a magnetoresistive effect element is disposed at an intersection of two write interconnections orthogonal to each other and writing is performed by a synthetic magnetic field applied to the magnetization free layer when a current passes to the two write interconnections (hereinafter referred to as a biaxial write method).

The most common biaxial write method is an asteroid method. According to this method, a current passes to two write interconnections which are orthogonal to each other simultaneously and the magnetization free layer is magnetically reversed by the synthetic magnetic field. At this time, the magnetic field induced by one write interconnection is applied to a cell located in a same column or row as a selected cell, causing a so-called semi-selected state. To prevent magnetization reversal in the semi-selected state, recording must be performed within a limited margin. In other words, the asteroid method has a problem in cell selectivity.

Document 1 (specification of U.S. Pat. No. 6,545,906) proposes a toggle method as a biaxial write method solving the cell selectivity problem. According to the toggle method, a current sequentially passes to the two write interconnections which are orthogonal to each other, thereby causing magnetization reversal. Although the toggle method can solve the cell selectivity problem substantially completely, reading must be performed before writing, which is unsuitable for high-speed operation.

Document 2 (Japanese Laid-Open Patent Application JP-P2004-348934A) proposes a uniaxial magnetic field write method. According to this method, the above-mentioned problems in selectivity and high-speed property can be solved simultaneously. According to the uniaxial magnetic field method, one cell has one write interconnection and the write interconnection is connected to the source/drain of the MOS transistor. A gate of the MOS transistor is connected to a word line provided along a first direction and the other source/drain of the MOS transistor is connected to a bit line provided along a second direction. With such configuration, the problems in cell selectivity and high-speed property can be solved simultaneously. Thus, it can be said that the uniaxial magnetic field method is a desirable method for achieving the magnetic random access memory capable of performing a high-speed operation.

DISCLOSURE OF INVENTION

However, any of the above-mentioned magnetic field write methods requires a current of a few [mA] for writing. In consideration of thermal stability and disturbance magnetic field resistance of the magnetization free layer, a magnetic field necessary for writing to the magnetization free layer must be designed to several dozens of [Oe] and the magnetic field induced by the current a few [Oe] to a dozen [Oe] per 1 [mA]. In this point, the magnetic random access memory is inferior to the other random access memories, for example, a static random access memory (SRAM). In a case where the magnetic random access memory is made practicable as a high-speed random access memory, it is desired that the current required for writing is reduced to 1 [mA] or less, more preferably, 0.5 [mA] or less.

Generally, the write current is proportional to magnitude of the anisotropic magnetic field of a magnetization free layer. Accordingly, if the anisotropic magnetic field of the magnetization free layer is reduced, the write current is decreased. However, in a state where no current is applied, information must be stably held in the magnetization free layer.

Magnitude of energy barrier ($\Delta E$) in a path where magnetization of the magnetization free layer is reversed serves as an index for thermal stability of stored information. To stably hold the stored information for 10 years, it is desired that $\Delta E/k_B T$ ($k_B$: Boltzmann constant, T: absolute temperature) is 60 or greater. Here, $\Delta E$ is proportional to the anisotropic magnetic field of the magnetization free layer, the saturation magnetization of the magnetization free layer and the volume of the magnetization free layer.

Accordingly, for example, in a case where the anisotropic magnetic field of the magnetization free layer is set small to reduce the current required for writing, since $\Delta E$ is small, thermal stability is low. When the saturation magnetization of the magnetization free layer or a film thickness of the magnetization free layer is made large to prevent lowering of the thermal stability, $\Delta E$ increases, but an effective anisotropic magnetic field (in particular, the anisotropic magnetic field by shape magnetic anisotropy) increases depending on the saturation magnetization and the film thickness of the magnetization free layer. For this reason, the current required for writing increases.

Meanwhile, when the area of the magnetization tree layer is increased, the volume of the magnetization free layer increases, the thermal stability is improved and the anisotropic magnetic field of the magnetization free layer does not increase, so that the magnetic field required for writing is decreased. However, when the area of the magnetization free layer is increased, the width of the write interconnection for writing necessarily increases. In this case, the conversion efficiency of the current into the magnetic field lowers. Accordingly, the write current is not sufficiently decreased. As described above, there is a trade-off between decrease in the write current and securement of the thermal stability.

An object of the present invention is to decrease a write current in the magnetic random access memory according to a magnetic field write method without lowering the thermal stability.

A magnetic random access memory of the present invention includes a plurality of magnetic memory cells arranged in an array. Each of the magnetic memory cells has an interconnection layer and a magnetoresistive effect element. The magnetoresistive effect element includes a magnetization free layer, an insulating layer, a magnetization fixed layer and an antiferromagnetic layer.

The magnetization fixed layer is formed of a ferromagnet and its magnetization direction is fixed to substantially one direction by the adjacent antiferromagnetic layer.

The insulating layer is sandwiched between the magnetization fixed layer and the magnetization free layer. The insulating layer is made of an insulating material. The magnetization fixed layer, the insulating layer and the magnetization free layer form a magnetic tunnel junction (MTJ).

The magnetization free layer includes a sense layer, a first bonding layer and a storage layer which is adjacent to the first bonding layer and provided on the opposite side to the sense layer. The sense layer and the storage layer each are formed as a ferromagnet. Preferably, a volume of the sense layer is larger than that of the storage layer. More preferably, the area of the sense layer is different from that of the storage layer and the storage layer is provided so as to be included within the sense layer in the planar shape. Still more preferably, the magnetic volume (saturation magnetization×volume) of the sense layer is larger than that of the storage layer.

The sense layer is magnetically coupled to the storage layer through the first bonding layer. Although the coupling mode is desirably ferromagnetic coupling, it may be ferrimagnetic coupling. Magnetic anisotropy is applied to the storage layer so that magnetization may be parallel or antiparallel to that of the magnetization fixed layer. It is desired that a shape of the storage layer is set to have an aspect ratio of 1 to 5. In a single layer, magnetic anisotropy of the sense layer is desired to be extremely small. Preferably, it is desired that the shape of the sense layer is set to have an aspect ratio of 0.5 to 2.0.

The interconnection layer is provided in the vicinity of the magnetization free layer and made of a conductive material. Its both ends are connected to a contact interconnection and a source/drain of an MOS transistor. A source/drain of the MOS transistor which is on the opposite side to a side connected to the interconnection layer is connected to a bit line. A gate of the MOS transistor is connected to a word line.

One end of the magnetoresistive effect element is connected to the interconnection layer and the other end is connected to a ground line.

Effects

In an embodiment of the present invention, the magnetization free layer includes two ferromagnetic layers: a sense layer and a storage layer, and these layers are magnetically coupled to each other by a first bonding layer. Since magnetic anisotropy of the sense layer is set to relatively small, in the case of a single layer, it sensitively responds to a small magnetic field, causing magnetization reversal. Meanwhile, the magnetic anisotropy of the storage layer is set to relatively large and when the magnetic field is not applied, sufficient thermal stability is ensured. When the magnetic field is applied to the system that the sense layer is magnetically coupled to the storage layer, the sense layer having small magnetic anisotropy attempts to be oriented in the direction of the magnetic field, while the storage layer tends to keep its state unless the magnetic field is a certain value or more. Here, when there is a difference between the sense layer and the storage layer in magnetic volume, to reduce total energy of the system, the magnetization of the storage layer is reversed even in a magnetic field which is not reversed in a single storage layer.

On the other hand, when no magnetic field is applied, the sufficient thermal stability in this system is ensured by the storage layer.

When a current passes to the interconnection layer, a magnetic field occurs at the position of the magnetization free layer. By the above-mentioned principle, even when the magnetic field is small, magnetization reversal occurs. Thus, information can be written with a low current.

A first effect of an embodiment of the present invention is that by forming a magnetization free layer to have a multilayer structure including a sense layer having small magnetic anisotropy and a large magnetic volume, a storage layer having relatively large magnetic anisotropy and a small magnetic volume and a first bonding layer for magnetically coupling the former two layers to each other, a magnetic random access memory capable of achieving decrease in a write current while ensuring a necessary value of thermal stability can be provided.

A second effect is that by magnetically coupling the sense layer having a small magnetic anisotropy to the storage layer having relatively large magnetic anisotropy, in the magnetization free layer with a reduced writing magnetic field, a magnetic random access memory capable of effectively preventing an intermediate state and stably holding the state of "0" or "1" can be provided.

A third effect is that by optically designing the storage layer to improve the thermal stability, it is no need to set the film thickness of the sense layer to be large and a magnetic random access memory with reduced variation in the writing magnetic field can be provided.

A fourth effect is that since writing can be performed with a low current even when magnetic anisotropy of the storage layer is relatively large, a material having a high polarizability can be used as the material for the storage layer and thus, a magnetic random access memory capable of obtaining a large reading margin can be provided.

BEST MODE FOR CARRYING OUT THE INVENTION

Embodiments for implementing a magnetic random access memory according to the present invention will be described referring to the accompanying drawings. A magnetic random access memory according to the present embodiment has a plurality of magnetic memory cells arranged in an array. Each magnetic memory cell has a magnetoresistive effect element.

First Embodiment

Structure of Magnetic Memory Cell

Figure 1:
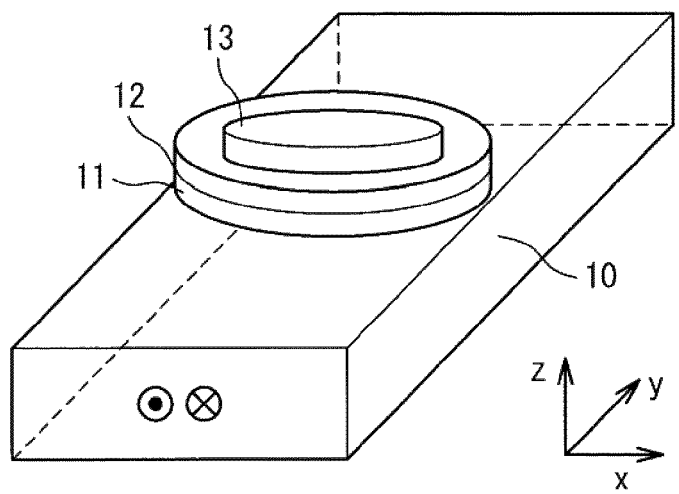
FIG. 1 is a perspective view of a magnetic memory cell according to a first embodiment.
Figure 2:
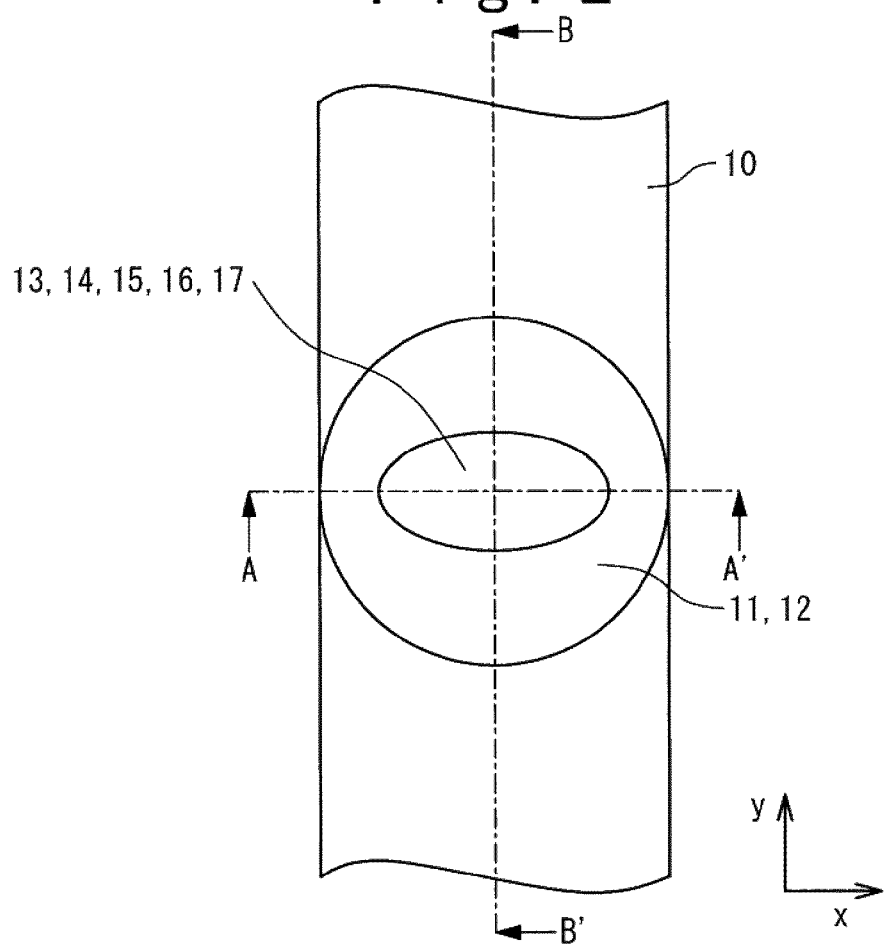
FIG. 2 is a plan view of the magnetic memory cell according to the first embodiment.
Figure 3:
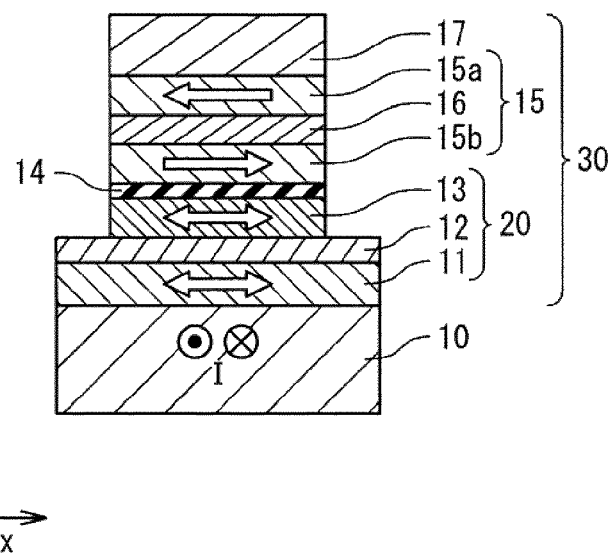
FIG. 3 is a sectional view of the magnetic memory cell according to the first embodiment.
Figure 4:
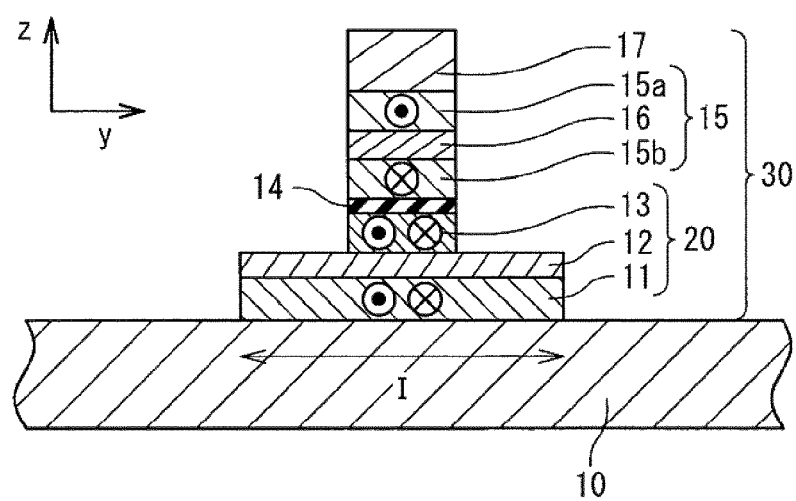
FIG. 4 is a sectional view of the magnetic memory cell according to the first embodiment.

FIG. 1 is a perspective view showing a structure of a main portion of a magnetic memory cell according to a first embodiment. FIG. 2 is a plan view, FIG. 3 is a sectional view along A-A' in FIG. 2 and FIG. 4 is a sectional view along B-B' in FIG. 2. The magnetic memory cell according to the first embodiment of the present invention includes an interconnection layer 10 extending in the y-axis direction and a magnetoresistive effect element 30. The magnetoresistive effect element 30 includes a magnetization free layer 20, an insulating layer 14, a magnetization fixed layer 15 and an antiferromagnetic layer 17. The insulating layer 14 is sandwiched between the magnetization free layer 20 and the magnetization fixed layer 15, and the magnetization free layer 20, the insulating layer 14 and the magnetization fixed layer 15 form magnetic tunnel junction (MTJ).

The magnetization fixed layer 15 is formed of a ferromagnet, preferably, as shown in FIGS. 3 and 4, a multilayer film including a second bonding layer 16. FIGS. 3 and 4 shows a case where the magnetization fixed layer 15 is formed of a first magnetization fixed layer 15a, the second bonding layer 16 and a second magnetization fixed layer 15b which abuts the second bonding layer on the opposite side to the first magnetization fixed layer 15a. In this case, it is desired that the magnetization fixed layers which are neighboring to each other, that is, the first magnetization fixed layer 15a and the second magnetization fixed layer 15b in the figures are ferrimagnetically coupled to each other. The antiferromagnetic layer 17 is provided adjacent to the magnetization fixed layer 15 or at least one ferromagnetic layer in the magnetization fixed layer 15, and magnetization is fixed substantially in one direction in one layer. Examples of materials for the first magnetization fixed layer 15a, the second bonding layer 16, the second magnetization fixed layer 15b and the antiferromagnetic layer 17 in FIGS. 3 and 4 are CoFe/Ru/CoFe/PtMn.

The magnetization free layer 20 includes a sense layer 11, a first bonding layer 12 and a storage layer 13 which is adjacent to the first bonding layer 12 on the opposite side to the sense layer 11. The sense layer 11 and the storage layer 13 each are formed of a ferromagnet. Preferably, a volume of the sense layer 11 is larger than that of the storage layer 13. More preferably, the area of the sense layer 11 is different from that of the storage layer 13 and in arrangement relationship in the x-y plane, as shown in FIG. 2, the storage layer 13 is provided so as to be included within the sense layer 11. Still more preferably, the storage layer 13 is provided in the center of the sense layer 11 in the x-y plane. The sense layer 11 is magnetically coupled to the storage layer 13 through the first bonding layer 12. Although the coupling mode is desirably ferromagnetic coupling, it may be ferrimagnetic coupling. Magnetic anisotropy is provided to the storage layer 13 so that the magnetization is parallel or antiparallel to magnetization of the magnetization fixed layer 15. The magnetic anisotropy may be controlled by shape or may be controlled by its material, tissue or crystal structure.

It is desired that the shape of the storage layer 13 has an aspect ratio ((length in the x direction)/(length in the y direction)) of 1 to 5. This is due to that, when the aspect ratio is 1 or more, shape magnetic anisotropy is provided, and when the aspect ratio is set to an excessive value and excessive large shape magnetic anisotropy is provided, the switching magnetic field is increased.

In a single layer, the sense layer 11 is set to have very small magnetic anisotropy. Preferably, the shape of the sense layer 11 is set to have the aspect ratio ((length in the x direction)/(length in the y direction)) of 0.5 to 2.0. A result of simulation operation described later reveals that a preferably reduced switching magnetic field can be obtained in a shape with near 1 of aspect ratio. Although the planar shape of the storage layer 13 and the sense layer 11 is an ellipse in FIG. 2, it is not limited to an ellipse. Also in this case, the aspect ratio is defined in a similar manner, (length in the x direction)/(length in the y direction). A specific shape is exemplified in twelfth and thirteenth modifications.

The sense layer 11 and the storage layer 13 contain at least one type of element selected from Fe, Co and Ni. The sense layer 11 and the storage layer 13 may contain at least one type of element selected from Ag, Cu, Au, B, C, N, O, Mg, Al, Si, P, Ti, Cr, Zr, Nb, Mo, Hf, Ta, W, Pd and Pt. By adding these nonmagnetic elements, adjustment can be made so that a desirable magnetic characteristic is obtained.

The interconnection layer 10 is electrically conductive and provided along the y axis in the figures. Its both ends are connected to the source/drain of an MOS transistor through, for example, a contact interconnection. Examples of materials of the interconnection layer 10 are Al, Cu.

It is desired that the insulating layer 14 is made of an insulating material such as $Al_2O_3$, $SiO_2$, MgO and AlN. The insulating layer 14 may be also made of nonmagnetic conductive materials such as Cu, Zn, Al, Au and Ag.

It is desired that the magnetic coupling by the first bonding layer 12 is exchange coupling. For example, by using Ru as a material for the first bonding layer 12, the sense layer 11 can be magnetically coupled to the storage layer 13 by RKKY interaction. Alternatively, by using a very thin metal layer having the thickness of about 1 nm or less, the sense layer 11 can be directly coupled to the storage layer 13 through exchange coupling.

By omitting the first bonding layer 12, the sense layer 11 can be strongly coupled to the storage layer 13. According to micro magnetic simulation operation, by adjusting the bond strength to fall within a proper range, the magnetic field required for inversion can be reduced. The bond strength can be adjusted based on the film thickness and crystallizability of the bonding layer 12.

(Operation Principle)

The magnetic random access memory according to an embodiment of the present invention can achieve reduction in a write current. The principle will be analytically described below.

Figure 5:
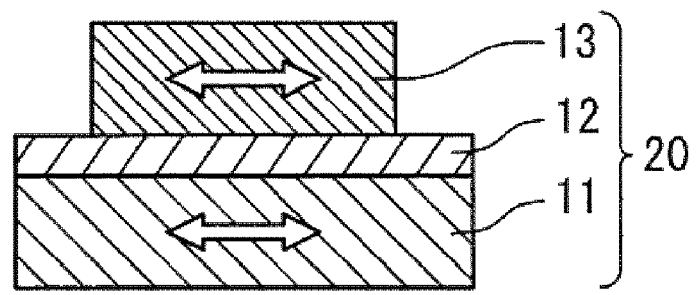
FIG. 5 shows a model for describing an operation principle of a magnetic memory cell.

First, a magnetization free layer 20 is modeled as shown in FIG. 5. In the model, the magnetization free layer 20 includes a sense layer 11, a first bonding layer 12 and a storage layer 13. The sense layer 11 and the storage layer 13 each includes a ferromagnet having spontaneous magnetization and have a single-domain structure for simplicity. Here, it is defined that anisotropic magnetic field, saturation magnetization and the volume of the sense layer 11 are $H_{k1}$, $M_1$ and $V_1$, respectively, and anisotropic magnetic field, saturation magnetization and the volume of the storage layer 13 are $H_{k2}$, $N_2$ and $V_2$, respectively. For simplification, it is given that in-plane shape of the sense layer 11 is equal to that of the storage layer 13 and the sense layer 11 is ferromagnetically coupled to the storage layer 13 on the whole surface by the first bonding layer 12.

Now, it is considered that an external magnetic field $H_{ext}$ is applied to this system. Here, it is given that the direction of $H_{ext}$ is the same as the directions of $H_{k1}$ and $H_{k2}$. It is given that the angle which the magnetization $M_1$ of the sense layer forms with the external magnetic field $H_{ext}$ is $\theta_1$ and the angle which magnetization of the storage layer forms with the external magnetic field $H_{ext}$ is $\theta_2$.

At this time, the energy E of the whole system is represented by the below-mentioned equation (1):

$$E=(\tfrac{1}{2})H_{k1}M_1V_1 \sin^2\theta_1 - H_{ext}M_1V_1 \cos\theta_1 + (\tfrac{1}{2})H_{k2}M_2V_2 \sin^2\theta_2 - H_{ext}M_2V_2 \cos\theta_2 - J\cos(\theta_1-\theta_2) \qquad (1)$$

Here, J is a constant representing strength of bonding by the first bonding layer 12. The first term and the third term represent magnetic anisotropy energy of the sense layer 11 and the magnetic anisotropy energy of the storage layer 13, respectively, and the second term and the fourth term represent Zeeman energy by an external magnetic field of the sense layer 11 and Zeeman energy by an external magnetic field of the storage layer 13, and the fifth term represents exchange energy by the first bonding layer 12 between the sense layer 11 and the storage layer 13.

Generally, a state of a system defined by $\theta_1$, $\theta_2$ which makes the energy represented by the equation (1) minimum is realized. A threshold magnetic field $H_{SW}$ at which a magnetization reversal occurs is calculated as a magnetic field at the time when magnetization of the sense layer 11 and the storage layer 13 shifts from a stable state to an unstable state in a direction of a magnetization easy axis. Accordingly, the threshold magnetic field is obtained by solving the determinant of the Hesse matrix of a second derivative for magnetization angles $\theta_1$, $\theta_2$ of the energy in the equation (1) with respect to the magnetic field.

An approximation is used below to obtain a clear expression of the threshold magnetic field. A magnetic memory cell forming a magnetic random access memory according to an embodiment of the present invention includes a magnetoresistive effect element 30 and the magnetoresistive effect element 30 includes a magnetization free layer 20 including a sense layer 11 and a storage layer 13. This magnetization free layer 20 is characterized in that the magnetic anisotropy of the sense layer 11 is set to be extremely small and the magnetic anisotropy of the storage layer 13 is set to be relatively large. Writing to the magnetoresistive effect element 30 is performed by a magnetic field which is slightly larger than the anisotropic magnetic field of the sense layer 11 and is sufficiently smaller than the anisotropic magnetic field of the storage layer 13. Based on this fact, the third term in the equation (1) which represents the magnetic anisotropy energy of the storage layer 13 is sufficiently larger than the fourth term as Zeeman energy of the storage layer 13 and the fourth term can be ignored. In other words, since magnetic anisotropy of the storage layer 13 is sufficiently large, the external magnetic field $H_{ext}$ of the storage layer 13 approximates zero.

By using the above-mentioned approximation, the above-mentioned determinant of the Hesse matrix becomes a linear expression with respect to the external magnetic field $H_{ext}$ and as the reverse magnetic field Hsw, the below-mentioned equation (2) is obtained.

$$Hsw=\{H_{k1}H_{k2}M^1M_2V_1V_2+(H_{k1}M_1V_1+H_{k2}M_2V_2)J\}/(M_1M_2V_1V_2H_{k2}+M_1V_1J) \qquad (2)$$

In the case where bond strength by the first bonding layer 12 is sufficiently large and magnetization of the sense layer 11 and the storage layer 13 is oriented in a same direction ($\theta_1=\theta_2$), the reverse magnetic field $H_{sw}$ is represented by the following equation (3).

$$H_{sw}=H_{k1}+(M_2V_2/M_1V_1)H_{k2} \qquad (3)$$

Although the equation (3) is a rough approximation, it expresses an essence of an embodiment of the present invention. That is, the reverse magnetic field $H_{sw}$ of the whole of the magnetization free layer 20 becomes the sum of "the anisotropic magnetic field $H_{k1}$ of the sense layer 11" and "the anisotropic magnetic field $H_{k2}$ of the storage layer 13"×"ratio of the magnetic volume of the storage layer 13 to that of the sense layer 11 $(M_2V_2/M_1V_1)$". The anisotropic magnetic field $H_{k1}$ of the sense layer 11 as the first term in the equation (3) is set to be extremely small. The anisotropic magnetic field $H_{k2}$ of the storage layer 13 in the second term is set to be relatively large, but the coefficient $(M_2V_2/M_1V_1)$ can be made to 1 or less by setting the volume $V_1$ of the sense layer 11 to be larger than the volume $V_2$ of the storage layer 13. In this manner, the second term in the equation (3) can be also set to be relatively small. Thus, the reverse magnetic field $H_{sw}$ of the magnetization free layer 20 can be reduced.

Meanwhile, the energy barrier ($\Delta E$) shown in FIG. 5 as an indicator of the thermal stability of the magnetization free layer 20 is obtained as a difference between energies in a state where magnetization is oriented in the easy axis direction and in a state where magnetization is oriented in the hard axis direction in the equation (1) and is represented by a below-mentioned equation (4).

$$\Delta E = (1/2)H_{k1}M_1V_1 + (1/2)H_{k2}M_2V_2 \quad (4)$$

The first term in the equation (4) represents an energy barrier in the single layer of the sense layer 11. Since the anisotropic magnetic field $H_{k1}$ of the sense layer 11 is set to be extremely small, this term becomes small. The second term in the equation (4) represents an energy barrier in the single layer of the storage layer 13. By providing sufficient magnetic anisotropy to the storage layer 13, this term can be made relatively large.

As described above, among the sense layer 11 and the storage layer 13 which constitute the magnetization free layer 20, the sense layer 11 has a characteristic of sensitively responding to a small external magnetic field and the storage layer 13 has a characteristic of ensuring sufficient thermal stability when a magnetic field is not applied. In this way, the sense layer and the storage layer 13 have different roles, which is an essential principle of this embodiment to decrease a current necessary for writing while maintaining the thermal stability.

In other words, when an external magnetic field is applied to the magnetization free layer 20, the sense layer 11 attempts to respond to it and, although a load by the storage layer 13 (the second term in the equation (3)) exists, reduces the load by properly setting a ratio of magnetic volume, enabling reversal by a small magnetic field. Thus, in the present embodiment, essentially, it is desired that the magnetization free layer 20 has a structure that the sense layer 11 having a small magnetic anisotropy is magnetically coupled to the storage layer 13 having a relatively large magnetic anisotropy by the first bonding layer 12 and the ratio $(M_2V_2/M_2V_1)$ of the magnetic volume of the sense layer 11 $(M_1V_1)$ to the magnetic volume of the storage layer 13 $(M_2V_2)$ is set to be small. Moreover, actually, the anisotropic magnetic field of the sense layer 11 has a certain limited value. Accordingly, the sense layer 11 can contribute to ensure thermal stability.

Such requirements for the sense layer 11 and the storage layer 13 can be adjusted depending on a planar shape, a film thickness and material of each layer. For example, magnetic anisotropy or saturation magnetization can be adjusted by the type of magnetic metal and alloy as well as addition of non-magnetic elements.

In a magnetic memory cell according to the first embodiment of the present invention, preferably, the area of the sense layer 11 is different from that of the storage layer 13 and the storage layer 13 in the x-y plane is shaped so as to be included within the sense layer 11 in the x-y plane. At this time, in the sense layer 11, there exists a region which is not magnetically coupled to the storage layer 13. This region is able to be magnetically reversed without receiving the above-mentioned load of the storage layer when the magnetic field is applied. Accordingly, in consideration of a difference between the sense layer 11 and the storage layer 13 in in-plane shape, a magnetic field necessary for reversal becomes smaller than derived by the above-mentioned analysis. Considering from another aspect, it is desired that the whole of the storage layer 13 is magnetically coupled to the sense layer 11, while a region of the sense layer 11 which is not magnetically coupled to the storage layer 13 is large. In other words, it is desired that a difference between the sense layer 11 and the storage layer 13 in area is large.

Writing of information to the magnetoresistive effect element 30 of a magnetic memory cell according to the first embodiment of the present invention is performed by passing a current to the interconnection layer 10 provided along the y-axis in a positive or negative direction along the y-axis and applying a magnetic field (Oersted field) thus generated to the magnetization free layer 20.

On the other hand, reading of information in a magnetic memory cell according to the first embodiment of the present invention is performed by utilizing the magnetoresistive effect. That is, reading is performed by passing a current so as to pass through the magnetization fixed layer 15, the insulating layer 14 and the magnetization free layer 20 and detecting a difference in a resistance value which varies depending on a relative angle of magnetization of the magnetization free layer 20 to the magnetization of the magnetization fixed layer 15.

(Result of Simulation Calculation)

Figure 6:
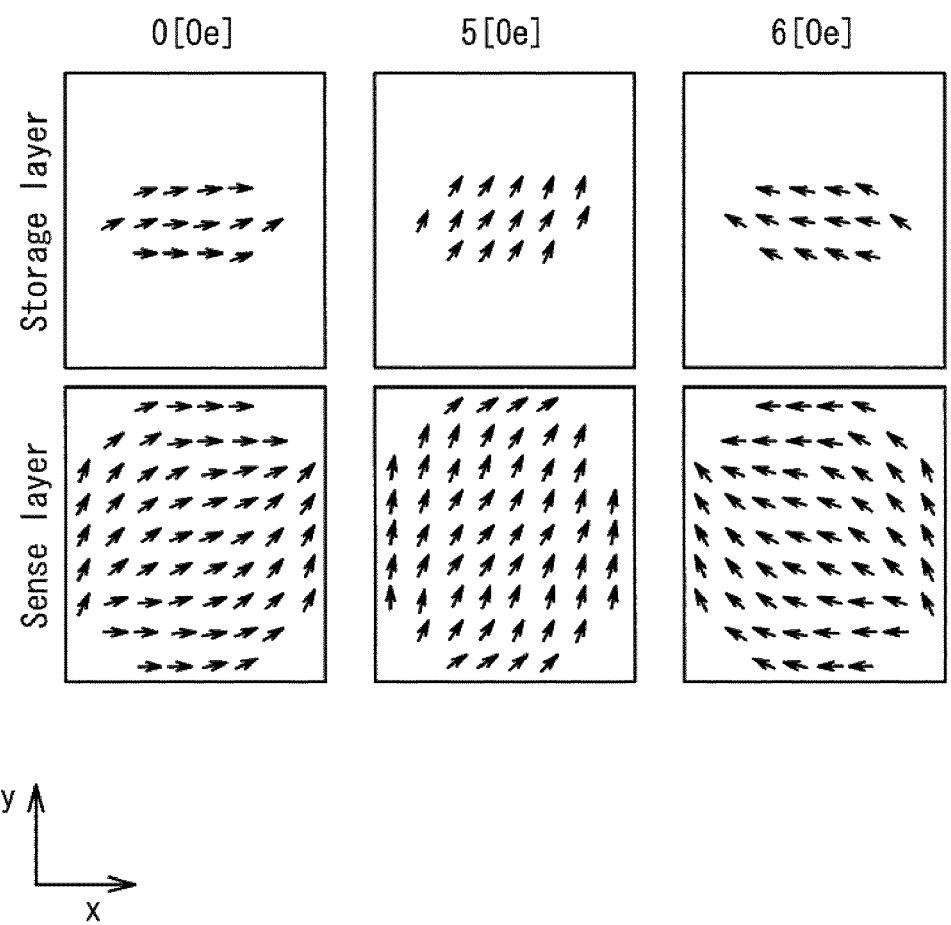
FIG. 6 shows results of simulation inspecting response of a magnetization free layer to an external magnetic field.

FIG. 6 shows calculation results of micro magnetic simulation inspecting a response mode of a magnetization free layer corresponding to an information storage site of the magnetic random access memory according to an embodiment of the present invention to the external magnetic field. The upper row in FIG. 6 shows behavior of a local magnetic moment of the storage layer and the lower row in FIG. 6 shows behavior of a local magnetic moment of the sense layer.

In performing simulation, it is given that the storage layer is an ellipse of 0.24×0.42 [µm²] having a long axis in the x direction, (saturation magnetization: Ms)×(film thickness: t)=1.2 [T·nm], the sense layer is an ellipse of 0.72×0.64 [µm²] having long axis in the y direction, (saturation magnetization: Ms)×(film thickness: t)=2.0 [T·nm] and bond strength by the first bonding layer is 100 [Oe]. A thermal stability index of this system ($\alpha = \Delta E/k_B T$; $k_B$ is Boltzmann constant and T is absolute temperature) is about 80. This is a sufficient value to guarantee thermal stability for 10 years. In simulation, it is assumed that magnetization of the sense layer and the storage layer is oriented in a right direction in this figure, a magnetic field in a left direction in this figure is applied to the layers, magnitude of the magnetic field is gradually increased and behavior of magnetic moment in each layer is inspected.

In FIG. 6, the magnetic moments are oriented to the right at 0 [Oe], start to be reversed at 5 [Oe] and are completely reversed and oriented to the left at 6 [Oe]. In other words, in a system having sufficient thermal stability, magnetization reversal at 6 [Oe] being an extremely small magnetic field is realized. The magnetic field of 6 [Oe] required for reversal can be generally generated by a current of 1 [mA] or less.

By actually passing a current to an interconnection and performing a simulation using the magnetic field induced by the current, it is demonstrated that writing at 0.5 [mA] is possible in the present embodiment by adjusting parameters of each layer.

(Structural Example of Magnetization Free Layer)

According to the above-mentioned analysis operation and micro magnetic simulation, effects of an embodiment of the present invention can be obtained when the magnetization free layer 20 has a following structure specifically. As described above, it is desired that magnetic anisotropy of the sense layer 11 is smaller than that of the storage layer 13 and the product of the saturation magnetization and the volume of the sense layer 11 is larger than that of the storage layer 13.

Generally, Ni—Fe, Co—Fe and alloys having these as main components are used as materials for the magnetization free layer of the magnetic random access memory and its crystal magnetic anisotropy constant is $1 \times 10^5$ [J/m$^3$] or less. The magnetic anisotropy of the magnetic element is provided mainly by a shape magnetic anisotropy. At this time, the long axis direction of the storage layer 13 is assumed to be an A direction and the short axis direction to be a B direction. When the ratio of the length of the A direction to the length of the B direction of the storage layer 13 is 1 to 5 and the ratio of the length of the A direction to the length of the B direction of the sense layer is 0.5 to 2.0, it is possible to adjust the requirement of magnitude relationship between the magnetic anisotropy of the sense layer 11 and the magnetic anisotropy of the storage layer 13 to be satisfied in the present embodiment.

Saturation magnetization of the above-mentioned material generally falls within a range of 0.4 to 2.0 [T]. In such case, it is possible to perform an adjustment for achieving effects according to an embodiment of the present invention when the following conditions are satisfied. The long axis direction of the storage layer 13 is assumed to be an A direction and the short axis direction is a B direction. The ratio of the length of the A direction to the length of the B direction of the storage layer 13 is 1 to 5. The length of the storage layer 13 in the short axis direction is 0.1 μm to 0.4 μm and the film thickness thereof is 0.5 nm to 5.0 nm. The ratio of the length of the A direction to the length of the B direction of the sense layer 11 is 0.5 to 2.0. The length of the sense layer 11 in the short axis direction is 0.4 μm to 1.2 μm and the film thickness thereof is 0.5 nm or more (an upper limit of the film thickness is not specifically limited but is generally 20.0 nm or less, typically, 8.0 nm or less).

The long axis and the short axis are not limited to those of an ellipse, and among segments which pass the center (barycenter) of a planar shape and connect two points on the circumference to each other, a shortest segment denotes a short axis and a longest segment denotes a long axis.

(Circuit Structure and Layout)

Next, a circuit structure of a magnetic memory cell in the present embodiment and an actual layout method will be described below.

Figure 7:
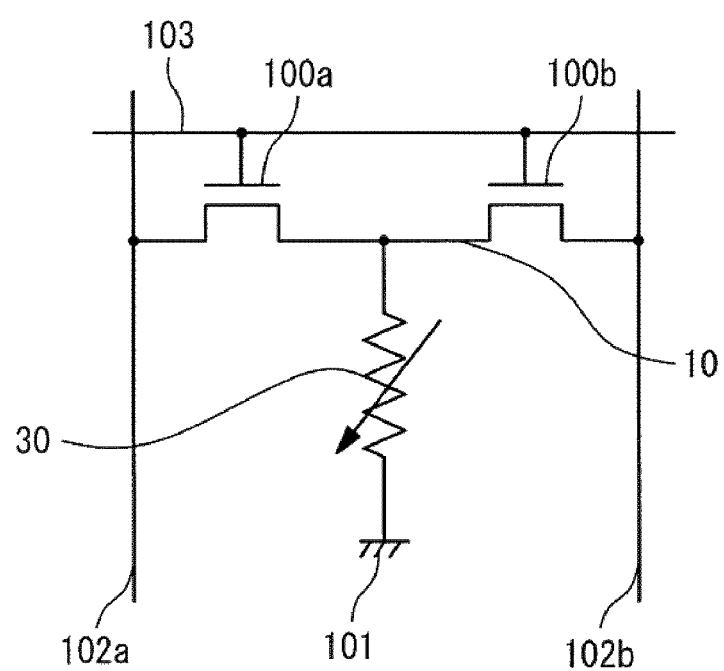
FIG. 7 shows a circuit structure of a magnetic memory cell.

FIG. 7 shows an example of a circuit structure of one magnetic memory cell in the present embodiment. In FIG. 7, one magnetic memory cell includes an interconnection layer 10 and a magnetoresistive effect element 30 and provided with two MOS transistors 100a, 100b. In other words, FIG. 7 shows a 2T1R type. One of the source/drain of the first MOS transistor 100a is connected to the interconnection layer 10 and the other of the source/drain is connected to a first bit line 102a. One of the source/drain of the second MOS transistor 100b is connected to the interconnection layer 10 and the other of the source/drain is connected to a second bit line 102b. Gates of the two MOS transistor 100a, 100b are connected to a word line 103. One end of the magnetoresistive effect element 30 is connected to the interconnection layer 10 and the other end is connected to the ground line 101.

Next, methods of writing and reading information in the circuit structure shown in FIG. 7 will be described. According to the present embodiment, writing information to the magnetoresistive effect element 30 is performed by changing the direction of a current passing to the interconnection layer 10. Writing is performed only in the interconnection layer 10 according to a uniaxial magnetic field write method.

In the case where a current passes to the interconnection layer 10 to the right in the figure, the potential of the word line 103 is set to "High", the potential of the first bit line 102a is set to "High" and the potential of the second bit line 102b is set to "Low". Thereby, the two MOS transistors 100a, 100b are turned "ON" and a current passes to the interconnection layer 10 to the right in this figure. On the other hand, when a current passes to the interconnection layer 10 to the left in this figure, the potential of the word line 103 is set to "High", the potential of the first bit line 102a is set to "Low" and the potential of the second bit line 102b is set to "High". Thereby, the two MOS transistors 100a, 100b are turned "ON" and the current passes to the interconnection layer 10 to the left.

In reading information from the magnetoresistive effect element 30, by setting the potential of the word line 103 to "High", setting the potential of one of the two bit lines 102a, 102b to "High" and setting the potential of the other of the two bit lines to "OPEN", a current passing through the magnetoresistive effect element 30 can be passed, thereby enabling reading utilizing magnetoresistive effect. With the above-mentioned circuit setting in writing and reading, only one cell is completely selected and no semi-selected cell exists. In other words, cell selectivity is ensured by this circuit structure.

Figure 8:
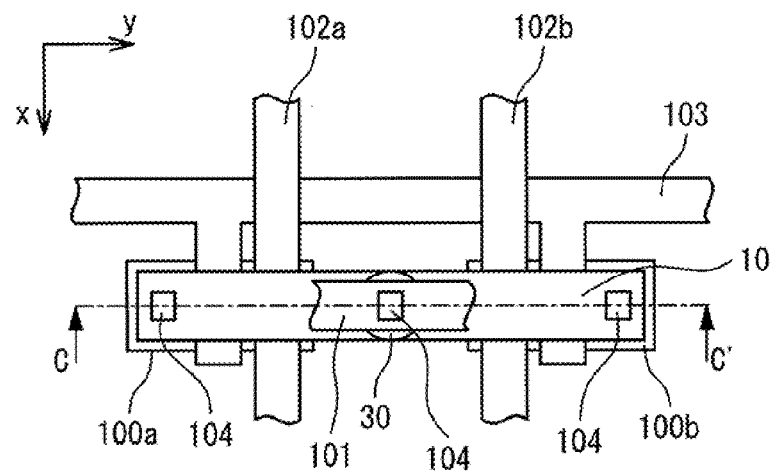
FIG. 8 is a plan view showing layout of a magnetic memory cell.
Figure 9:
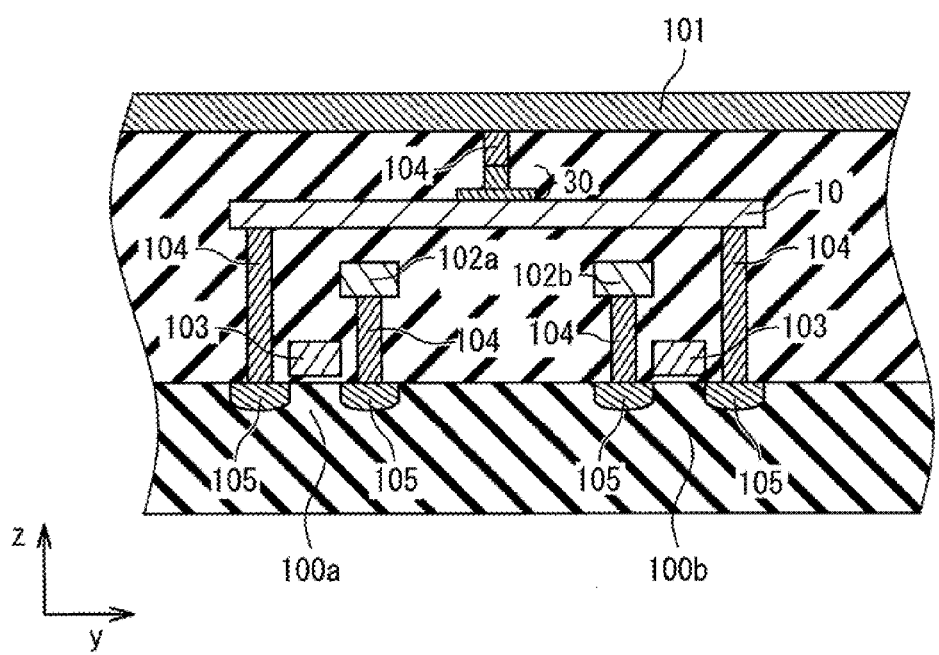
FIG. 9 is a sectional view showing layout of a magnetic memory cell.

FIG. 8 is a plan view from above a substrate on which the magnetic memory cell shown in FIG. 7 is manufactured and shows an example of a layout method of the magnetic memory cell. FIG. 9 is a sectional view along a C-C' cross section in FIG. 8. In FIGS. 8 and 9, one end of the magnetoresistive effect element 30 is connected to the ground line 101 above the magnetoresistive effect element 30 through the contact interconnection 104 and the other end is in contact with the interconnection layer 10. Both ends of the interconnection layer 10 are connected to diffusion layers 105 of the MOS transistors 100a, 100b through the contact interconnections 104. The diffusion layer 105 is source/drain of the MOS transistor. Among the diffusion layers 105 of the two MOS transistors 100a, 100b, the diffusion layer which is not connected to the interconnection layer 10 is connected to the bit line 102 through the contact interconnection 104. The word line 103 is provided so as to extend in a same direction as the interconnection layer 10 and partially protrude. The protruded portion is connected to the gate of each of the MOS transistors 100a, 100b. By layout as shown in FIG. 8, FIG. 9, a circuit structure shown in FIG. 7 is realized.

However, the above-mentioned circuit structure and layout method are examples of the method of manufacturing the magnetic random access memory by using the magnetoresistive effect element according to an embodiment of the present invention and other circuit structures and layout methods may be adopted. That is, those skilled in the art can appropriately select a circuit structure and a layout method depending on specification of the magnetic random access memory to be manufactured.

(Effects)

As described above, in an embodiment of the present invention, a new magnetic random access memory is provided. A magnetic random access memory according to an embodiment of the present invention includes the plurality of magnetic memory cells arranged in an array, each magnetic memory cell has an interconnection layer 10 and a magnetoresistive effect element 30. The magnetoresistive effect element 30 includes a magnetization fixed layer 15, an insulating layer 14 and a magnetization free layer 20, and the magnetization free layer 20 includes a sense layer 11, a first bonding layer 12 and a storage layer 13. Such magnetic random access memory can attain following effects.

First, a magnetic random access memory with reduced current required for writing can be provided. Generally, in a state where no magnetic field is applied, the magnetization free layer needs to have sufficient thermal stability. To ensure the thermal stability, it is necessary to set the anisotropic magnetic field of a magnetic layer forming the magnetization free layer to be large to certain extent. However, in a case where the anisotropic magnetic field of the magnetic layer forming the magnetization free layer is large, the reverse magnetic field necessary for magnetization reversal is large and a value of the current required for writing increases. In other words, there is a trade-off between securement of thermal stability and a decrease in the write current and thus, it is difficult to decrease the write current.

However, in the present embodiment, the magnetization free layer 20 includes the sense layer 11 and the storage layer 13. The sense layer 11 is designed so that the anisotropic magnetic field becomes small, contributing to realization of writing with a low current, while the storage layer 13 is designed so that the anisotropic magnetic field may become relatively large, contributing to securement of thermal stability. By realizing thermal stability and a decrease in the write current by different layers, both can be realized. Thus, in an embodiment of the present invention, in a magnetic memory cell with securement of sufficient thermal stability, the write current of 1 [mA] or less can be realized.

Furthermore, in the present embodiment, a binary state corresponding to "0" and "1" can be stably achieved. As described above, thermal stability of the magnetization free layer can be ensured by setting the anisotropic magnetic field to be large. Moreover, the thermal stability can also be ensured by setting the anisotropic magnetic field of the magnetization free layer to be small while setting magnetic volume (saturation magnetization×volume) to be large. However, such method is impractical for the following reasons. Generally, a shape anisotropic magnetic field $H_{k\_shape}$ is proportional to the product of the saturation magnetization and the film thickness. Thus, to set the magnetic volume to be large and set the anisotropic magnetic field $H_{k\_shape}$ to be small for securement of the thermal stability, it is necessary to set the aspect ratio of the magnetization free layer to a value close to 1. However, in the case where the aspect ratio of the magnetization free layer is set to the value close to 1, it tends to have a multi-magnetic domain structure or a vortical structure to reduce energy due to a demagnetizing field. In this case, magnetization of the magnetization free layer is easy to be put into an intermediate state other than the binary states of parallel or antiparallel to the magnetization fixed layer.

However, in the present embodiment, although the aspect ratio is set to the value close to 1 in the sense layer in which the anisotropic magnetic field is set to be small, the center part of the sense layer is magnetically coupled to the storage layer. The storage layer has a relatively large anisotropic magnetic field and the magnetization direction is designed so as to be parallel or antiparallel to the magnetization fixed layer. Thus, the sense layer also can stably achieve the binary state by magnetic coupling to the storage layer.

Furthermore, the influence of variation in the shape of elements on variation in the reverse magnetic field can be controlled to be relatively small. According to the above-mentioned method of setting the aspect ratio of the magnetization free layer to be small and setting the magnetic volume to be large, the anisotropic magnetic field of the magnetization free layer greatly varies depending on the aspect ratio of the magnetization free layer. This is due to that the shape anisotropic magnetic field is proportional to (saturation magnetization)×(film thickness). This leads to the conclusion that in the case where the shape of the magnetization free layer varies, the reverse magnetic field of the magnetization free layer greatly varies accordingly.

However, in the present embodiment, although the aspect ratio of the sense layer is set to a value close to 1, it is not necessary to set magnetic volume to be large in order to secure thermal stability. Accordingly, the influence of variation in the shape of the sense layer on variation in the reverse magnetic field can be relatively suppressed.

By actually calculating the change of the reverse magnetic field with respect to the change in the aspect ratio by micro magnetic simulation, as compared to a single-layered magnetization free layer which achieves both of securement of thermal stability and decrease in the write current, by setting the aspect ratio to be small and setting the magnetic volume to be large, it was confirmed that the change is reduced to one third in the magnetization free layer in the present embodiment. In other words, in the present embodiment, as compared to the single-layered magnetization free layer which achieves both of the securement of thermal stability and the decrease in the write current by setting the aspect ratio to be small and setting the magnetic volume to be large, the influence of variation in the shape of the sense layer on variation in the reversal current is reduced to about one third.

In the present embodiment, flexibility of materials for the magnetization free layer 20 in contact with the insulating layer 14 enlarges so that it is easy to increase the magnetoresistive effect ratio (MR ratio) representing the strength of a reading signal.

In the present embodiment, the sense layer and the storage layer which form the magnetization free layer 20 may be made of different materials. Normally, since the anisotropic magnetic field of the magnetization free layer needs to be set small in order to achieve writing with a low current, a material to be used must be a material having small crystal magnetic anisotropy. Generally, since the material having the small crystal magnetic anisotropy has small polarizability, a large MR ratio can not be expected. However, in the present embodiment, since the storage layer may have a relatively large anisotropic magnetic field, limitation on the crystal magnetic anisotropy of the material is reduced. Thus, a material of high polarizability such as an alloy having Co—Fe as a main component in the storage layer can be used.

The MR ratio varies also depending on the material for the insulating layer 19 and especially MgO is known as a material for increasing the MR ratio. To achieve the high MR ratio by using MgO, MgO needs to be grown at (100) orientation. The orientation of growth is determined depending on the material for the storage layer as a growth surface of MgO, and it is possible to select a material for promoting growth at MgO (100) orientation for a material of the storage layer under a relatively weak restriction of the present invention. Amorphous Co—Fe—B is an example of suitable materials.

In the present embodiment, the above-mentioned effects can be simultaneously obtained. To achieve a magnetic random access memory capable of performing a high-speed operation with low power consumption, the technique in the present embodiment is extremely useful.

(First Modification)

Figure 10:
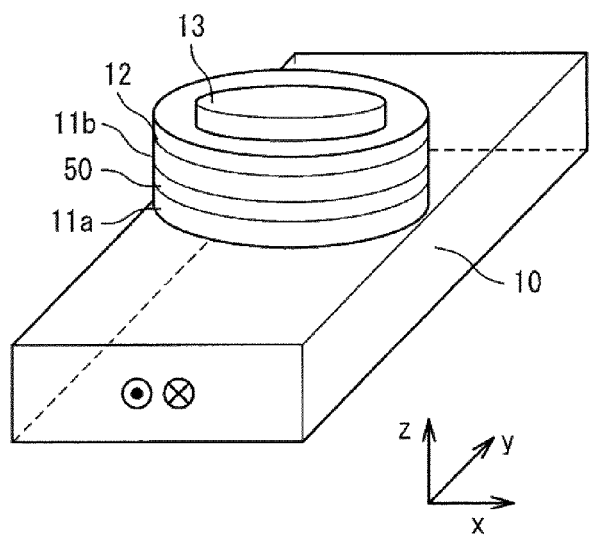
FIG. 10 is a perspective view of a magnetic memory cell in a first modification of the first embodiment.
Figure 11:
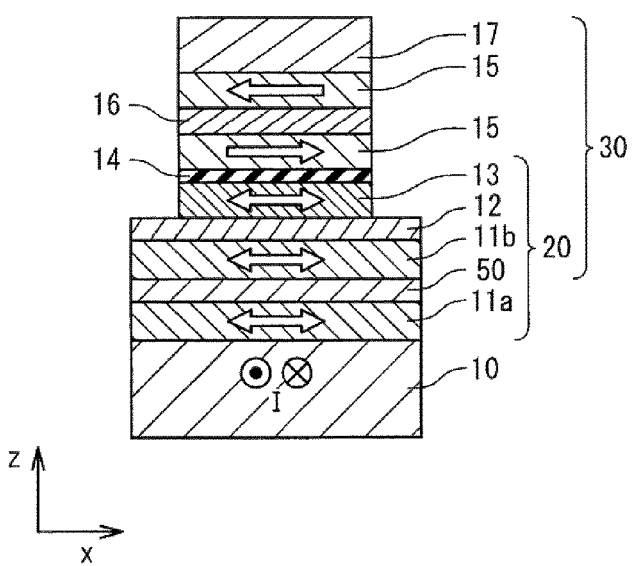
FIG. 11 is a sectional view of the magnetic memory cell in the first modification of the first embodiment.

FIG. 10 is a perspective view showing a structure of a first modification of the magnetic memory cell according to the first embodiment of the present invention. FIG. 11 is an x-z sectional view of the magnetic memory cell. This modification is a modification of the sense layer 11 and the sense layer 11 is formed of the first sense layer 11a, the second sense layer 11b and a third bonding layer 50 provided between the first sense layer 11a and the second sense layer 11b.

It is preferred that the first sense layer 11a is ferromagnetically coupled to the second sense layer 11b through the third bonding layer 50. The material and the shape of the first sense layer 11a may be different from those of the second sense layer 11b. Although FIGS. 10 and 11 show an example in which the sense layer 11 is formed of two ferromagnetic layers which are magnetically coupled to each other through the third bonding layer 50, the sense layer 11 may have a laminated structure of three or more ferromagnetic layers through more bonding layers therebetween.

In a case where the sense layer 11 has multi-layered structure as shown in FIGS. 10 and 11, magnetic coupling to the storage layer having large magnetic anisotropy energy directly acts on the second sense layer 11b. In other words, magnetic coupling of the storage layer to the first Sense layer 11a acts only indirectly. Accordingly, the first sense layer 11a can magnetically rotate relatively freely. Thus, by properly adjusting the strength of magnetic coupling by the first bonding layer 12 and the third bonding layer 50, when the magnetic field is applied, the first sense layer 11a, the second sense layer 11b and the storage layer 13 can rotate with different magnetization angles. Thereby, magnetization reversal by a small magnetic field can be made.

(Second Modification)

Figure 12:
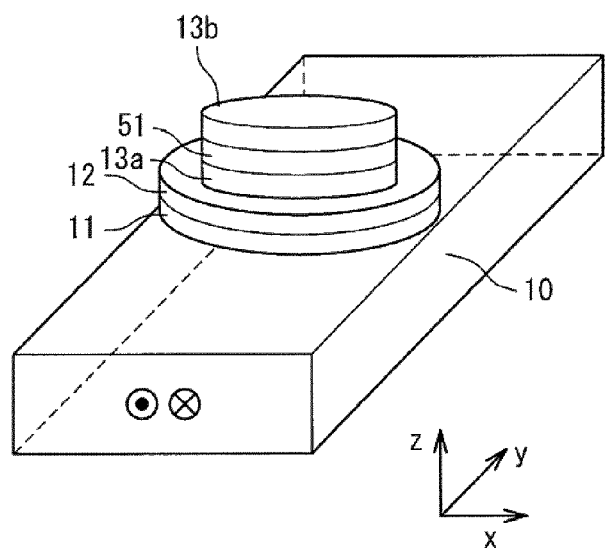
FIG. 12 is a perspective view of a magnetic memory cell in a second modification of the first embodiment.
Figure 13:
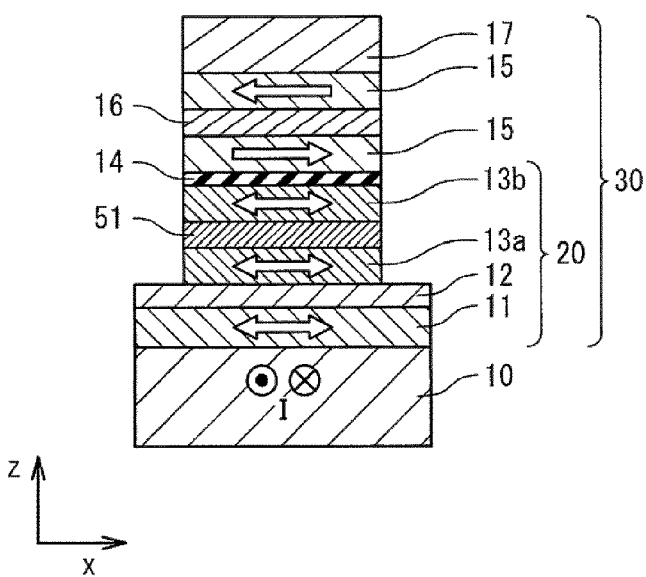
FIG. 13 is a sectional view of the magnetic memory cell in the second modification of the first embodiment.

FIG. 12 is a perspective view showing a structure of a second modification of the magnetic memory cell according to the first embodiment of the present invention and FIG. 13 is an x-z sectional view of the structure. This modification is a modification of the storage layer 13 and the storage layer 13 is formed of a first storage layer 13a, a second storage layer 13b and a fourth bonding layer 51 provided between the first storage layer 13a and the second storage layer 13b.

Also in this modification as in the first modification, it is preferred that the first storage layer 13a is ferromagnetically coupled to the second storage layer 13b through the fourth bonding layer 51. The material and the shape of the first storage layer 13a may be different from those of the second storage layer 13b. Although FIGS. 12 and 13 show an example in which the storage layer 13 includes two ferromagnetic layers which are magnetically coupled to each other through the fourth bonding layer 51, the storage layer 13 may have a laminated structure of three or more ferromagnetic layers through more bonding layers therebetween.

Also in this case, by properly adjusting the strength of the magnetic coupling by the first bonding layer 12 and the fourth bonding layer 51, the magnetic field necessary for magnetization reversal can be reduced. In addition, the second modification can be combined with the first modification.

(Third Modification)

Figure 14:
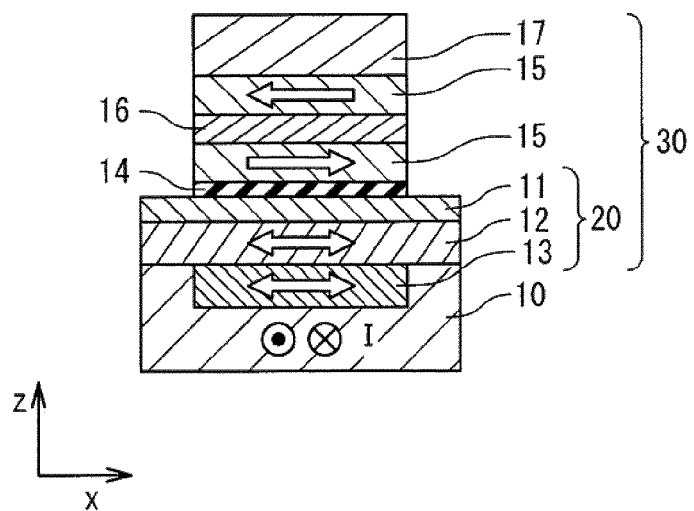
FIG. 14 is a sectional view of a magnetic memory cell in a third modification of the first embodiment.

FIG. 14 is an x-z sectional view showing a structure of a third modification of the magnetic memory cell according to the first embodiment of the present invention. This modification is a modification relating to the laminating order of the sense layer 11 and the storage layer 13. The sense layer 11 is provided adjacent to the insulating layer 14, while the storage layer 13 is provided closer to the interconnection layer 10 than the sense layer 11 and the first bonding layer 12.

In this modification, the storage layer 13 is located closer to the interconnection layer 10. Thus, when a current passes to the interconnection layer 10, a larger magnetic field can be applied to the storage layer 13.

(Fourth Modification)

Figure 15:
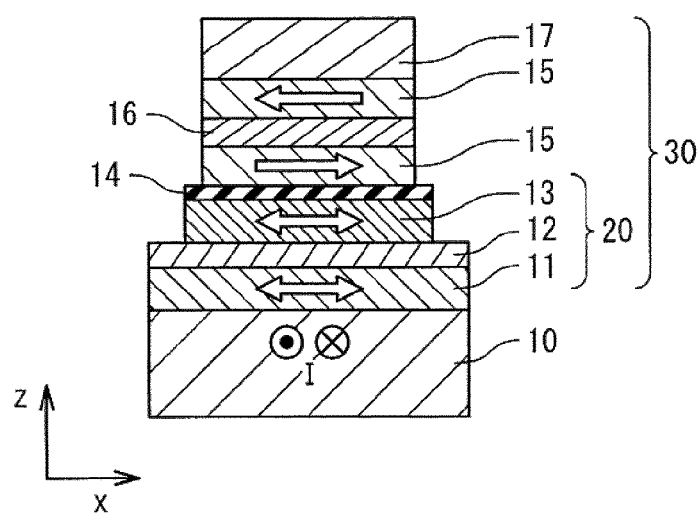
FIG. 15 is a sectional view of a magnetic memory cell in a fourth modification of the first embodiment.

FIG. 15 is an x-z sectional view showing a structure of a fourth modification of the magnetic memory cell according to the first embodiment of the present invention. This modification is a modification relating to the shape of the storage layer 13, the magnetization fixed layer 15 and the antiferromagnetic layer 17, and these layers are designed to have different planar shapes.

As a suitable example of this modification, the planar shape on a magnetization fixed layer 15 side is made so as to be included within the plane of the storage layer 13. For processing such structure, patterning of the magnetization fixed layer 15 side and patterning of the storage layer 13 are separately performed in two stages. In this case, although costs increase due to an increase in the number of steps, reduction in short-circuited elements occurred by redeposition to a side wall of the insulating layer 14 and improvement of accuracy of a terminal of etching of the storage layer 13 are expected. Furthermore, since the MTJ is located about at the center of the storage layer 13 in the plane, in the case where magnetization of the end of the storage layer becomes stable out of the easy axis direction, improvement of the MR ratio is expected in this modification.

(Fifth Modification)

Figure 16:
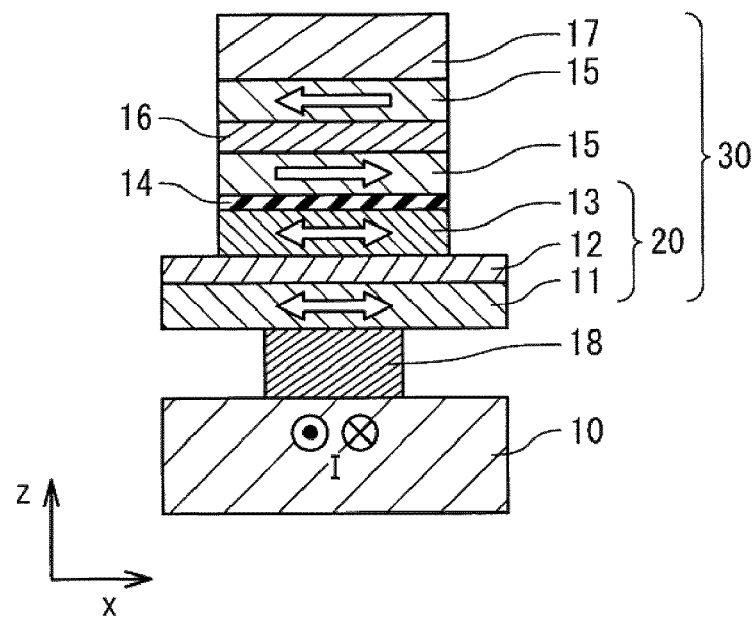
FIG. 16 is a sectional view of a magnetic memory cell in a fifth modification of the first embodiment.

FIG. 16 is an x-z sectional view showing a structure of a fifth modification of the magnetic memory cell according to the first embodiment of the present invention. In this modification, a conductive layer 18 is provided between the interconnection layer 10 and the sense layer 11. Here, the conductive layer 18 is made of a conductive material. Although the planar shape of the conductive layer 18 is drawn to be smaller than the shape of the sense layer 11 of the storage layer 13 in this figure, the conductive layer 18 may have any shape. Furthermore, although the conductive layer 18 is drawn to be located at the center of the sense layer 11 and the interconnection layer 10 in this figure, the conductive layer 18 may be located at any position as long as it is in contact with the sense layer 11 and the interconnection layer 10.

In this modification, the sense layer 11 is spatially separated from the interconnection layer 10. The interconnection layer 10 has a metal as a main component and generally, surface roughness becomes large on the metal surface. When surface roughness of a film-forming surface of the MTJ is large, variation in resistances of tunnel barrier and the frequency of short-circuit of elements in the tunnel barrier increase, Neel coupling between the magnetization free layer and the magnetization fixed layer increases and magnetic characteristics of the magnetization fixed layer are deteriorated. For this reason, surface roughness of the film-forming surface of the MTJ is required to reduced as much as possible.

In this modification, since the film-forming surface of the MTJ is not the surface of interconnection layer 10 but the surface of the conductive layer 18, surface roughness of the film-forming surface of the MTJ can be reduced by using a material by which the surface of the conductive layer 18 becomes flat or processing the surface of the conductive layer 18 to be flat. In addition, by selecting a suitable material for the conductive layer 18, a crystal structure of each layer formed on the conductive layer 18 can be controlled to allow the conductive layer 18 to act as a so-called ground layer or seed layer. Furthermore, the conductive layer 18 may act as a diffusion barrier between the interconnection layer 10 and the sense layer 11.

(Sixth Modification)

Figure 17:
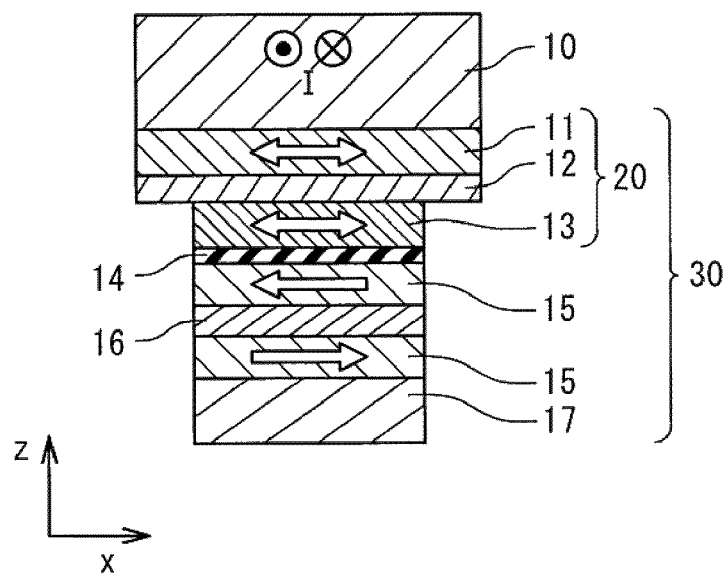
FIG. 17 is a sectional view of a magnetic memory cell in a six modification of the first embodiment.

FIG. 17 is an x-z sectional view showing a structure of a sixth modification of the magnetic memory cell according to the first embodiment of the present invention. This modification relates to a laminating order of the MTJ and the MTJ has a structure that the magnetization fixed layer 15, the insulating layer 14 and the magnetization free layer 20 are laminated in this order from a substrate side toward a positive direction of the z axis. That is, this modification has a bottom pin structure. In this modification, the interconnection layer 10 is provided adjacent to the sense layer 11 and furthest from a substrate.

In bottom pin structure as compared to a top pin structure, generally, surface roughness of the film-forming surface of the insulating layer 14 can be reduced more easily and a good magnetic characteristic of the magnetization fixed layer 15 is obtained. In other words, this modification can provide improved element characteristics.

(Seventh Modification)

Figure 18:
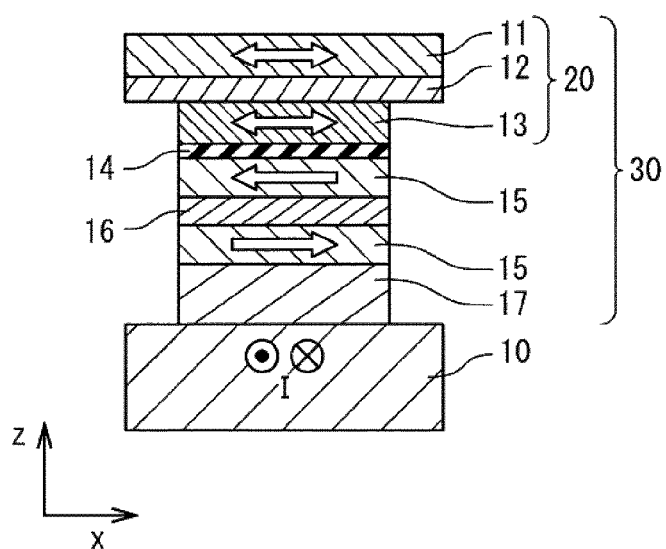
FIG. 18 is a sectional view of a magnetic memory cell in a seventh modification of the first embodiment.

FIG. 18 is an x-z sectional view showing a structure of a seventh modification of the magnetic memory cell according to the first embodiment of the present invention. This modification, like the sixth modification, relates to a laminating order of the MTJ and the MTJ has a structure that the magnetization fixed layer 15, the insulating layer 14 and the magnetization free layer 20 are laminated in this order from a substrate side toward the positive direction of the z axis. That is, this modification also has the bottom pin structure. However, in this modification, the interconnection layer 10 is provided closer to the substrate than the magnetoresistive effect element 30. Although the interconnection layer 10 is adjacent to the antiferromagnetic layer 17 in FIG. 18, a conductive layer may be provided between the interconnection layer 10 and the antiferromagnetic layer 17.

(Eighth Modification)

Figure 19:
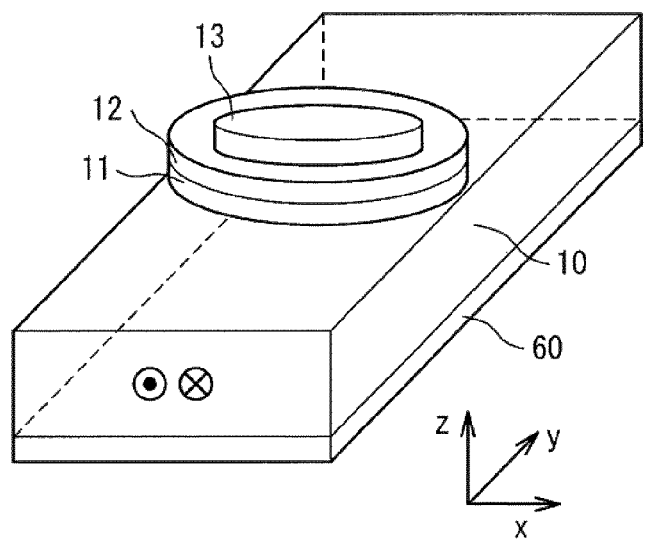
FIG. 19 is a perspective view of a magnetic memory cell in an eighth modification of the first embodiment.
Figure 20:
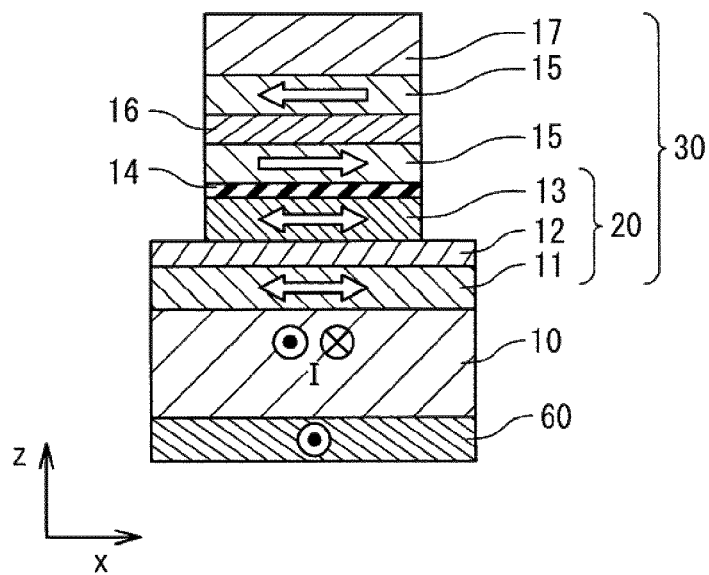
FIG. 20 is a sectional view of the magnetic memory cell in the eighth modification of the first embodiment.

FIG. 19 is a perspective view showing a structure of an eighth modification of the magnetic memory cell according to the first embodiment of the present invention and FIG. 20 is an x-z sectional view. In this modification, a yoke layer 60 is provided on the interconnection layer 10 on the opposite side to the magnetoresistive effect element 30. The yoke layer 60 includes a ferromagnet and is magnetized in the positive or negative direction along the y-axis when a current does not pass to the interconnection layer 10. Preferably, the yoke layer 60 has large magnetic anisotropy in the y-axis direction. When the current passes to the interconnection layer 10, magnetization of the yoke layer 60 rotates in the x-y plane, generating a magnetic field in the x direction. The direction of the magnetic field thus generated is the same as the direction of the magnetic field induced by the current passing to the interconnection layer 10 at a position of the magnetization free layer 20. The planar shape of the yoke layer 60 may be same as or different from the interconnection layer 10.

In this modification, a leak magnetic field caused by the yoke layer 60 when the write current passes to the interconnection layer 10 enables writing with a still smaller current. When the yoke layer 60 is shaped to be same as the interconnection layer 10, no special step is required, causing no increase in manufacturing costs. On the other hand, when the yoke layer 60 is designed to be different from the interconnection layer 10 in shape, the number of steps increases, but by designing the yoke layer 60 to have small magnetic anisotropy, a larger conversion efficiency (magnetic field/current) of current to a magnetic field can be obtained.

Figure 21:
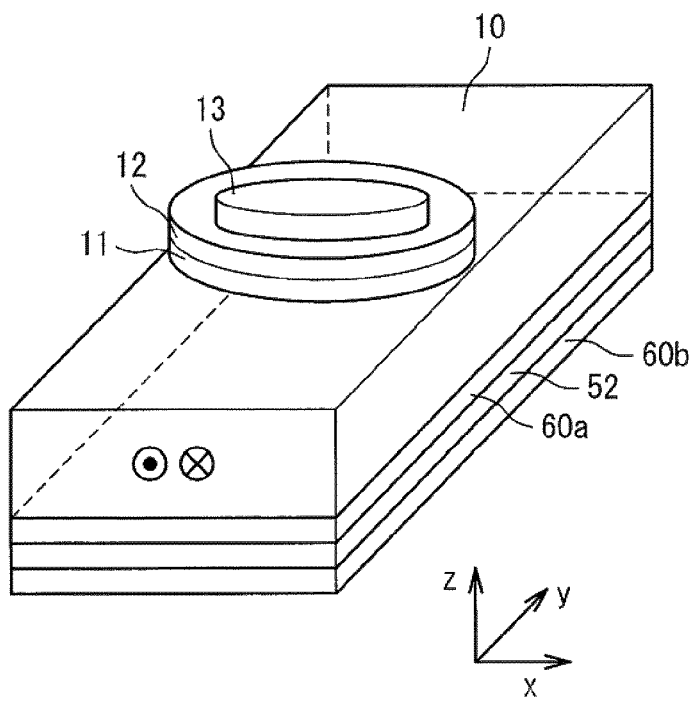
FIG. 21 is a sectional view of a magnetic memory cell in another mode of the eighth modification of the first embodiment.
Figure 22:
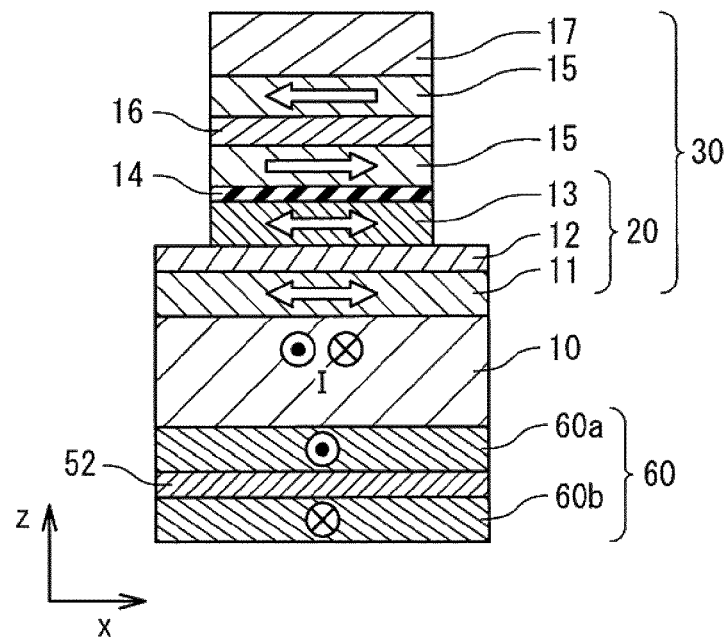
FIG. 22 is a sectional view of a magnetic memory cell in another mode of the eighth modification of the first embodiment.

As another mode of this modification, structure as shown in FIGS. 21 and 22 can be considered. In FIGS. 21 and 22, the yoke layer 60 includes a first yoke layer 60a, a second yoke layer 60b and a fifth bonding layer 52 which is disposed between the first yoke layer 60a and the second yoke layer 60b and magnetically couples the first yoke layer 60a to the second yoke layer 60b. Here, it is preferred that the coupling mode between the first yoke layer 60a and the second yoke layer 60b by the fifth bonding layer 52 is ferri-magnetic. At this time, magnetization of the first yoke layer 60a and the second yoke layer 60b are fixed to be antiparallel to each other along the y-axis when no current passes to the interconnection layer 10. In other words, a laminated ferri-type yoke layer is provided.

In the laminated ferri-type yoke layer shown in FIGS. 21 and 22, since the film thicknesses of the first yoke layer 60a and the second yoke layer 60b can be made smaller than that of the single-layered yoke layer, an increase in shape magnetic anisotropy of the yoke layer can be prevented. Accordingly, a conversion efficiency of the current to magnetic field when the current passes to the interconnection layer 10 can be improved. The yoke layer 60 may be provided on the first interconnection layer 10 on the opposite side to the magnetoresistive effect element 30 as shown in the figures or may be provided on three faces other than the face on a magnetoresistive effect element 30 side.

(Ninth Modification)

Figure 23:
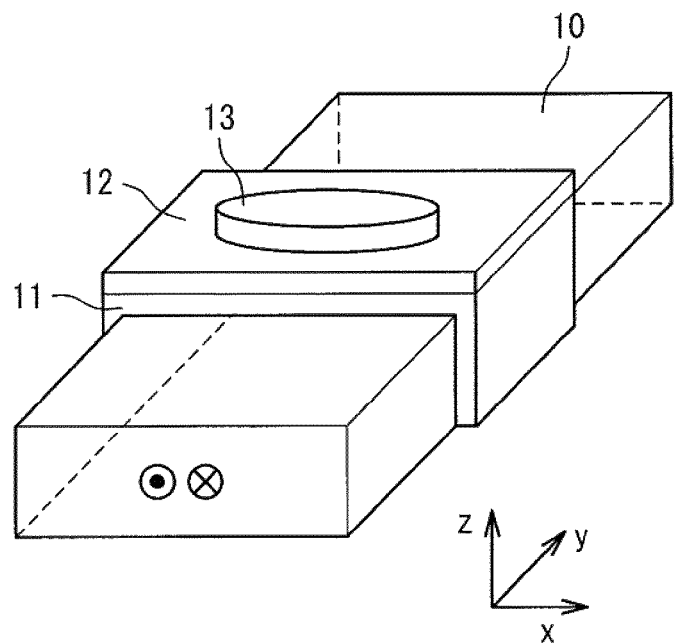
FIG. 23 is a perspective view of a magnetic memory cell in a ninth modification of the first embodiment.
Figure 24:
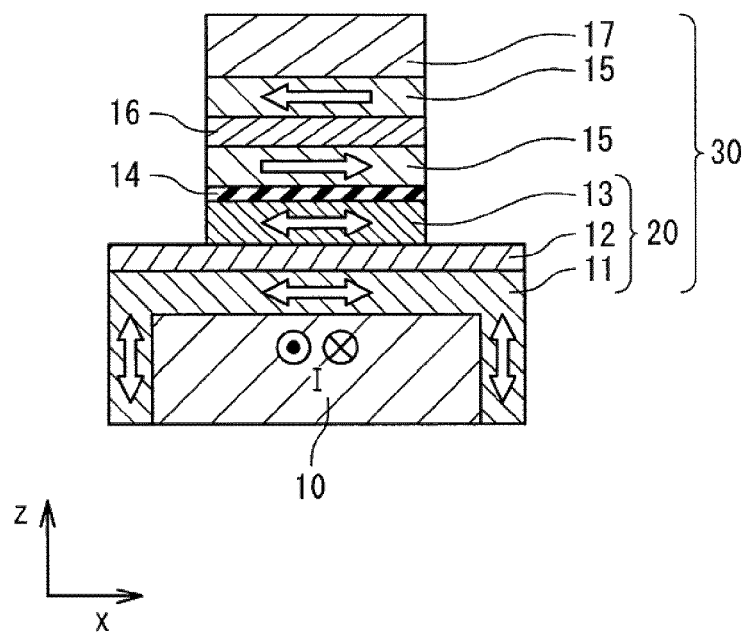
FIG. 24 is a sectional view of the magnetic memory cell in the ninth modification of the first embodiment.

FIG. 23 is a perspective view showing a structure of a ninth modification of the magnetic memory cell according to the first embodiment of the present invention and FIG. 24 is an x-z sectional view. In this modification, the sense layer 11 coats three faces of the interconnection layer 10 other than one face on a substrate side. Also in this case, by properly setting the length in the y direction, the magnetic anisotropy of the sense layer 11 is designed to be small. In this modification, the sense layer 11 only needs to coat at least a part of the three faces of the interconnection layer 10 other than one face on the opposite side to the storage layer 13.

In this modification, the sense layer 11 can have an effect of the magnetic field induced by the interconnection layer 10 more efficiently. In other words, the conversion efficiency of a current to a magnetic field is improved, thereby enabling writing with a lower current.

(Tenth Modification)

Figure 25:
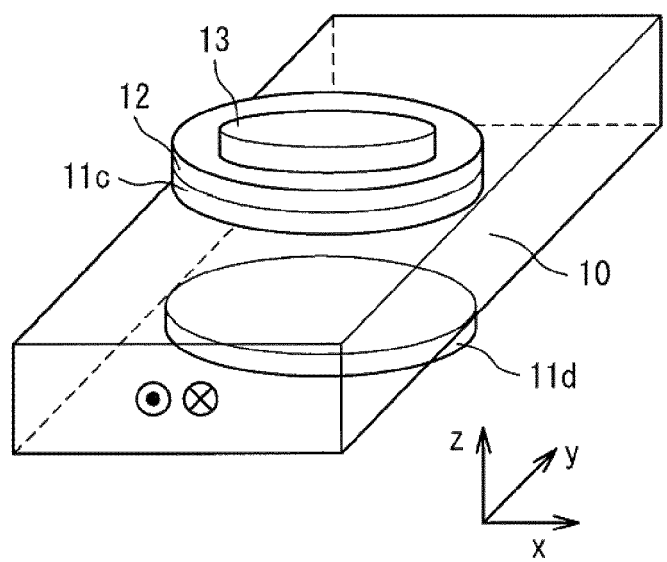
FIG. 25 is a perspective view of a magnetic memory cell in a tenth modification of the first embodiment.
Figure 26:
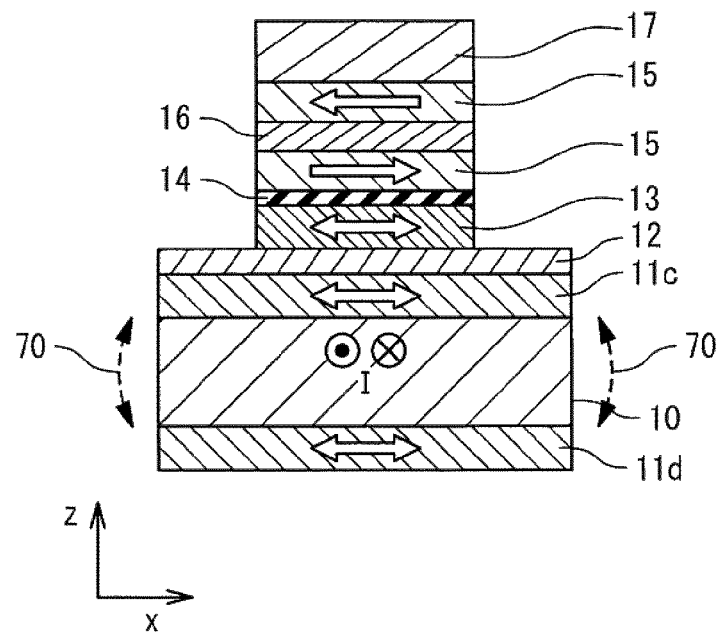
FIG. 26 is a sectional view of the magnetic memory cell in the tenth modification of the first embodiment.
Figure 27:
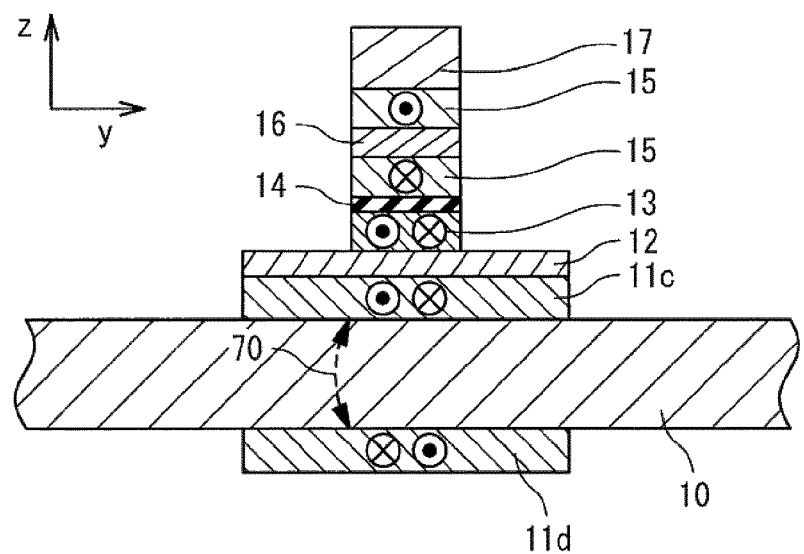
FIG. 27 is a sectional view of the magnetic memory cell in the tenth modification of the first embodiment.

FIG. 25 is a perspective view showing a structure of a tenth modification of the magnetic memory cell according to the first embodiment of the present invention, FIG. 26 is an x-z sectional view and FIG. 27 is a y-z sectional view.

In this modification, the sense layer 11 in the first embodiment includes a third sense layer 11c and a fourth sense layer 11d. The third sense layer 11c and the fourth sense layer 11d are provided opposed to each other across the interconnection layer 10. The third sense layer 11c is provided adjacent to the first bonding layer 12 on the opposite side to the storage layer 13. The third sense layer 11c and the fourth sense layer 11d may be made of a same material or different materials. The third sense layer 11c and the fourth sense layer 11d may have a same planar shape or different planar shapes. However, magnetic anisotropy of the third sense layer 11c and magnetic anisotropy of the fourth sense layer 11d are designed to be small. The third sense layer 11c and the fourth sense layer 11d may be designed to have a same film thickness or different film thicknesses. Preferably, the sum of the magnetic volume (saturation magnetization×volume) of the third sense layer 11c and the magnetic volume of the storage layer 13 is designed to be substantially equal to the magnetic volume of the fourth sense layer 11d.

In this modification, the third sense layer 11c is magnetostatically coupled to the fourth sense layer 11d by the leak magnetic field. In other words, the third sense layer 11c and the fourth sense layer 11d become stable in a state where they are magnetized in antiparallel to each other. Also in this modification, magnetic anisotropy of the sense layer is designed to be small and contributes to switching with a low current and thermal stability is provided mainly by the storage layer 13.

In this modification, a ferromagnetic layer capable of achieving magnetization reversal is disposed on both sides of the interconnection layer 10. Japanese Laid-Open Patent Application JP-P2004-153070A analytically discloses that with ferromagnetic layers disposed on both sides of the interconnection layer, as compared to a single-layered ferromagnetic layer, magnetization reversal with a smaller current can be achieved and a better resistance against a disturbance magnetic field is obtained. In other words, in this modification, the sensitivity of the interconnection layer 10 of the sense layer with respect to a magnetic field is further enhanced, thereby enabling writing with a still smaller current, and a stable memory state can be maintained even in such situation of a disturbance magnetic field.

Figure 28:
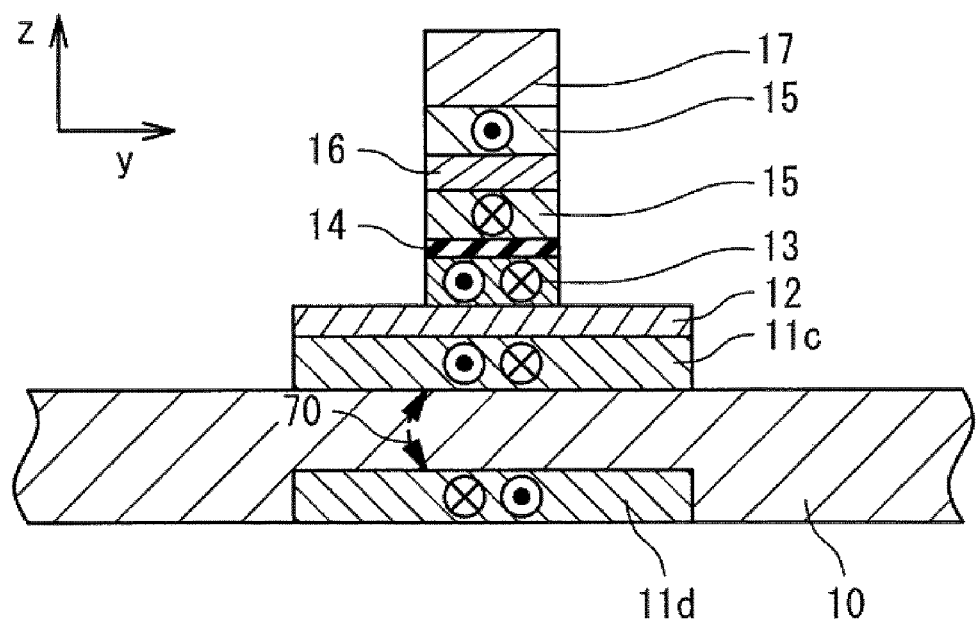
FIG. 28 is a sectional view of a magnetic memory cell in another mode of the tenth modification in the first embodiment.

FIG. 28 is a y-z sectional view showing another structure of this modification. The fourth sense layer 11d may be provided on the outer side of the interconnection layer 10 as shown in FIG. 27 in the y-z cross section or may be provided so as to cut into the interconnection layer 10 as shown in FIG. 28.

Figure 29:
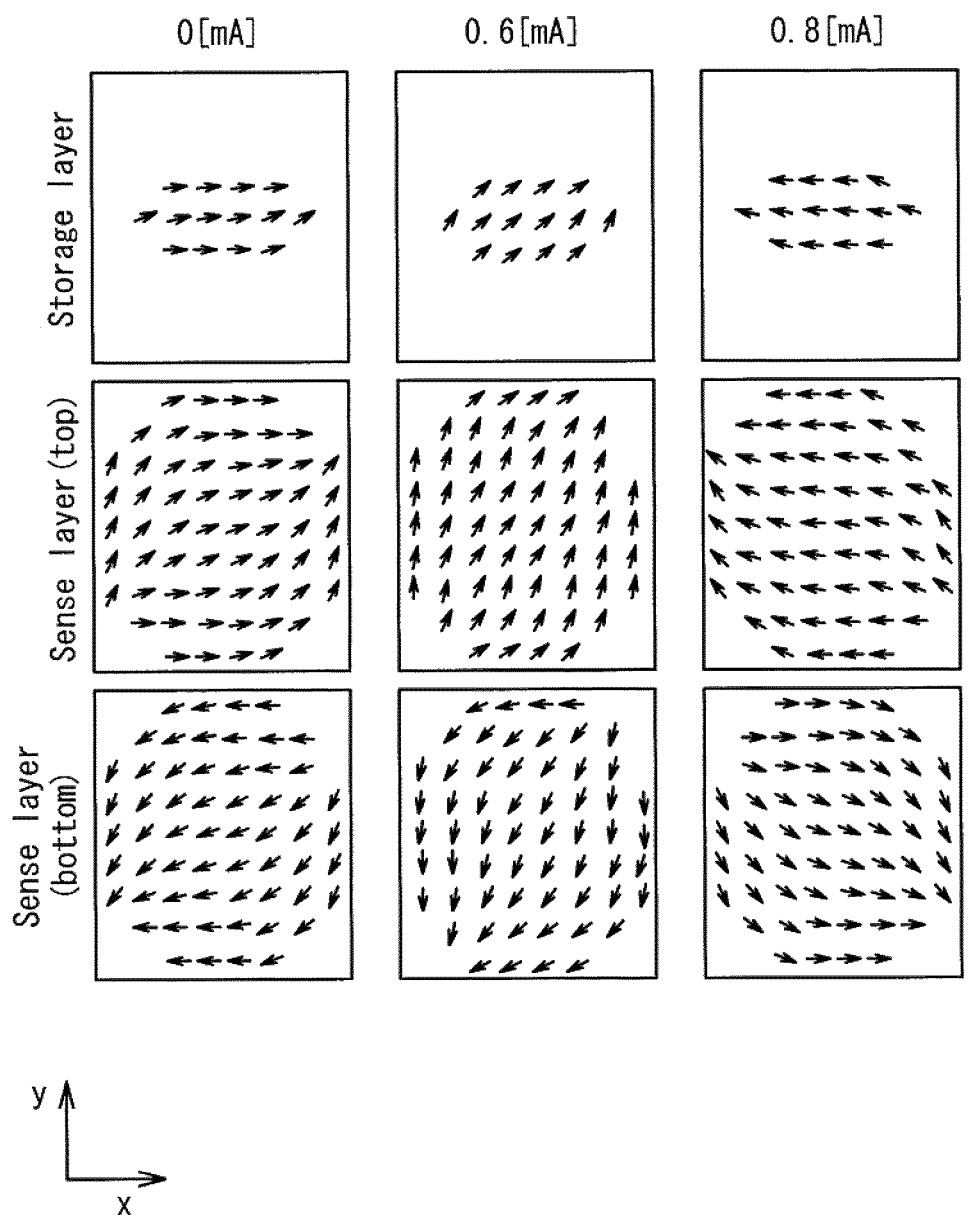
FIG. 29 shows simulation results inspecting the tenth modification of the first embodiment.

FIG. 29 shows results of inspection according to micro magnetic simulation in this modification. In this figure, the top row shows distribution of local magnetic moments in the storage layer 13, the middle row shows distribution of local magnetic moments in the third sense layer 11c, and the bottom row shows distribution of local magnetic moments in the fourth sense layer 11d, in a state where a current passes to each interconnection layer. The left column, the middle column and the right column show distribution of local magnetic moments in the respective layer at a current of 0 [mA], a current of 0.6 [mA] and at a current of 0.8 [mA], respectively.

Here, the storage layer 13 is an ellipse of 0.24×0.42 [μm²] having the long axis in the x-axis direction and the magnetic volume (saturation magnetization×film thickness) is 1.2 [T·nm]. The third sense layer 11c and the fourth sense layer 11d are each an ellipse of 0.64×0.72 [μm²] having the long axis in the y direction and the magnetic volume (saturation magnetization×film thickness) is 1.0 [T·nm]. It is given that the film thickness, the width in the x direction and the length in the y direction of the interconnection layer 10 are 20 [nm], 0.64 [μm] and 0.72 [μm], respectively.

The thermal stability index ($\pi=\Delta E/k_B T$; $k_B$ is Boltzmann constant and T is absolute temperature) in this system is about 75. This value can be said to be sufficient in ensuring thermal stability for 10 years. In simulation, it is initially set so that magnetization of the storage layer 13 and the third sense layer 11c may be oriented to the right in this figure and magnetization of the fourth sense layer 11d may be oriented to the left in this figure, and a current is applied to the interconnection layer in the y direction in this state and behavior of the magnetic moment in each layer is inspected.

As a result, in FIG. 29, the storage layer 13 and the third sense layer 11c are magnetized to the right and the fourth sense layer 11d is magnetized to the left at 0 [mA], and the magnetization reversal is completed at 0.8 [mA]. At 0.6 [mA] immediately before the completion, magnetization of the third sense layer 11c and the fourth sense layer 11d is being reversed by magnetostatic coupling while being antiparallel to each other. In this simulation, for simplification, the length of the interconnection layer 10 in the y-axis direction is set to 0.72 [μm] which is equal to the length of the sense layer in the y-axis direction. However, in actual, the magnetic field applied to the magnetic layer can be made stronger by adopting longer interconnection, magnetization reversal with a current of 0.8 [mA] or less can be achieved.

In this modification, resistance to the disturbance magnetic field is improved. This is due to that the two-layered sense layers are stabilized by magnetostatic coupling to be antiparallel to each other and it is hard to generate reversal by one-directional magnetic field.

Figure 30:
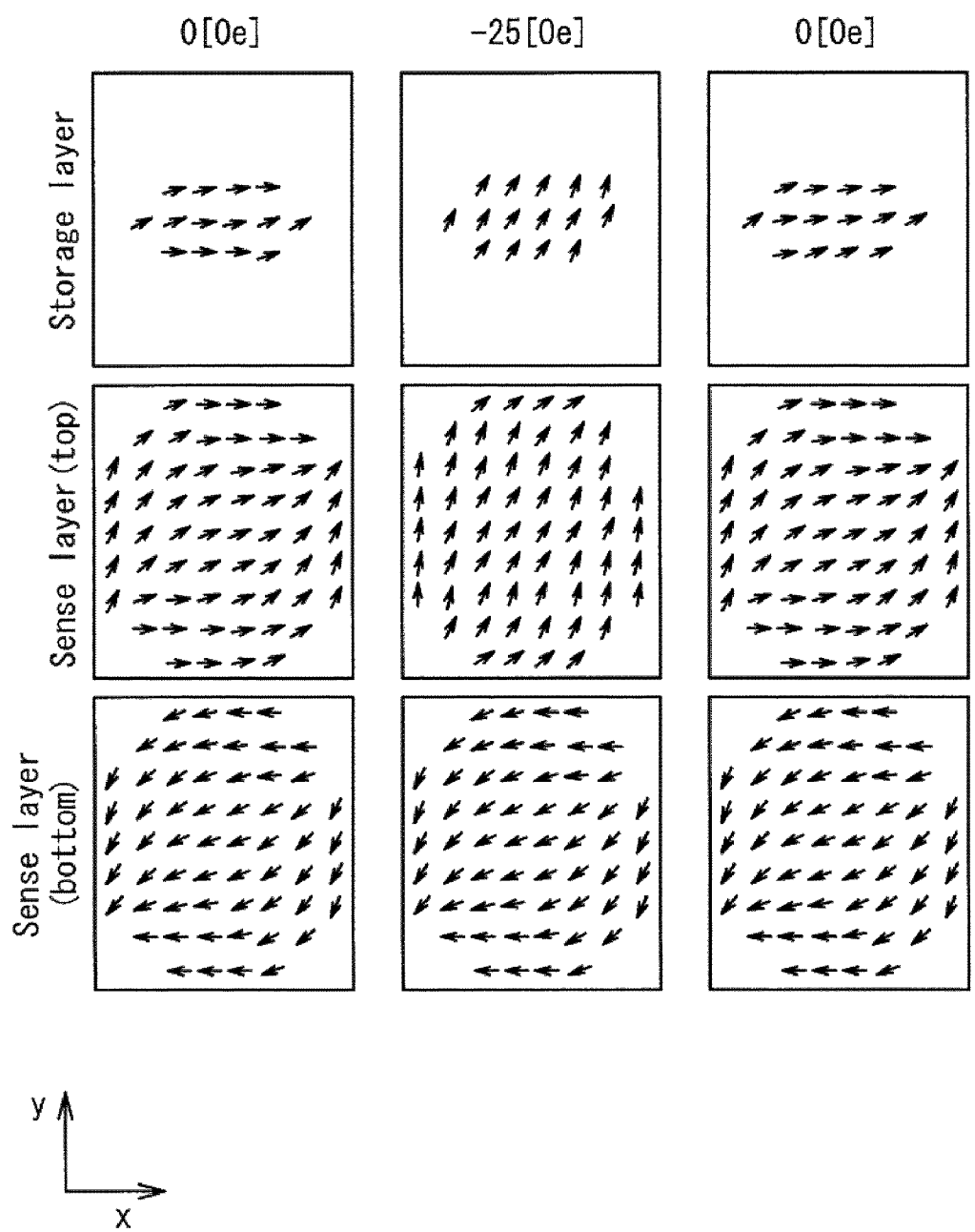
FIG. 30 shows simulation results of disturbance magnetic field resistance in the tenth modification of the first embodiment.

FIG. 30 shows calculation results according to micro magnetic simulation of disturbance magnetic field resistance in this modification. In this figure, the top row shows distribution of local magnetic moments in the storage layer 13, a middle row shows distribution of local magnetic moments in the third sense layer 11c and the bottom row shows distribution of local magnetic moments in the fourth sense layer 11d, in a same applied magnetic field. The left column shows distribution of local magnetic moments in each layer in an initial state where no magnetic field is applied, the middle column shows distribution of local magnetic moments in each layer in a state where 25 [Oe] is applied in the negative direction of the x-axis and the right column shows distribution of local magnetic moments in each layer in a state where the magnetic field is returned to zero. Parameters in each layer are the same as those used in FIG. 29.

In FIG. 30, when the magnetic field of 25 [Oe] is applied, magnetization in each layer starts to rotate from the state where no magnetic field is applied. However, when the magnetic field is cut, the state returns to the initial state again. In other words, it is determined that this system has resistance to the disturbance magnetic field of 25 [Oe] or more. Inspections are performed for disturbance magnetic field oriented in other directions, and it is also confirmed that this system has resistance to the disturbance magnetic field of 25 [Oe].

The value of 25 [Oe] confirmed by this inspection falls within a practically problem-less range. Such disturbance magnetic field resistance is increased especially when the sum of the magnetic volume (saturation magnetization×volume) of the third sense layer 11c and the magnetic volume of the storage layer 13 is equal to the magnetic volume of the fourth sense layer 11d. By providing a magnetic field shield around a manufactured chip, the requirement for disturbance magnetic field resistance is reduced.

Since reduction in the write current is achieved and sufficient disturbance magnetic field resistance is ensured, this modification can be said to be one of most preferable modes in implementing the present invention.

(Eleventh Modification)

Figure 31:
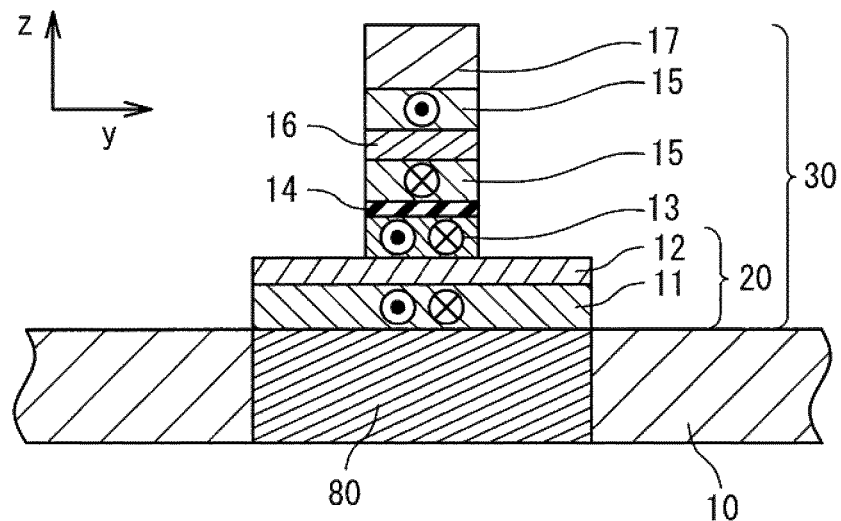
FIG. 31 is a sectional view of a magnetic memory cell in an eleventh modification of the first embodiment.

FIG. 31 is a y-z sectional view showing a structure of an eleventh modification of the magnetic memory cell according to the first embodiment of the present invention. In this modification, a heat generating layer 80 is provided on at least a part of the interconnection layer 10. Preferably, the heat generating layer 80 is provided so as to at least partially overlap the sense layer 11 in the x-y plane. The heat generating layer 80 is made of a conductive material and has a larger resistivity than that of the interconnection layer 10. Specifically, Ta, W, Ti are exemplified. Thereby, when the write current passes to the interconnection layer 10, Joule heat by the current occurs in the generating layer 80 and the heat is transmitted to the magnetization free layer 20.

In this modification, when a write current passes, the magnetization free layer 20 is heated. At this time, the effective anisotropic magnetic fields of the sense layer 11 and the storage layer 13 which form the magnetization free layer 20 decreases. As apparent from the equation (3), the magnetic field necessary for switching is reduced, enabling writing with a smaller current. The heat generating layer 80 also acts as a grounding layer for controlling a crystal growth of the sense layer 11 and as a diffusion barrier from the interconnection layer 10.

Figure 32:
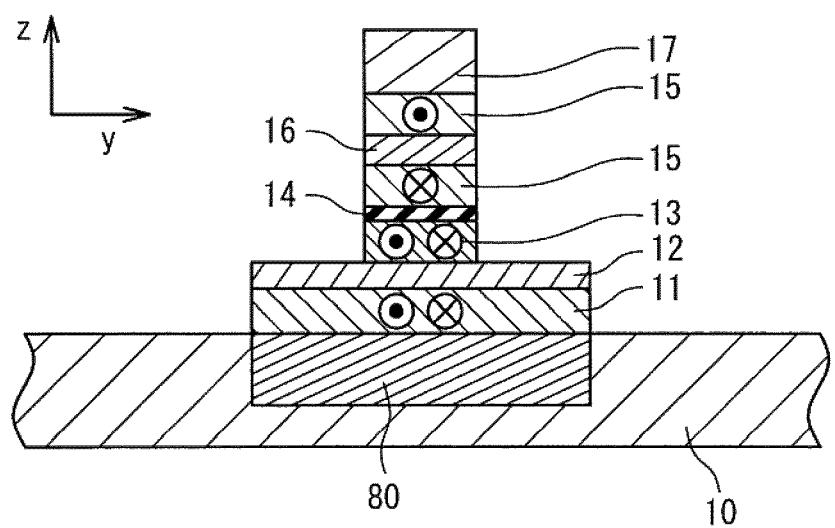
FIG. 32 is a sectional view of a magnetic memory cell in another mode of the eleventh modification of the first embodiment.
Figure 33:
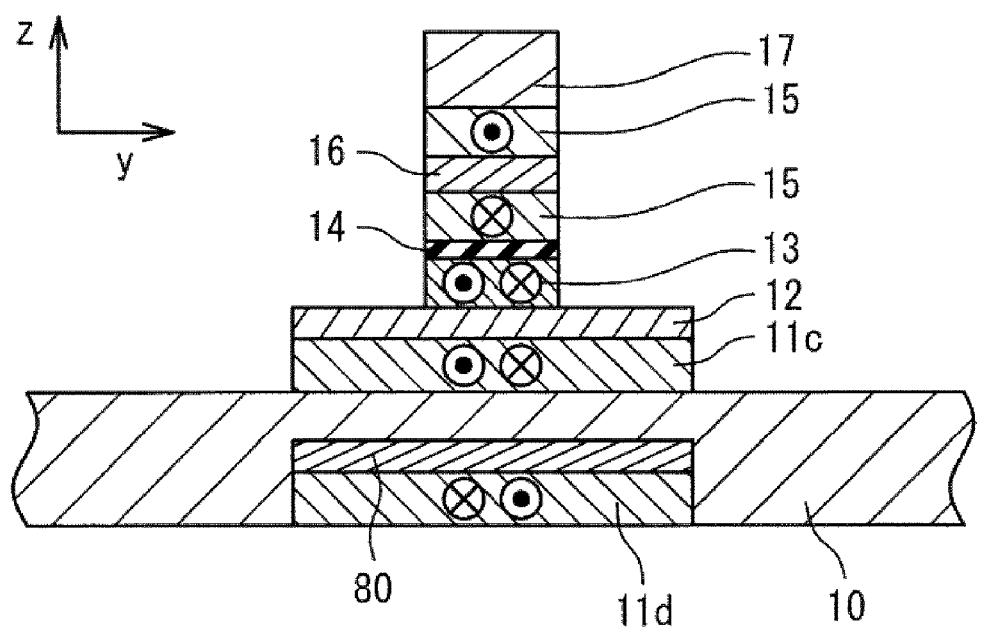
FIG. 33 is a sectional view of a magnetic memory cell in another mode of the eleventh modification of the first embodiment.

FIGS. 32 and 33 show another mode of this modification. FIG. 32 shows a structure in which a part of the cross section of the interconnection layer 10 is replaced with the heat generating layer 80. FIG. 33 shows combination with the tenth modification. Furthermore, by making the cross-sectional area of the interconnection layer 10 smaller only in a vicinity of the magnetization free layer 20, resistance can be locally increased to have a heat generating effect.

(Twelfth Modification)

Figure 34:
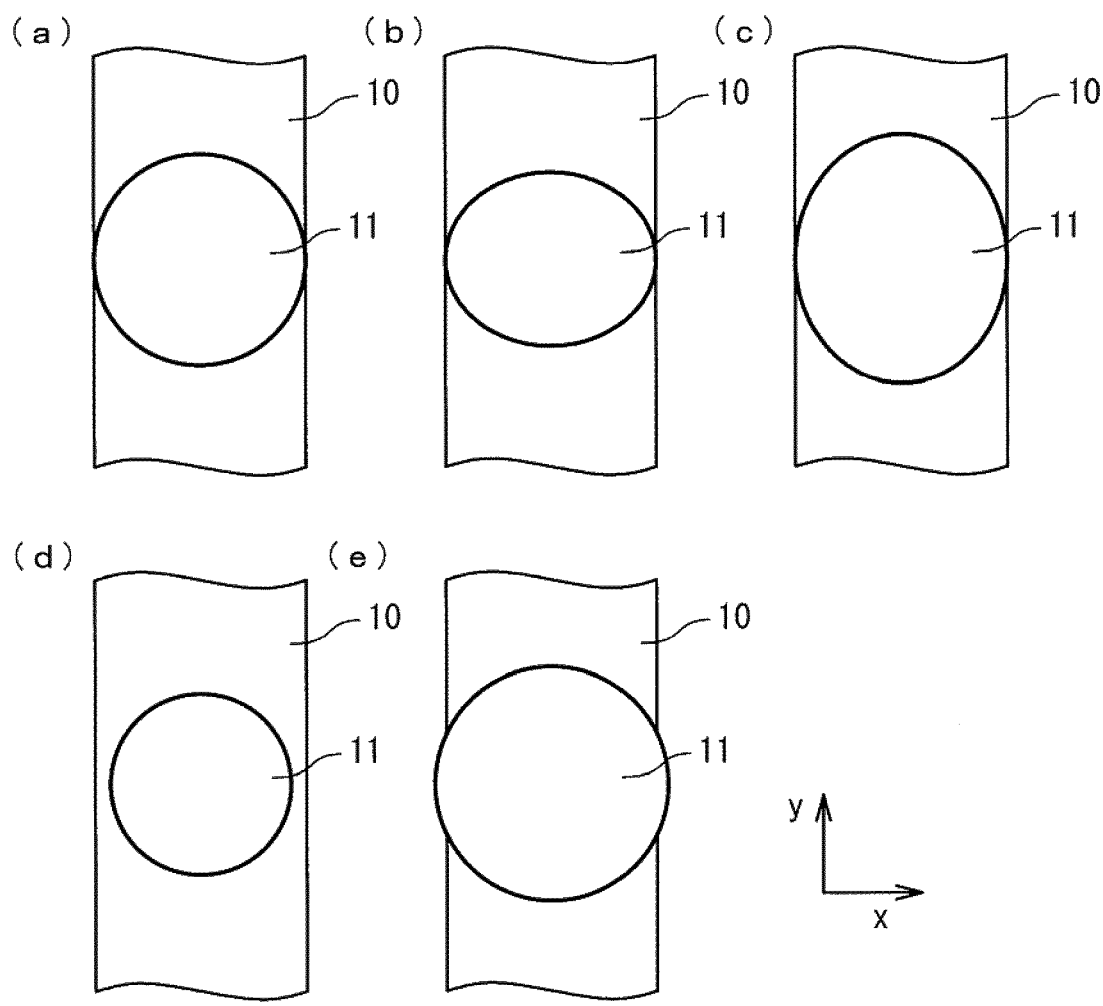
FIG. 34 is a plan view of a magnetic memory cell in a twelfth modification of the first embodiment.
Figure 35:
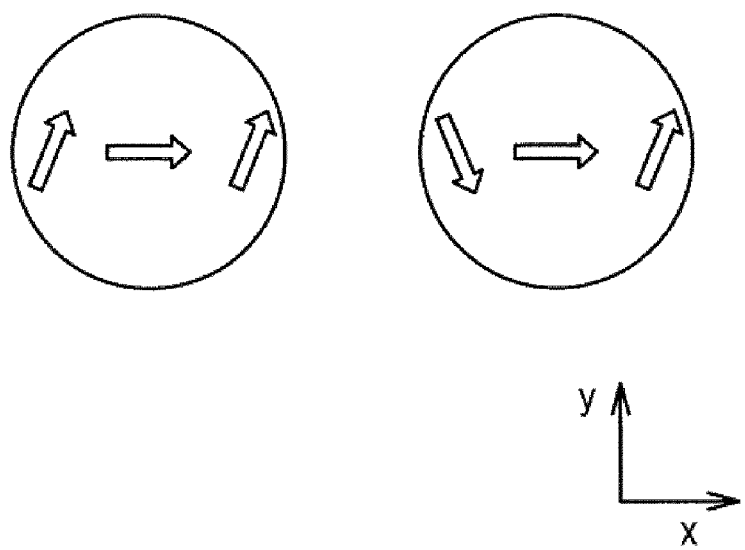
FIG. 35 is a view for describing an S magnetic domain and a C magnetic domain.

FIG. 34 is an x-y plan view showing a structure of a twelfth modification of the magnetic memory cell according to the first embodiment of the present invention. This modification relates to a relation between the planar shape of the sense layer 11 and that of the interconnection layer 10. As shown in FIG. 34, the planar shape of the sense layer 11 may be the circle as shown in FIG. 34 (a) or an ellipse having the long axis in the x-axis or the y-axis direction as shown in FIGS. 34 (b) and (c). In terms of relationship between the sense layer 11 and the interconnection layer 10 in the x-y plane in planar shape, the width of the sense layer 11 may be smaller than that of the interconnection layer 10 as shown in FIG. 34 (d) or may be larger than that of the interconnection layer 10 as shown in FIG. 34 (e). By varying the shape of the ellipse as shown in FIGS. 34 (b), (c), magnetic characteristics, especially, the anisotropic magnetic field of the whole of the magnetization free layer 20 can be adjusted.

In this embodiment of the present invention, the aspect ratio of the sense layer 11 is preferably set to a value close to 1. Here, generally, in a magnetic body having a shape with the aspect ratio near 1, it is known that an S magnetic domain or a C magnetic domain is formed to reduce total energy. In this embodiment of the present invention, it is desired that the sense layer 11 has the S magnetic domain. It is due to that, in this embodiment of the present invention, writing with a smaller current can be achieved in a state where the magnetic field has the S magnetic domain. The results of micro magnetic simulation as shown in FIGS. 6, 29, 30 are calculation results under an initial condition in which the sense layer has the S magnetic domain in the zero magnetic field.

Figure 36:
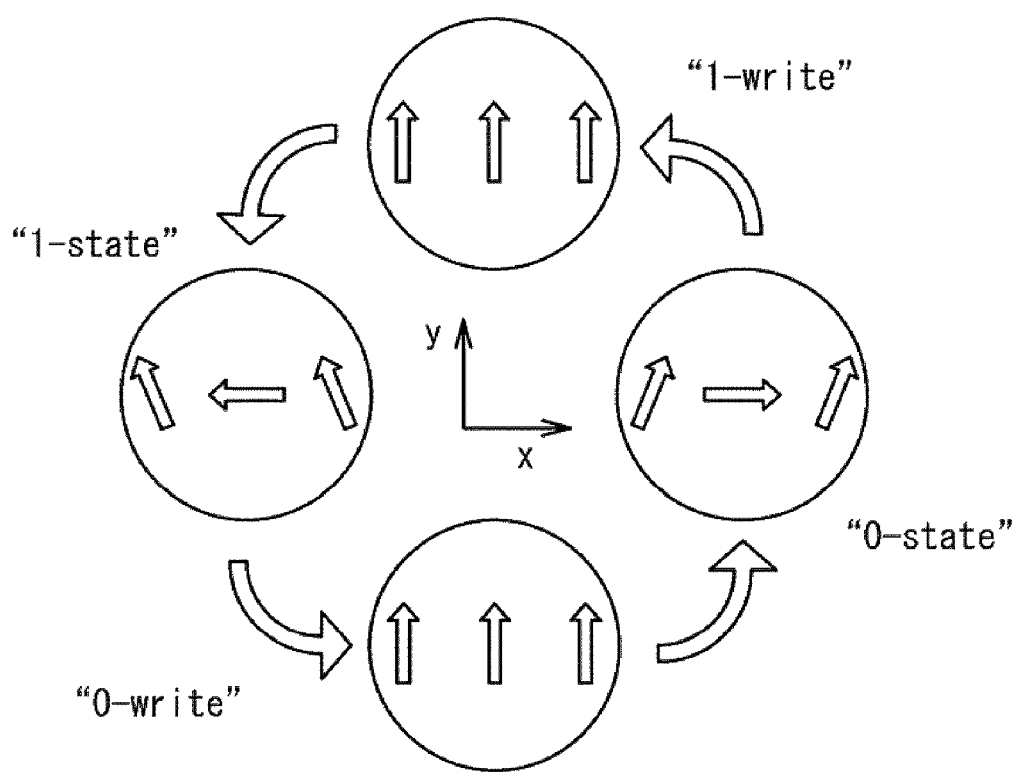
FIG. 36 is a view for describing a reversal path of the magnetic domain.
Figure 37:
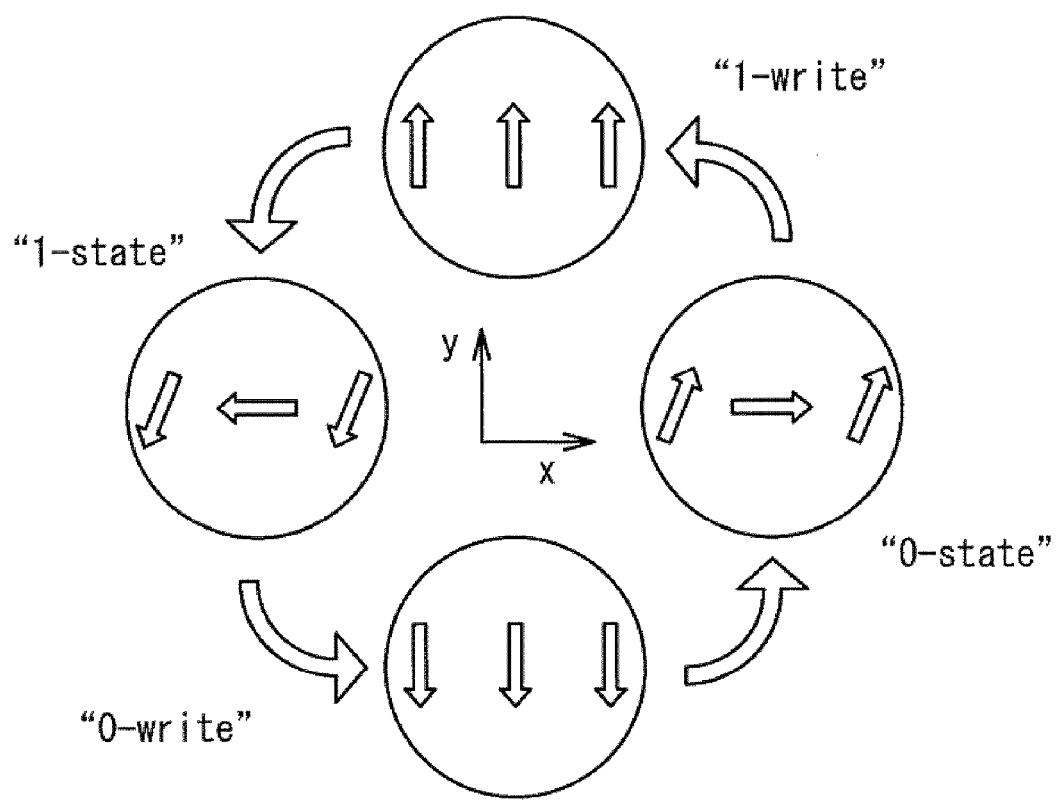
FIG. 37 is a view for describing a reversal path of the magnetic domain.

There are two reversal paths in the magnetic body having the S magnetic domain as shown in FIGS. 36 and 37 and both paths may be adopted. FIG. 36 shows a case where the magnetization rotational direction of reversal from "0" to "1" is opposite to that of reversal from "1" to "0" and FIG. 37 shows a case where the magnetization rotational direction of reversal from "0" to "1" is the same as that of reversal from "1" to "0".

Figure 38:
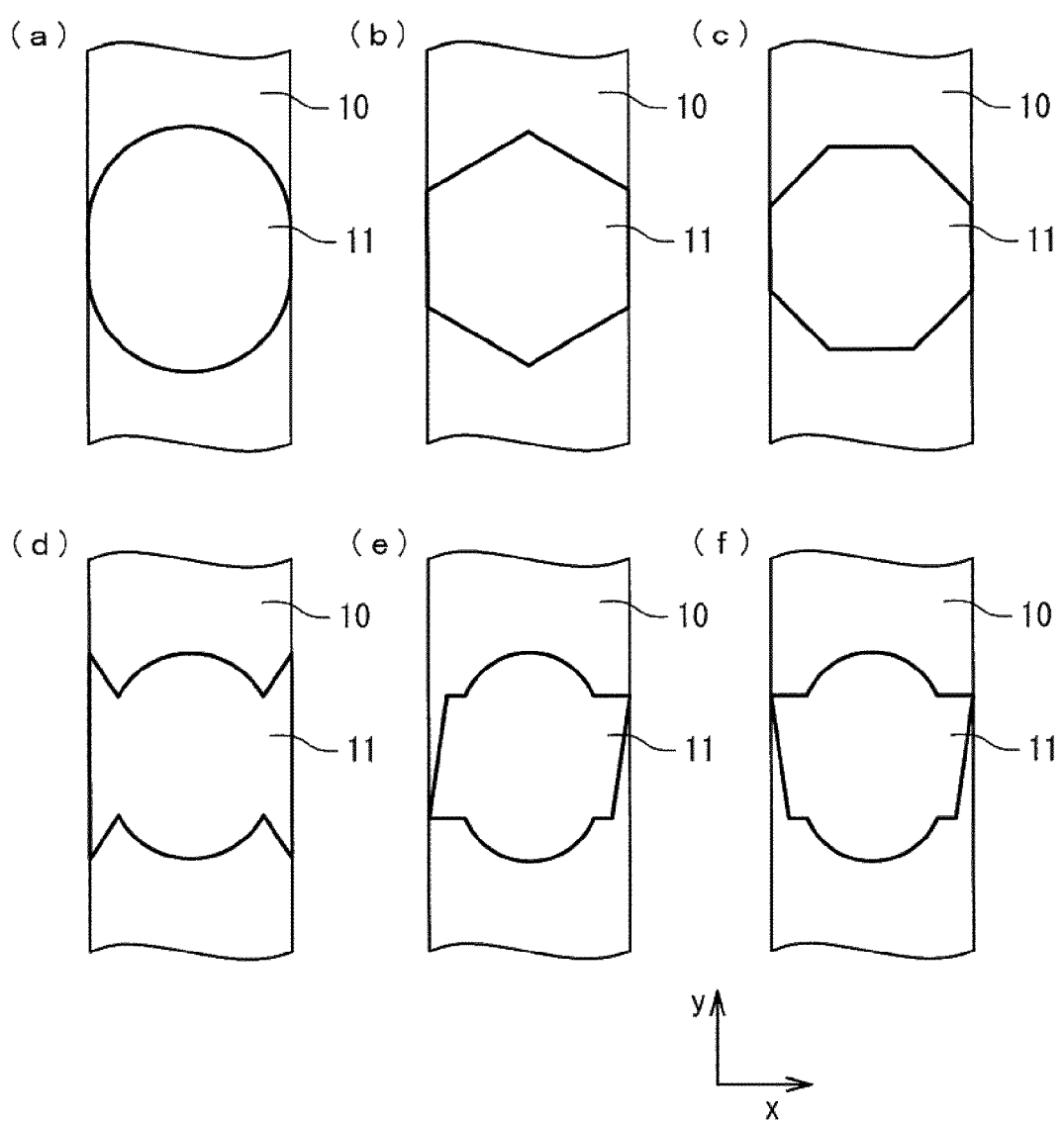
FIG. 38 shows an example of shape of a sense layer in the twelfth modification of the first embodiment.

FIG. 38 shows another mode of this modification. By using the shape other than ellipse as the shape of the sense layer 11 as shown in FIG. 38, it can be controlled so that the magnetization state of the zero magnetic field becomes the S magnetic domain and either of the reversal paths shown in FIGS. 36 and 37 may be preferentially selected. Especially by performing patterning so that the end of the sense layer 11 in the x-axis direction may be a straight line along the y-axis as shown in FIGS. 38 (a), (b), (c), (d), the direction of the magnetic moment at the end can be controlled. Alternatively, by inclining the end from the y-axis direction as shown in FIGS. 38 (e), (f), the magnetization state of the end can be controlled and it is possible to restrict the reversal path.

(Thirteenth Modification)

Figure 39:
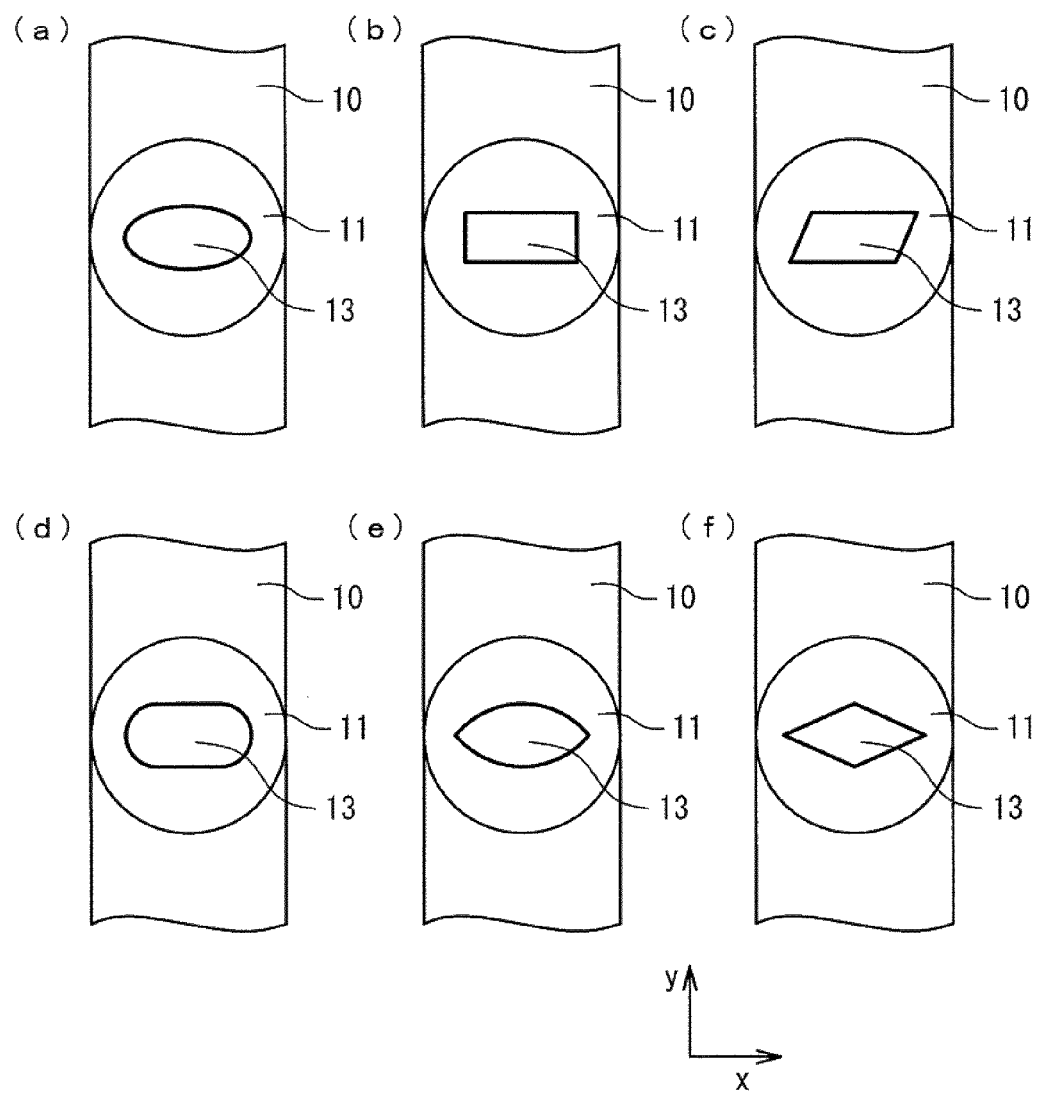
FIG. 39 is a plan view of a magnetic memory cell in a thirteenth modification of the first embodiment.

FIG. 39 is an x-y plan view showing a structure of a thirteenth modification of the magnetic memory cell according to the first embodiment of the present invention. This modification relates to the planar shape of the storage layer 13. By properly designing the planar shape of the storage layer 39 as shown in the figure, a stable magnetization state of the storage layer 13, magnitude of magnetic anisotropy and magnetic characteristics of the whole of the magnetization free layer 20 can be adjusted. Furthermore, the stable magnetization state of the sense layer 11 can be controlled and it is possible to restrict the reversal path.

(Fourteenth Modification)

Figure 40:
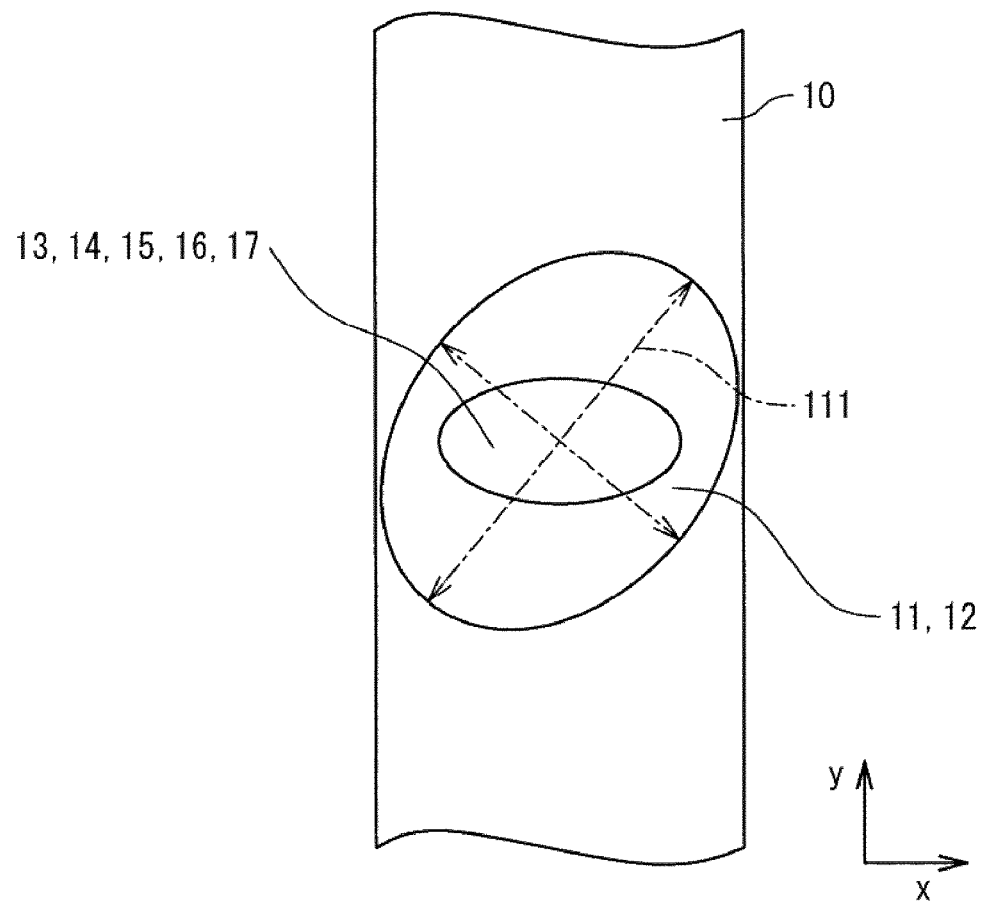
FIG. 40 is a plan view of a magnetic memory cell in a fourteenth modification of the first embodiment.
Figure 41:
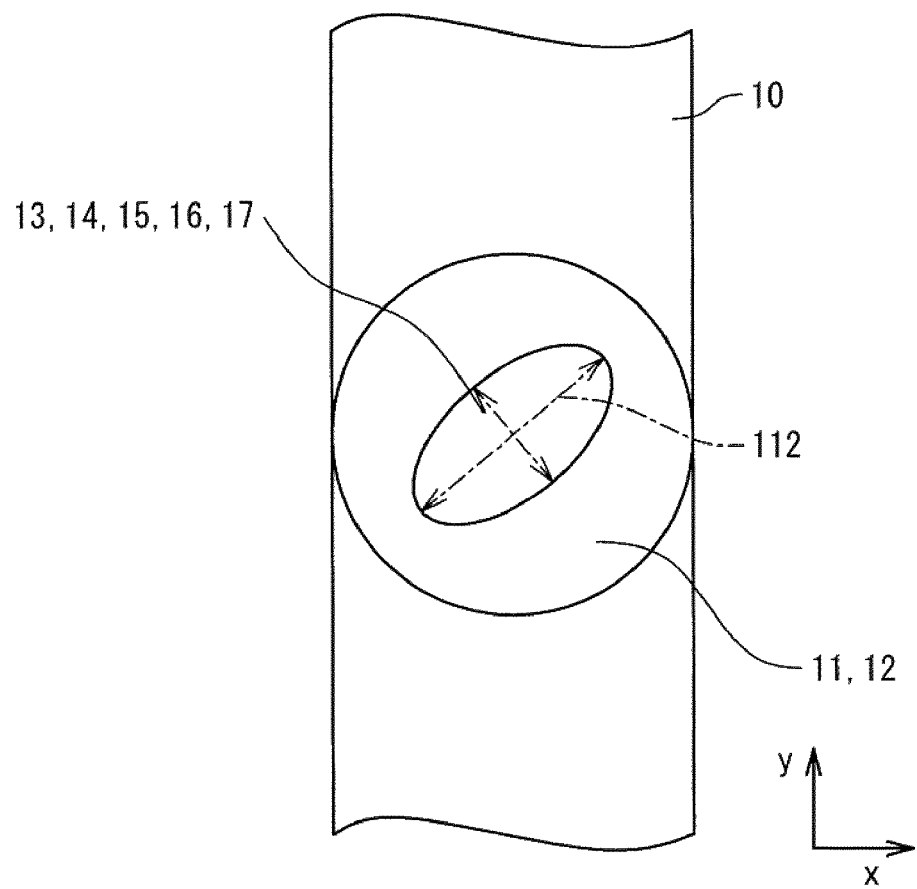
FIG. 41 is a plan view of a magnetic memory cell in the fourteenth modification of the first embodiment.

FIGS. 40 and 41 are x-y plan views showing a structure of a fourteenth modification of the magnetic memory cell according to the first embodiment of the present invention. This modification relates to the direction of the magnetization easy axes of the sense layer 11 and the storage layer 13. FIG. 40 shows a modification in which the magnetization easy axis direction 111 of the sense layer 11 is inclined with respect to the x-axis and the y-axis and FIG. 41 shows a modification in which the magnetization easy axis direction 112 of the storage layer 13 is inclined with respect to the x-axis and the y-axis. The direction of each magnetization easy axis may be oriented in any direction in the x-y plane. Though not shown in the figures, both of the magnetization easy axis direction 111 of the sense layer 11 and the magnetization easy axis direction 112 of the storage layer 112 may be inclined at a same angle or at different angles with respect to the x-axis and the y-axis.

This modification can be combined with the thirteenth modification. That is, any planar shape can be adopted for each layer. The aspect ratio of each layer in this case is defined as follows. First, given that the longest line segment of line segments connecting any two points on the circumference of the storage layer 13 in the x-y plane is $L_{STORAGE}$ and the line segment connecting any two points on the circumference in the direction orthogonal to the longest line segment is $W_{STORAGE}$, the aspect ratio of the storage layer 13 is represented by $L_{STORAGE}/W_{STORAGE}$. Given that the line segment connecting any two points on the circumference of the sense layer 11 in the direction of the longest line segment $L_{STORAGE}$ is $L_{SENSE}$ and the line segment connecting any two points on the circumference in the direction orthogonal to the segment $L_{SENSE}$ is $W_{SENSE}$, the aspect ratio of the sense layer 11 is represented by $L_{SENSE}/W_{SENSE}$.

In this modification, the operation is stabilized due to a decrease in a write current and restriction of the reversal path. It is known that when the magnetic body is magnetically reversed, magnitude of the total magnetic field necessary for magnetization reversal becomes smaller by applying the magnetic field obliquely with respect to the magnetization easy axis direction than by applying the magnetic field in parallel to the magnetization easy axis direction. Thus, in this modification, a current necessary for switching can be reduced.

With the structure shown in FIG. 40, for example, considering the case that the storage layer 13 is magnetized in the positive direction of the x-axis. Here, when the current passes to the interconnection layer 10 in the negative direction of the y-axis and the magnetic field is applied to the magnetization tree layer 20 in the negative direction of the x-axis, since the magnetization easy axis 111 of the sense layer 11 is inclined, magnetization reversal occurs in a path of the counterclockwise direction and switching in the negative direction of the x-axis of magnetization of the storage layer 13 is completed. Next, in the case where the current passes to the interconnection layer 10 in the positive direction of the y-axis and the magnetic field is applied to the magnetization free layer 20 in the positive direction of the x-axis, since the magnetization easy axis 111 of the sense layer 11 is inclined, magnetization reversal in a path of the counterclockwise direction occurs again and switching in the positive direction of the x-axis of magnetization of the storage layer 13 is completed. In other words, in this case, reversal path as shown in FIG. 37 is selectively achieved. Thereby, the reversal operation is stabilized.

Although the direction of magnetic anisotropy is controlled by shape magnetic anisotropy in FIGS. 40 and 41, the direction of the magnetic anisotropy may be provided by crystal magnetic anisotropy.

(Fifteenth Modification)

Figure 42:
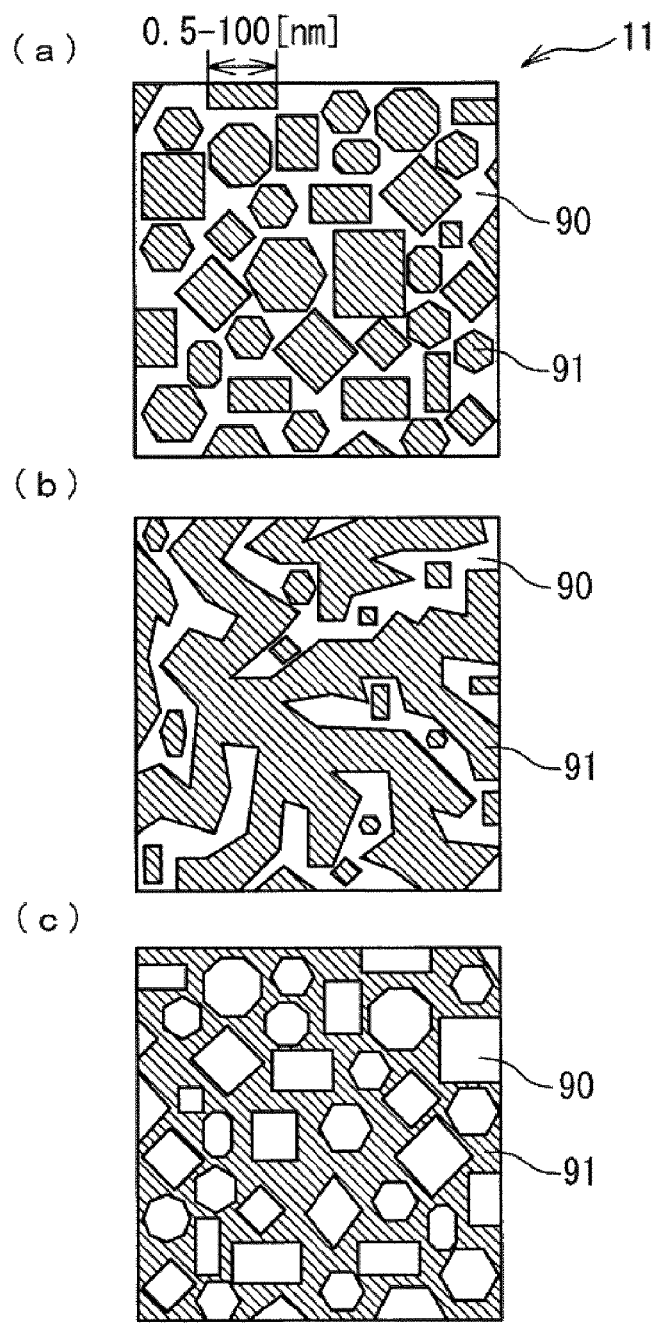
FIG. 42 is a plan view of a magnetic memory cell in a fifteenth modification of the first embodiment.

FIG. 42 shows an x-y plan view showing a structure of a fifteenth modification of the magnetic memory cell according to the first embodiment of the present invention. This modification relates to a tissue of the sense layer 11 in the nanometer range. In the sense layer 11, particles of a ferromagnetic phase 91 in the nanometer range may be dispersed in a matrix of a nonmagnetic phase 90 as shown in FIG. 42(*a*), the ferromagnetic phase 91 may be separated from the nonmagnetic phase 90 so as to create a network in the nanometer range as shown in FIG. 42(*b*) or particles of the nonmagnetic phase 90 may be dispersed in a matrix of the ferromagnetic phase 91 as shown in FIG. 42(*c*). Here, the size of the particles in the nanometer range is preferably about 0.5-100 [nm]. This is due to that physical properties appear in such size as distinct from the bulk.

The tissues as shown in FIG. 42 are called as nanocomposite. In recent years, in nanocomposite magnetic materials, various interesting phenomena which are not found in the bulk have been reported. In other words, by forming a tissue of the material of the sense layer 11 into a nanocomposite as in this modification, magnitude of effective magnetic anisotropy and an effective exchange stiffness constant of the sense layer 11 can be controlled to proper values.

In the tissue as shown in FIG. 42(*a*), it is known that when the size of the particles of the ferromagnetic phase 91 becomes a few dozens of nanometers or less, the magnetic characteristics of the sense layer 11 shifts from ferromagnetic to superparamagnetic. In this case, the anisotropic magnetic field caused by the material is dramatically reduced. Thereby, the write current is further decreased.

Second Embodiment

Figure 43:
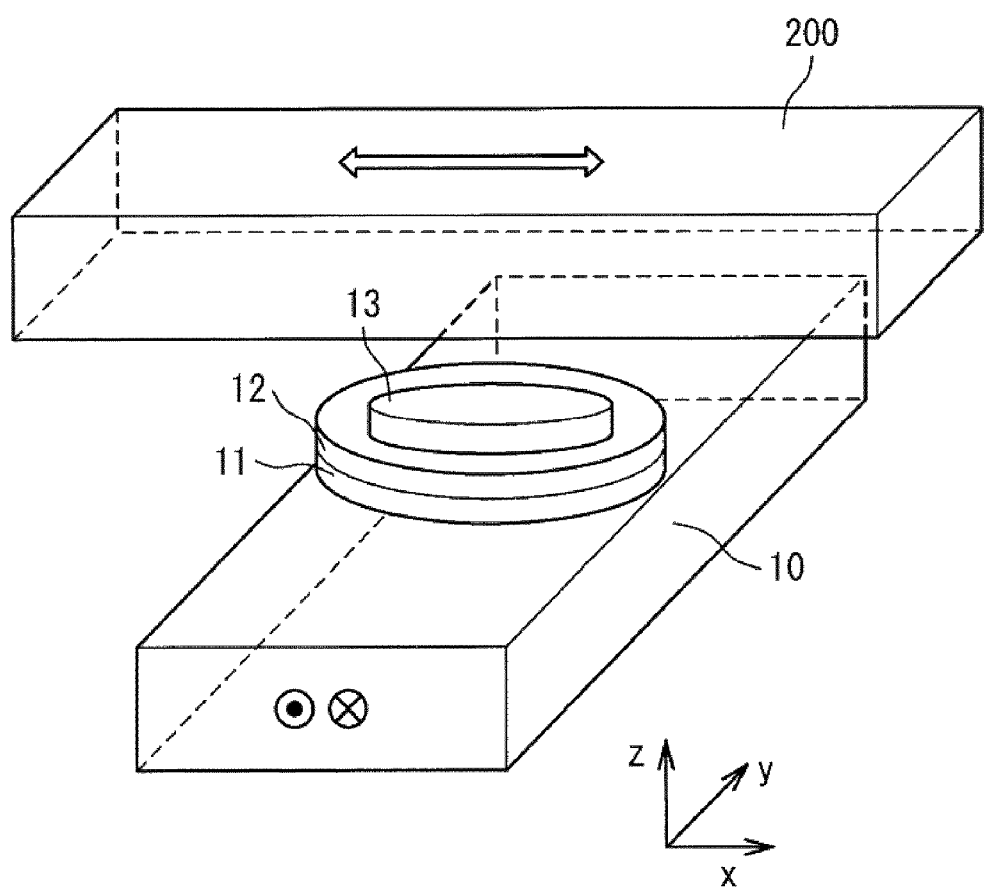
FIG. 43 is a perspective view of a magnetic memory cell according to a second embodiment.
Figure 44:
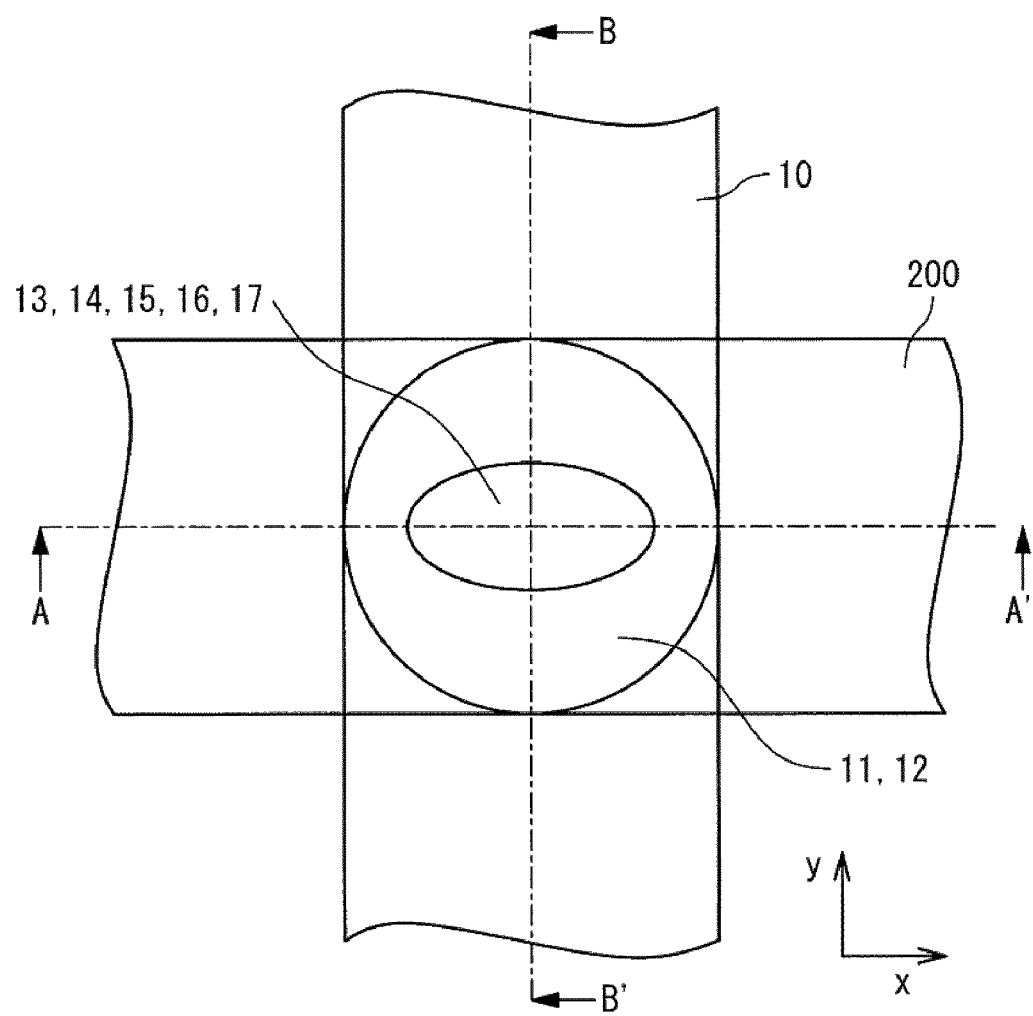
FIG. 44 is a plan view of the magnetic memory cell according to the second embodiment.
Figure 45:
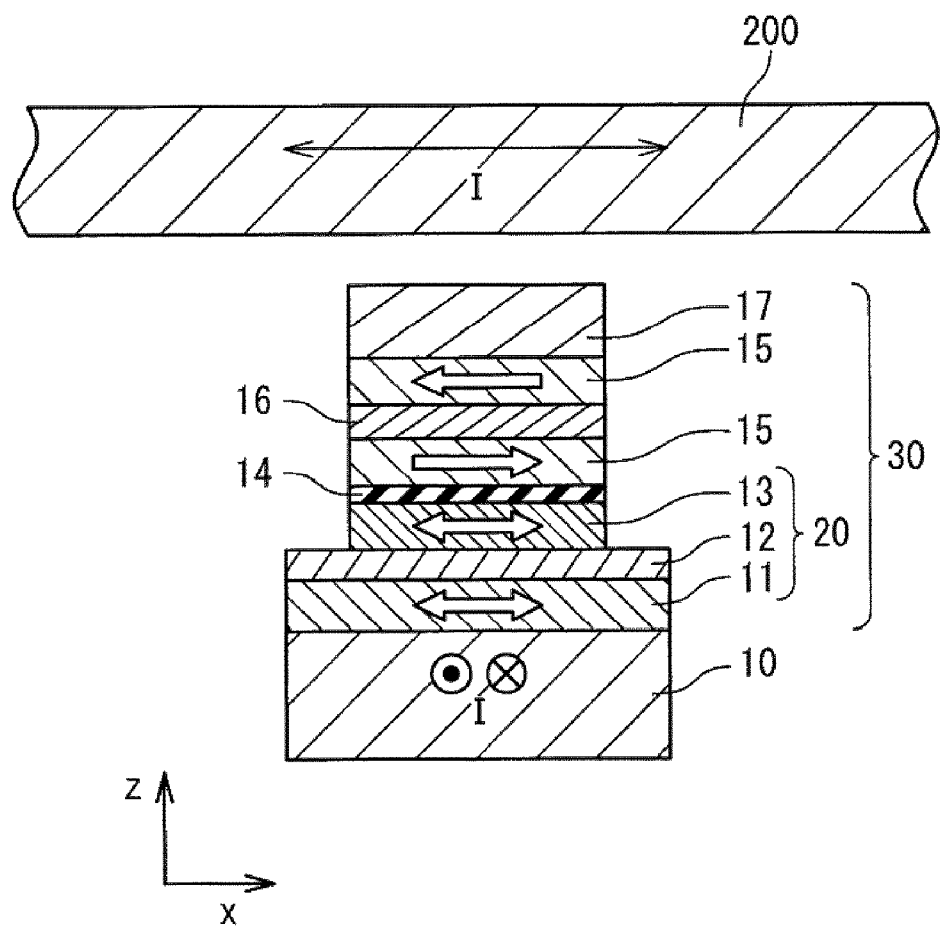
FIG. 45 is a sectional view of the magnetic memory cell according to the second embodiment.
Figure 46:
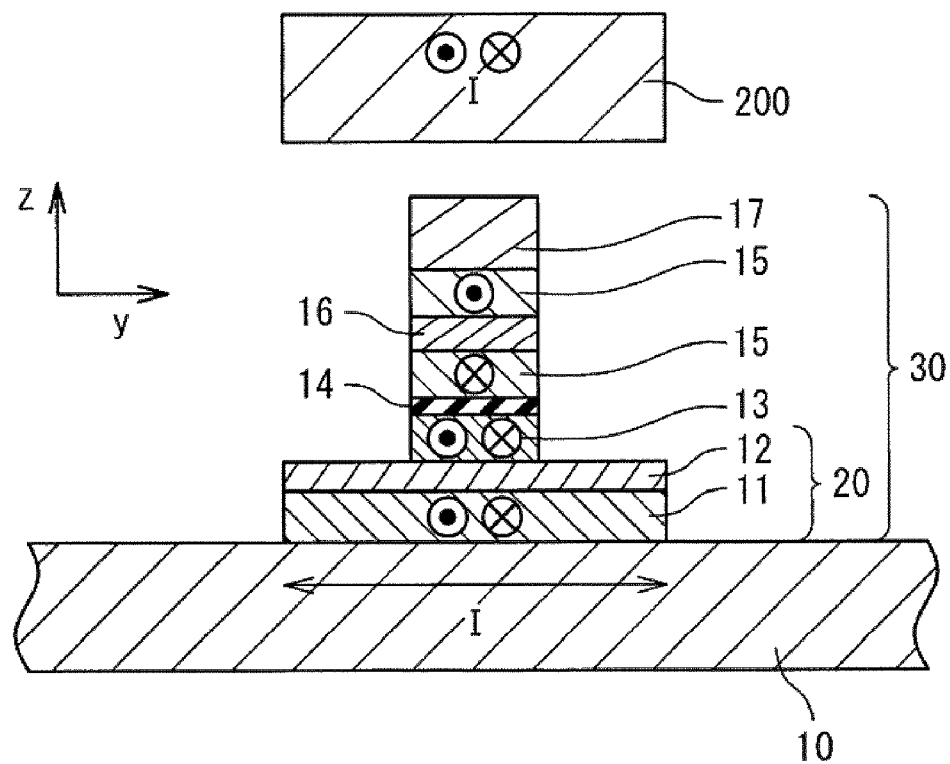
FIG. 46 is a sectional view of the magnetic memory cell according to the second embodiment.

Next, a magnetic memory cell according to a second embodiment will be described below. FIG. 43 is a perspective view showing a structure of a main part of the magnetic memory cell. FIG. 44 is a plan view, FIG. 45 is a sectional view along A-A' in FIG. 44 and FIG. 46 is a sectional view along B-B' in FIG. 44. The magnetic memory cell according to the second embodiment of the present invention is different from that of the first embodiment in that a second interconnection layer 200 is provided in a vicinity of the magnetization free layer 20. The second interconnection layer 200 is substantially orthogonal to the interconnection layer 10 in the x-y plane. The second interconnection layer 200 is made of a conductive material. Specifically, Al, Cu are exemplified.

According to the present embodiment, the magnetic field is applied by the interconnection layer 10 in the x-axis direction to the magnetization free layer 20 and the magnetic field is further applied by the second interconnection layer 200 in the y-axis direction. Thereby, a write current is further decreased. Further, it is also possible to restrict the reversal path as shown in FIGS. 36 and 37.

Figure 47:
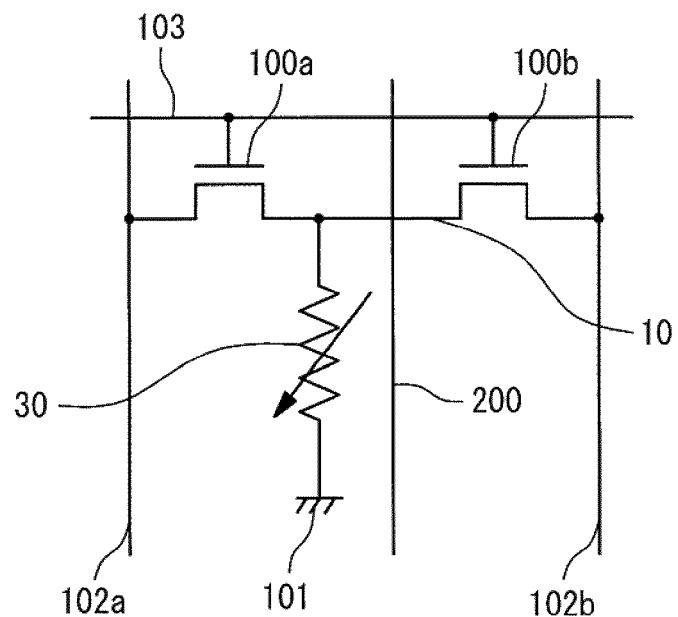
FIG. 47 is a circuit diagram of the magnetic memory cell according to the second embodiment.

FIG. 47 shows an example of a circuit diagram for one cell for realizing the present embodiment. In a writing operation, in addition to the circuit setting described in the first embodiment, a current passes to the second interconnection layer 200, thereby applying the magnetic field to the magnetoresistive effect element 30. In the present embodiment, the two write interconnections which are orthogonal to each other are used according to a biaxial magnetic field write method. However, most of writing is caused by the magnetic field from the interconnection layer 10 in the easy axis direction and the two MOS transistors 100*a*, 100*b* for selecting cell are connected to the interconnection layer 10. Accordingly, this method has much better selectivity than a general biaxial write method.

Figure 48:
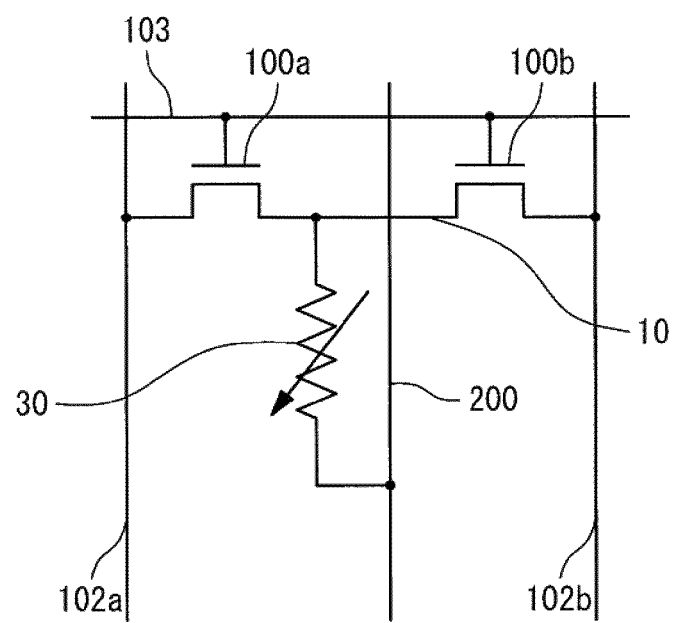
FIG. 48 is a circuit diagram of the magnetic memory cell according to the second embodiment.

FIG. 48 shows an example of a circuit diagram for another cell for realizing the present embodiment. One end of the magnetoresistive effect element 30 can be connected to the second interconnection layer without using the ground line 101 as shown in FIG. 48.

Figure 49:
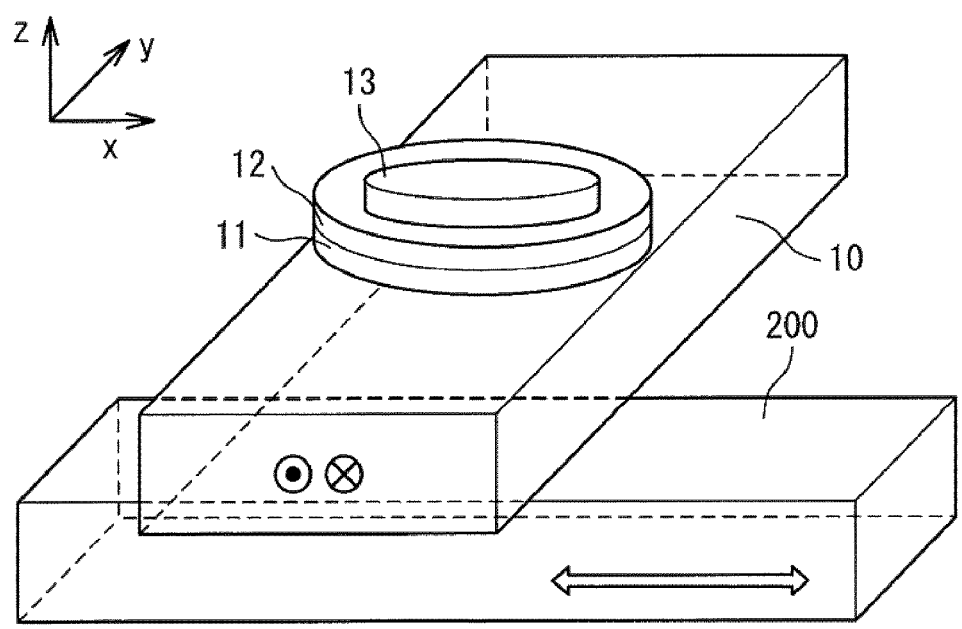
FIG. 49 is a perspective view of a magnetic memory cell in modification of the second embodiment.
Figure 50:
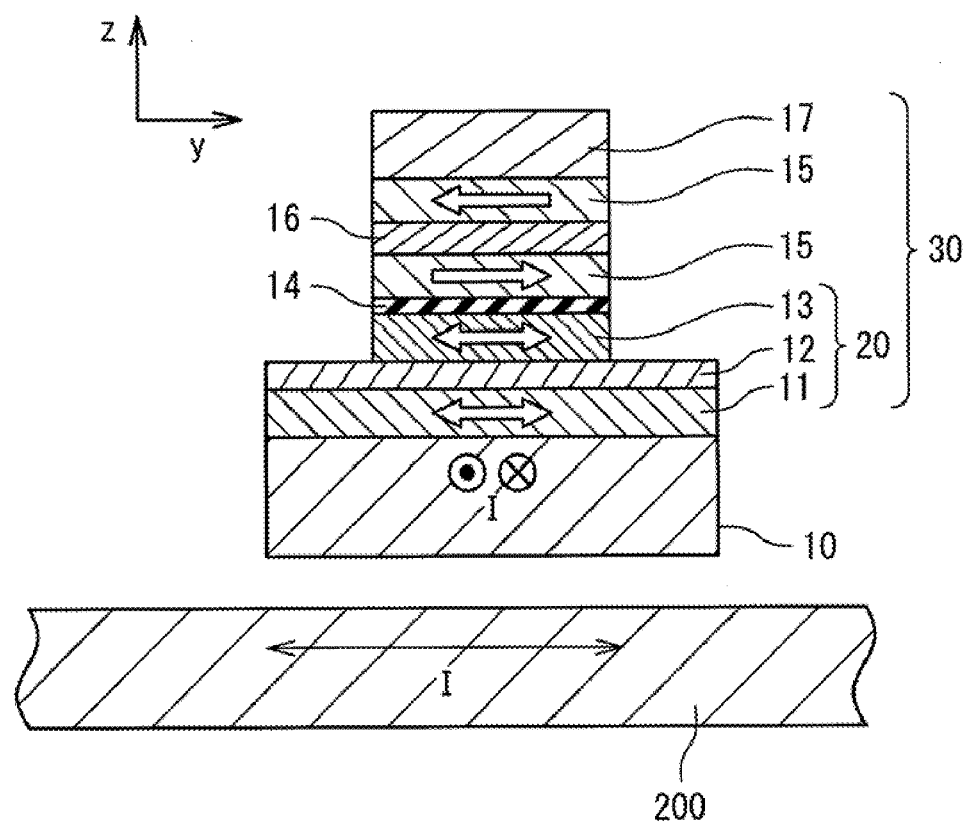
FIG. 50 is a sectional view of a magnetic memory cell in modification of the second embodiment.
Figure 51:
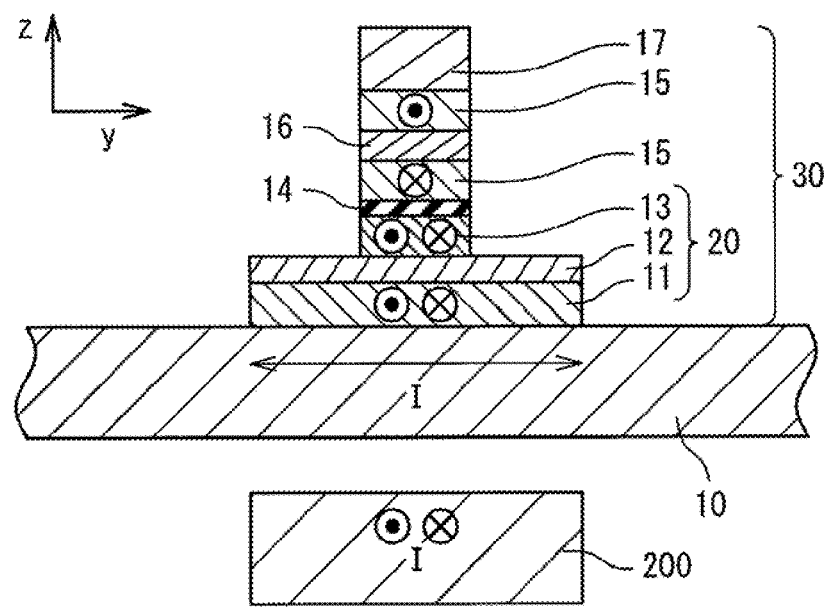
FIG. 51 is a sectional view of a magnetic memory cell in modification of the second embodiment.

As shown in FIGS. 43 to 46, the second interconnection layer 200 may be provided on the opposite side to the interconnection layer 10 across the magnetoresistive effect element 30 or as shown in FIGS. 49 to 51, may be provided on the opposite side to the magnetoresistive effect element 30 across the interconnection layer 10. The second interconnection layer 200 may be provided so as to be orthogonal to the first interconnection layer 10 in the plane as shown in the figures or may be provided so as to be parallel to the first interconnection layer 10. When the second interconnection layer 200 is provided so as to be parallel to the first interconnection layer 10, the magnetic field in the easy axis direction simply increases.

Third Embodiment

Basic Structure and Operation Principle and its Effects

Figure 52:
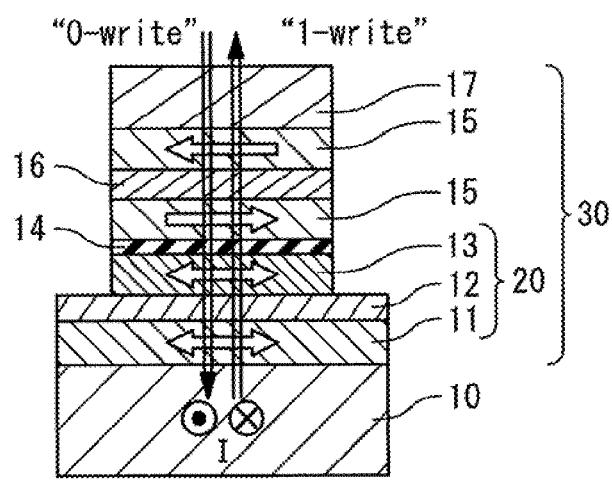
FIG. 52 is a sectional view of a magnetic memory cell according to a third embodiment.

Next, FIG. 52 is an x-z sectional view showing a structure of a magnetic memory cell according to a third embodiment. According to the third embodiment, for magnetization reversal of the magnetization free layer 20, in addition to the magnetic field induced by the interconnection layer 10, an effect of spin torque transfer caused by a spin polarization current passing through the MTJ is utilized. The latter effect is so-called spin injection.

In the spin injection, in the case where electrons pass through the MTJ and flow into the magnetization free layer 20 from the magnetization fixed layer 15 through the insulating layer 14, a torque to orient magnetization in parallel to the magnetization fixed layer 15 acts on the magnetization free layer 20. On the other hand, in the case where the current passes from the magnetization free layer 20 to the magnetization fixed layer 15 through the insulating layer 14, a torque to orient magnetization in antiparallel to the magnetization fixed layer 15 acts on the magnetization free layer 20. Thus, in writing, by passing a current which generates a desired magnetic field to the interconnection layer 10 and passing a current passing through the MTJ at the same time as shown in FIG. 52, a magnetic field and a spin torque act on the magnetization free layer 20 simultaneously, thereby achieving magnetization reversal with a low current.

In the figure the state "0" corresponds to a case where the magnetization fixed layer 15 and the storage layer 13 which are adjacent to the insulating layer 14 are parallel to each other and the state "1" corresponds to a case where the magnetization fixed layer 15 and the storage layer 13 which are adjacent to the insulating layer 14 are antiparallel to each other. Arrows in the figure represent the direction of a flow of the electrons and the direction of a current is opposite to it. Here, it is given that the magnetization easy axis of the storage layer 13 and the magnetization fixed layer 15 is in the longitudinal direction of the interconnection layer 10, that is, the direction which is substantially perpendicular to the y-axis direction, that is, the x-axis direction. However, by adjusting the direction of the magnetization easy axis in each layer, the current necessary for writing can be decreased.

In the present embodiment, since the current passing through the MTH in writing passes, temperature of the MTJ increases. Thus, the magnetic field necessary for switching of the magnetization free layer 20 is reduced, thereby achieving writing with a still lower current.

According to the spin injection method, since a relatively large current needs to pass to the insulating layer 14 in writing, voltage breakdown of the insulating layer 14 or deterioration of characteristic due to rewriting is matter of concerns. However, since a current value necessary for spin injection is decreased in the present embodiment, such a problem is solved.

(First Modification)

Figure 53:
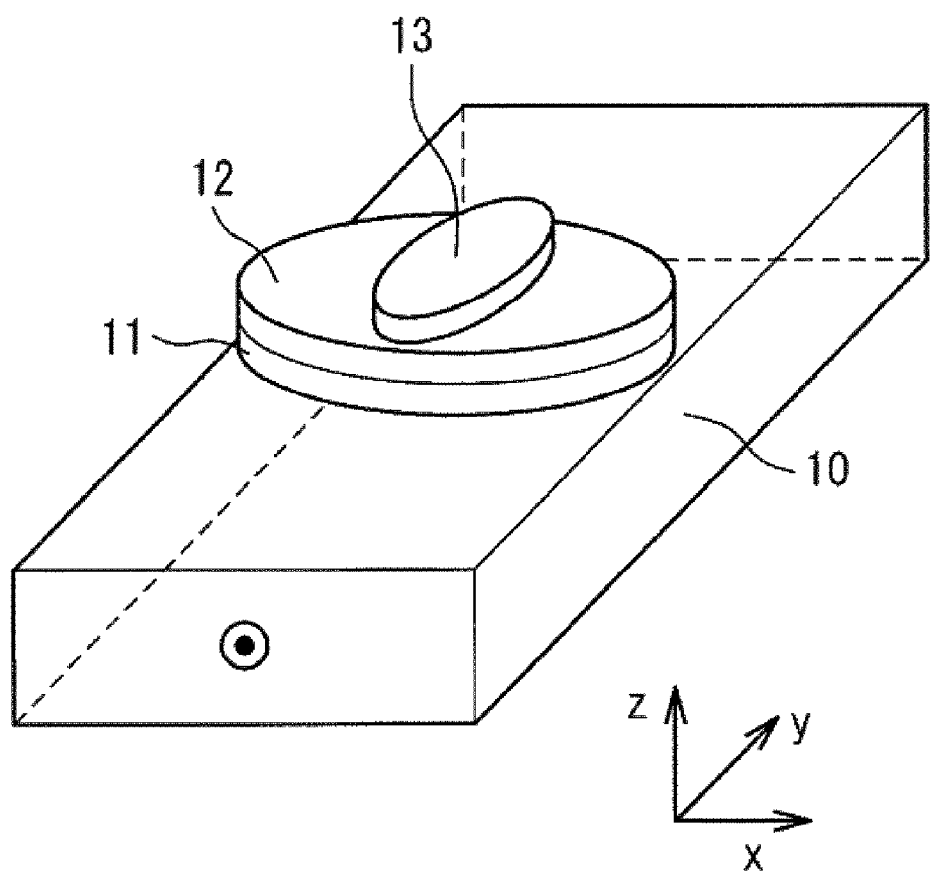
FIG. 53 is a perspective view of a magnetic memory cell in a first modification of third embodiment.
Figure 54:
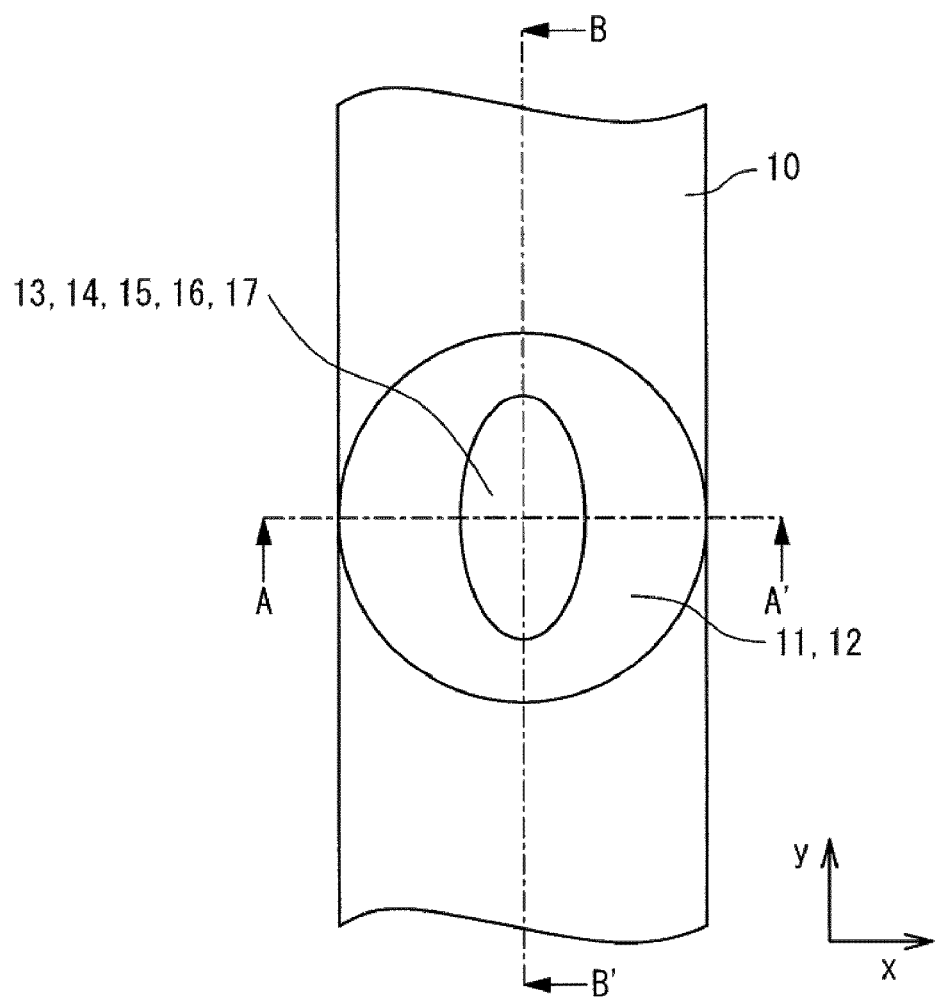
FIG. 54 is a plan view of the magnetic memory cell in the first modification of the third embodiment.
Figure 55:
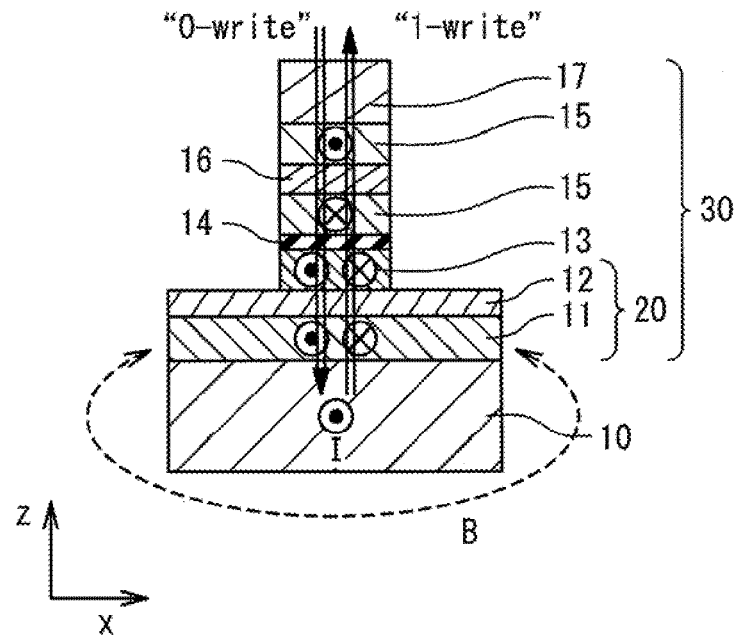
FIG. 55 is a sectional view of the magnetic memory cell in the first modification of the third embodiment.
Figure 56:
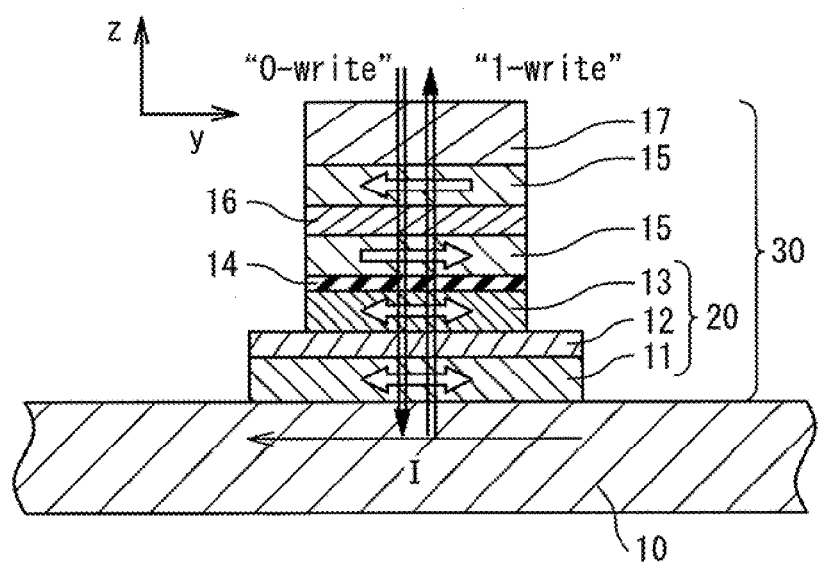
FIG. 56 is a sectional view of the magnetic memory cell in the first modification of the third embodiment.

FIG. 53 is a perspective view of a first modification of the magnetic memory cell according to the third embodiment of the present invention, FIG. 54 is an x-y plan view, FIG. 55 is an x-z sectional view and FIG. 56 is a y-z sectional view. This modification relates to the magnetization easy axis direction of the storage layer 13 and the magnetization fixed layer 15, and the magnetization easy axis direction is designed to be substantially parallel to the longitudinal direction of the interconnection layer 10.

In this modification, writing to the magnetization free layer 20 is performed according to the above-mentioned spin injection method, and at this time, the magnetic field induced by the interconnection layer 10 is applied to the storage layer 13 in the hard axis direction. In the spin injection method, since switching with a low current at high speed is achieved in a case where the magnetic field is applied in the hard axis direction, as compared to a case using a simple spin injection method, writing with a lower current and at higher speed can be achieved in the present embodiment.

Fourth Embodiment

Basic Structure and Operation Principle and its Effects

In recent years, a current driving magnetic domain wall moving phenomenon is reported, in which the spin torque transfer effect similar to the above-mentioned spin injection method is used. This phenomenon is that when a current passes to a magnetic thin line containing a magnetic domain wall in a longitudinal direction of the thin line, spin-polarized conduction electrons have an effect (pressure) on magnetic moments in the magnetic domain wall and the magnetic domain wall moves in the same direction as the direction of passing the conduction electrons.

Figure 57:
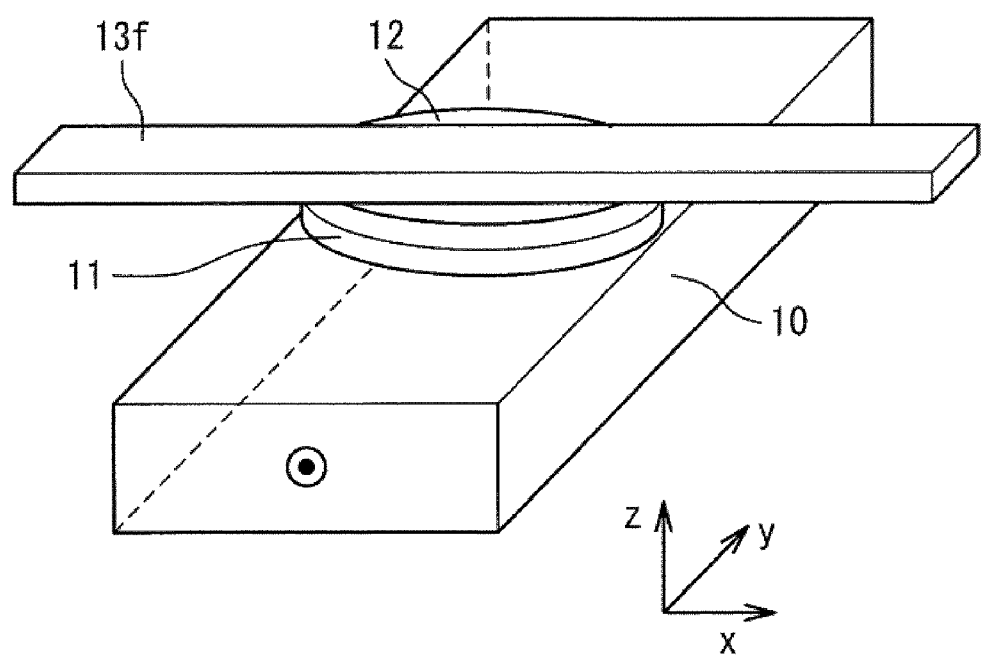
FIG. 57 is a perspective view of a magnetic memory cell according to a fourth embodiment.
Figure 58:
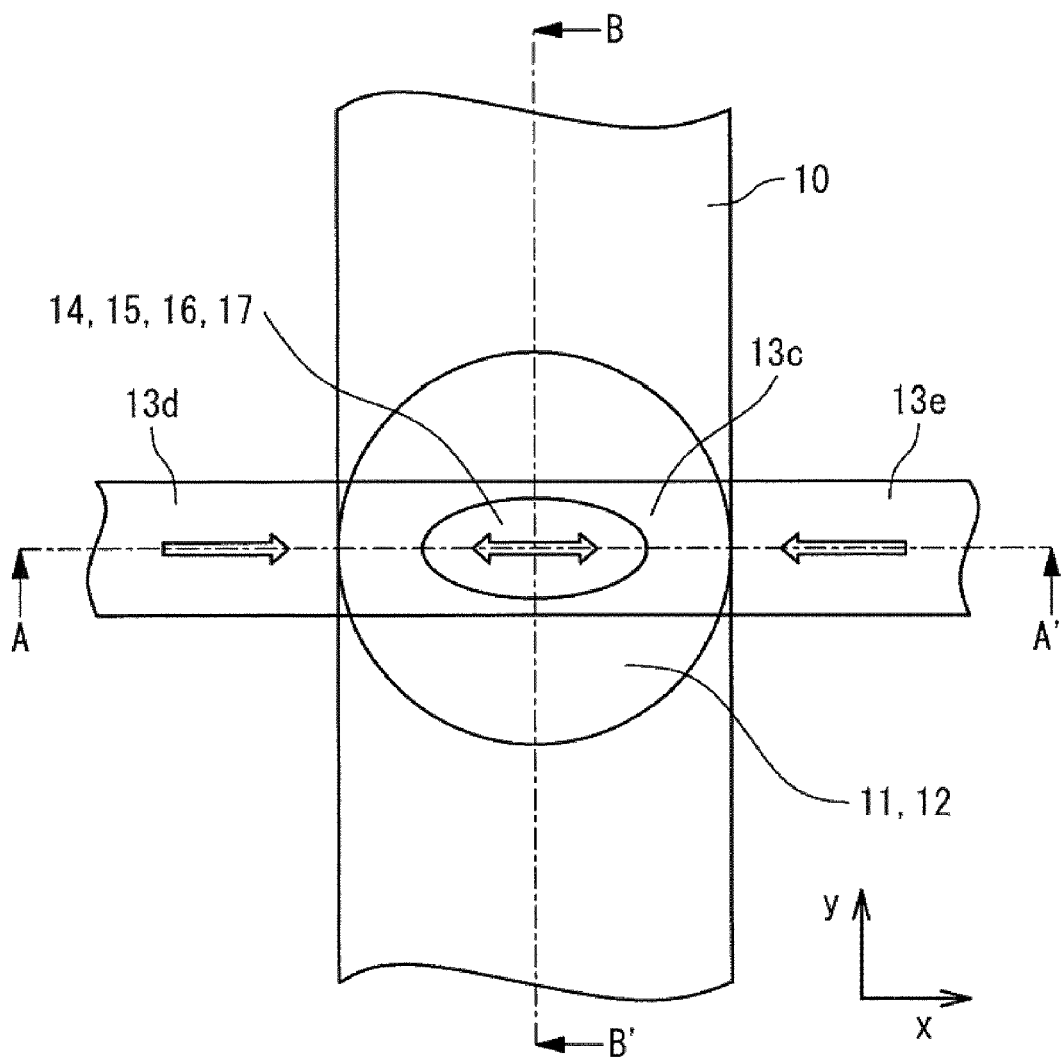
FIG. 58 is a plan view of the magnetic memory cell according to the fourth embodiment.
Figure 59:
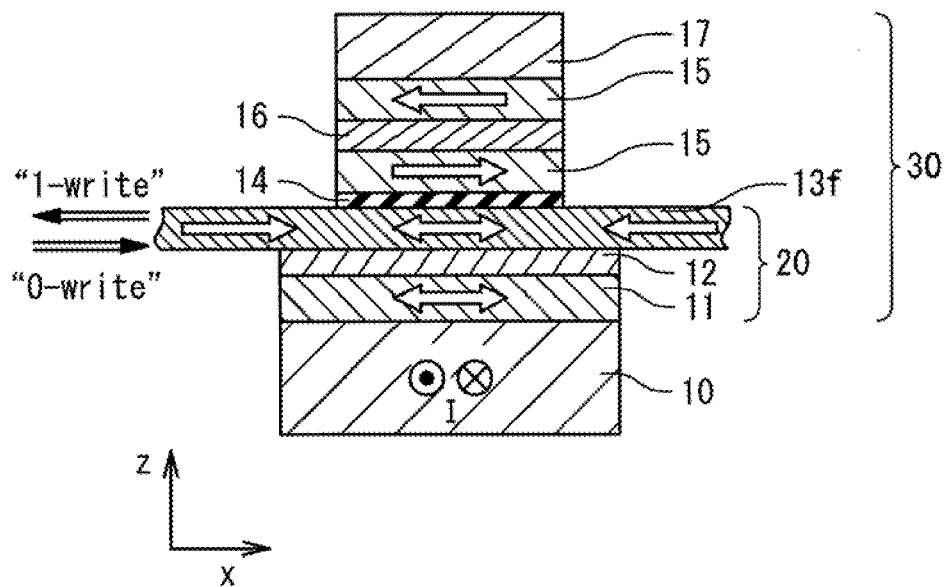
FIG. 59 is a sectional view of the magnetic memory cell according to the fourth embodiment.
Figure 60:
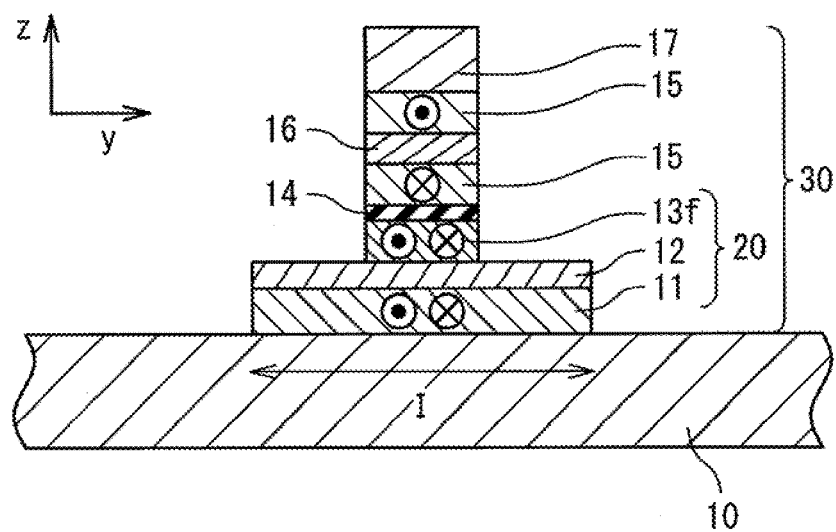
FIG. 60 is a sectional view of the magnetic memory cell according to the fourth embodiment.

In a fourth embodiment of the present invention, the above-mentioned current driving magnetic domain wall moving phenomenon is utilized. FIG. 57 is a perspective view showing a configuration of the magnetic memory cell according to the fourth embodiment of the present invention, FIG. 58 is an x-y plan view, FIG. 59 is a sectional view along A-A' (x-z sectional view) in FIG. 58 and FIG. 60 is a sectional view along B-B' (y-z sectional view) in FIG. 58. The magnetic memory cell according to the fourth embodiment of the present invention includes the interconnection layer 10 and the magnetoresistive effect element 30. The magnetoresistive effect element 30 includes the magnetization free layer 20, the insulating layer 14, the magnetization fixed layer 15 and the antiferromagnetic layer 17.

The magnetization free layer 20 includes the sense layer 11, the broad storage layer 13f and the first bonding layer 12 provided between the sense layer 11 and the broad storage layer 13f. Given that the longitudinal direction of the interconnection layer 10 is the y-axis, the direction perpendicular to the y-axis in the plane is the x-axis, the broad storage layer 13f is provided so as to have the longitudinal direction which is substantially parallel to the x-axis. The broad storage layer 13f provided in substantially parallel to the x-axis further includes a magnetic domain wall moving region (strict storage layer) 13c, a first magnetization fixed region 13d and a second magnetization fixed region 13e. At least a part of the magnetic domain wall moving region (strict storage layer) 13c overlaps the sense layer 11 in the x-y plane.

Magnetic anisotropy of the magnetization fixed layer 15 and the magnetic domain wall moving region (strict storage layer) 13c is designed to have components in the x-axis direction. Magnetization of the magnetization fixed layer 15 is substantially fixed to one direction, while magnetic anisotropy is provided so that magnetization of the magnetic domain wall moving region (strict storage layer) 13c faces in parallel or antiparallel to magnetization of the magnetization fixed layer 15 when no magnetic field is applied. Furthermore, magnetization of the first magnetization fixed region 13d and magnetization of the second magnetization fixed region 13e are fixed respectively to a direction going toward the magnetic domain wall moving region 13c (strict storage layer). Alternatively, magnetization of the first magnetization fixed region 13d and magnetization of the second magnetization fixed region 13e are fixed to a direction moving away from the magnetic domain wall moving region (strict storage layer) 13c.

The storage layer 13 in the first embodiment corresponds to the magnetic domain wall moving region (strict storage layer) 13c in the present embodiment. Accordingly, as represented by the above-mentioned analytic calculation, it is preferable that magnetic volume of the magnetic domain wall moving region (strict storage layer) 13c is designed to be smaller than magnetic volume of the sense layer. Hereinafter, for correspondence with the above-mentioned description, the magnetic domain wall moving region (strict storage layer) 13c is referred to as merely storage layer 13c'.

Depending on a structure and a magnetization state of the above-mentioned broad storage layer 13f, in the broad storage layer 13f, the magnetic domain wall is introduced at a place between the first magnetization fixed region 13d and the second magnetization fixed region 13e.

In the magnetic memory cell according to the fourth embodiment, writing is performed by moving a magnetic domain wall of the storage layer 13C' by a current passing in the broad storage layer 13f, a magnetic field induced by the interconnection layer 10 and magnetic coupling conducted from the sense layer 11 through the first bonding layer 12. Preferably, the planar shape of a boundary between the storage layer 13c' and the first magnetization fixed region 13d and a boundary between the storage layer 13c' and the second magnetization fixed region 13e is patterned so that the boundaries may become stabilization points of the magnetic domain wall. For example, by providing a notch or a curve, patterning enabling the above-mentioned operation can be achieved. In this manner, a binary state can be stably realized in the magnetic domain wall moving region.

The first magnetization fixed region 13d and the second magnetization fixed region 13e, and the storage layer 13c' may be provided in a same plane or may be provided in different planes. For example, by using a material having vertical magnetic anisotropy for the first magnetization fixed region 13d and the second magnetization fixed region 13e, the first magnetization fixed region 13d and the second magnetization fixed region 13e can be provided vertical to the film surface of the storage layer 13C'.

Next, a method of writing information to the magnetic memory cell according to the fourth embodiment will be described referring to FIG. 59. It is assumed that the magnetization direction of the magnetization fixed layer 15 adjacent to the insulating layer 14 is fixed to the positive direction of the x-axis, and the state where the magnetization direction of the storage layer 13c' is the positive direction of the x-axis is called as the state "0" and the state where the magnetization direction of the storage layer 13c' is the negative direction of the x-axis is called as the state "1". It is assumed that the first magnetization fixed region 13d is connected in the negative direction of the x-axis from the storage layer 13c' and the second magnetization fixed region 13e is connected in the positive direction of the x-axis from the storage layer 13c'. Magnetization of the first magnetization fixed region 13d and the second magnetization fixed region 13e is fixed to a direction moving toward the storage layer 13c'.

Now, it is assumed that magnetization of the storage layer 13c' is oriented in the positive direction of the x-axis in the state "0". At this time, a magnetic domain wall (Head-to-Head magnetic domain wall) is formed between the storage layer 13c' and the second magnetic domain wall moving region 13e. Here, a current passes to the interconnection layer 10 in the negative direction of the y-axis and a current passes to the broad storage layer 13f in the positive direction of the x-axis at the same time. At this time, the current passing through the interconnection layer 10 induces the magnetic field moving in the negative direction of the x-axis at positions of the sense layer 11 and the storage layer 13C'. Thereby, magnetization of the sense layer 11 and the storage layer 13C' attempts to be reversed in the negative direction of the x-axis. Meanwhile, by a current passing through the broad storage layer 13f in the positive direction of the x-axis, spin-polarized conduction electrons flow into the storage layer 13C' from the second magnetization fixed region 13e through the magnetic domain wall. Through this flow, the magnetic domain wall moves in the negative direction of the x-axis and magnetization of the storage layer 13c' attempts to be oriented in the negative direction of the x-axis. In this manner, switching to the state "1" can be achieved by both of the magnetic field induced by the current and the spin polarization current passing in the broad storage layer 13f.

Meanwhile, reversal from the "1" state to the state "0" is achieved by passing the current to the interconnection layer 10 in the positive direction of the y-axis and passing the current to the broad storage layer 13f in the negative direction of the x-axis. By effectively using the magnetic field and spin torque transfer at the same time, the current necessary for writing can be decreased.

In the present embodiment, since the current passes through the broad storage layer 13f in writing, the temperatures of the storage layer 13C' and the magnetization free layer 20 containing the storage layer 13C' increase. Thus, since the magnetic field necessary for switching of the magnetization free layer 20 is reduced, writing with a still lower current is achieved.

In the present embodiment, the shape of the sense layer 11, the broad storage layer 13f and the magnetization fixed layer 15 is freely set.

The present embodiment is characterized by that the magnetic domain wall moving phenomenon is utilized for switching in the storage layer 13C' and the spin-polarized current is used in the method. However, with a structure of the magnetoresistive effect element in the present embodiment, the magnetic domain wall formed in the broad storage layer 13f may be driven only by the magnetic field induced by the first interconnection layer 10 without passing a current therein.

(First Modification)

Figure 61:
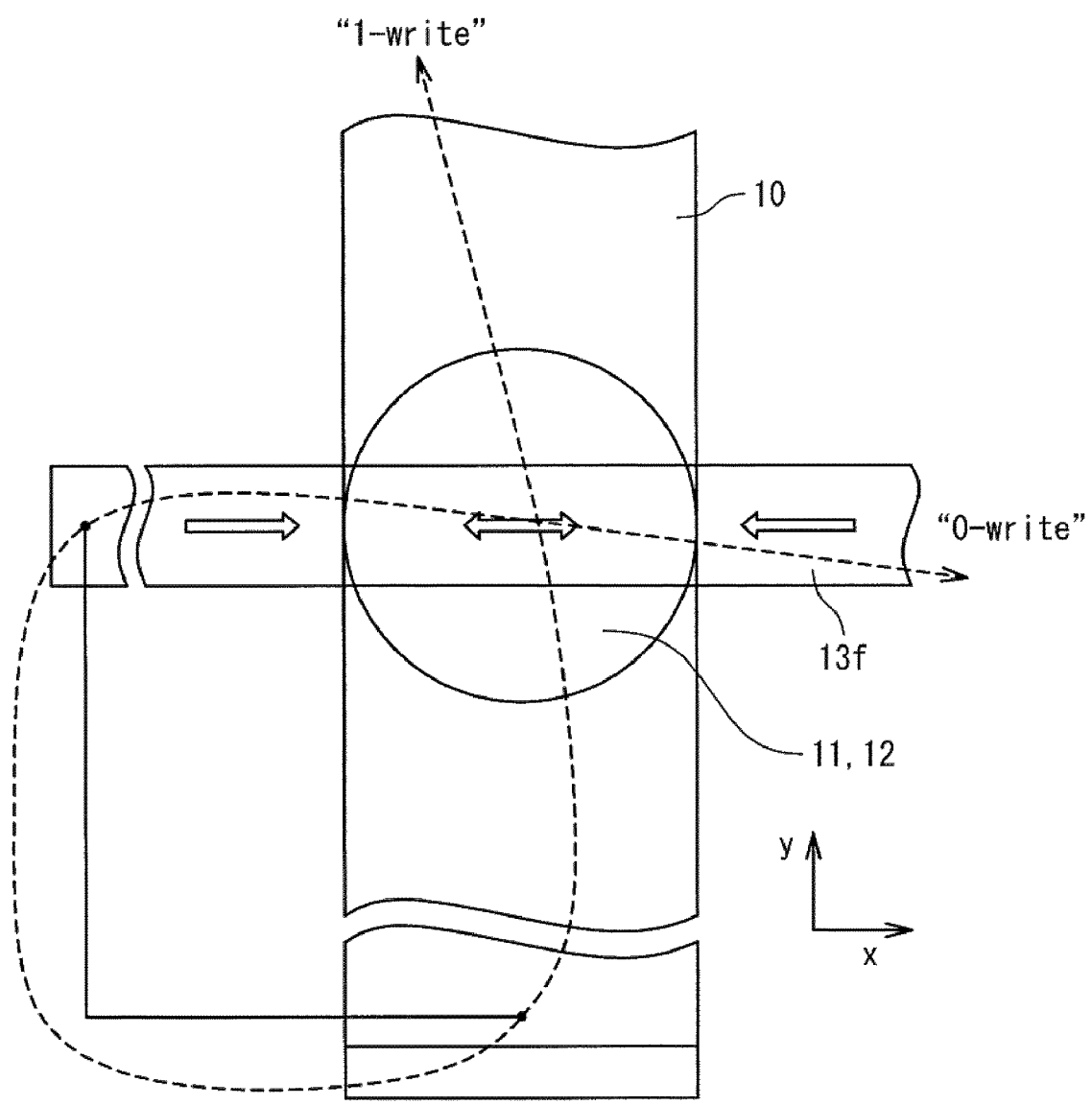
FIG. 61 is a plan view of a magnetic memory cell in a first modification of a fourth embodiment.

FIG. 61 is an x-y plan view showing a structure of a first modification of the magnetic memory cell according to the fourth embodiment of the present invention. In the present embodiment, the broad storage layer 13f is electrically connected to the interconnection layer 10.

In this modification, the current passing in the interconnection layer 10 in writing passes also in the broad storage layer 13f. Accordingly, both writing by the magnetic field and writing by the magnetic domain wall movement using spin torque transfer can be achieved through one current path. Thus, circuit in a surrounding area is simplified.

(Second Modification)

Figure 62:
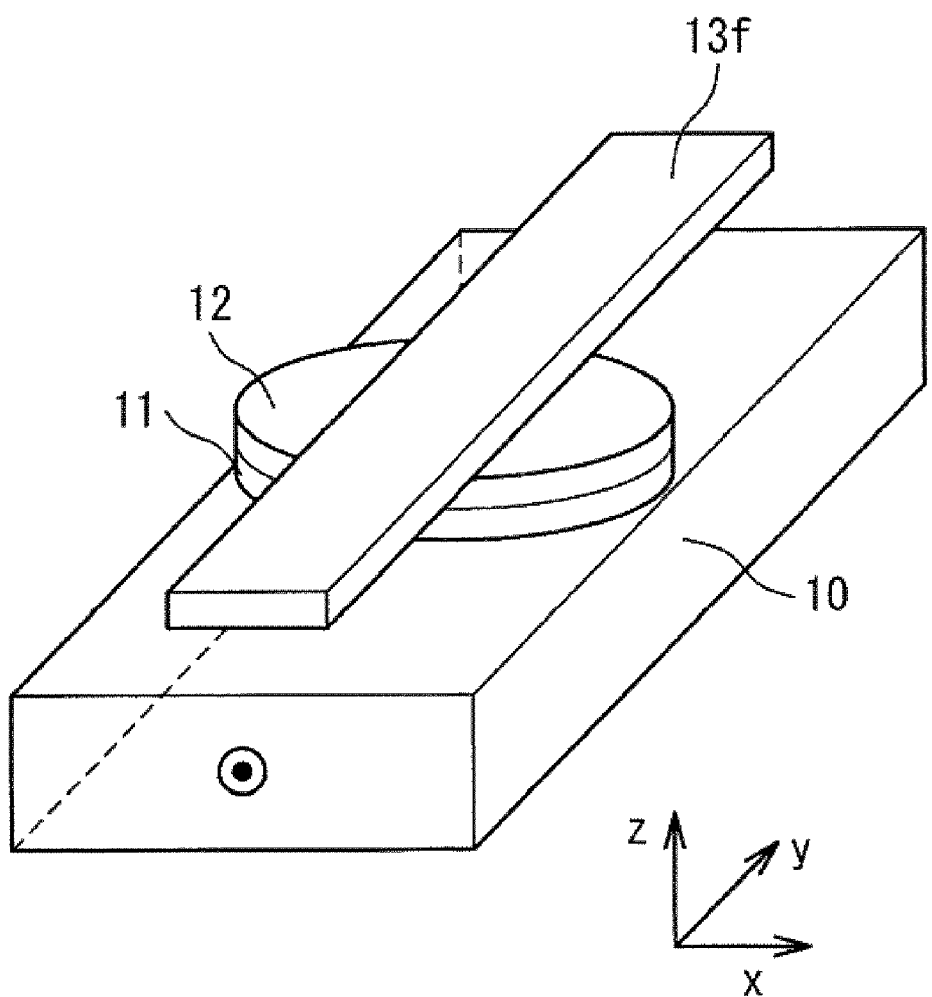
FIG. 62 is a perspective view of a magnetic memory cell in a second modification of the fourth embodiment.
Figure 63:
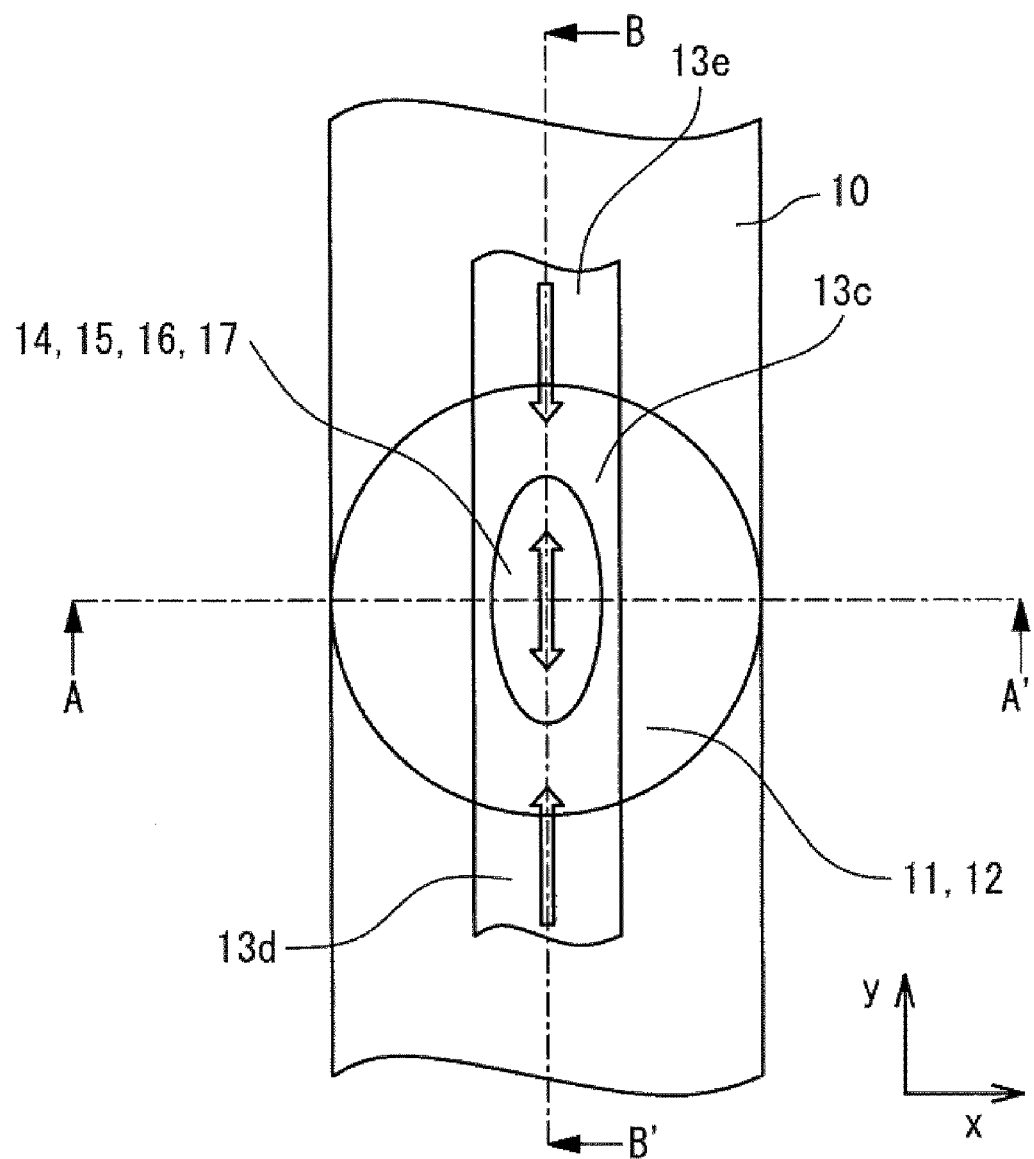
FIG. 63 is a perspective view of the magnetic memory cell in the second modification of the fourth embodiment.
Figure 64:
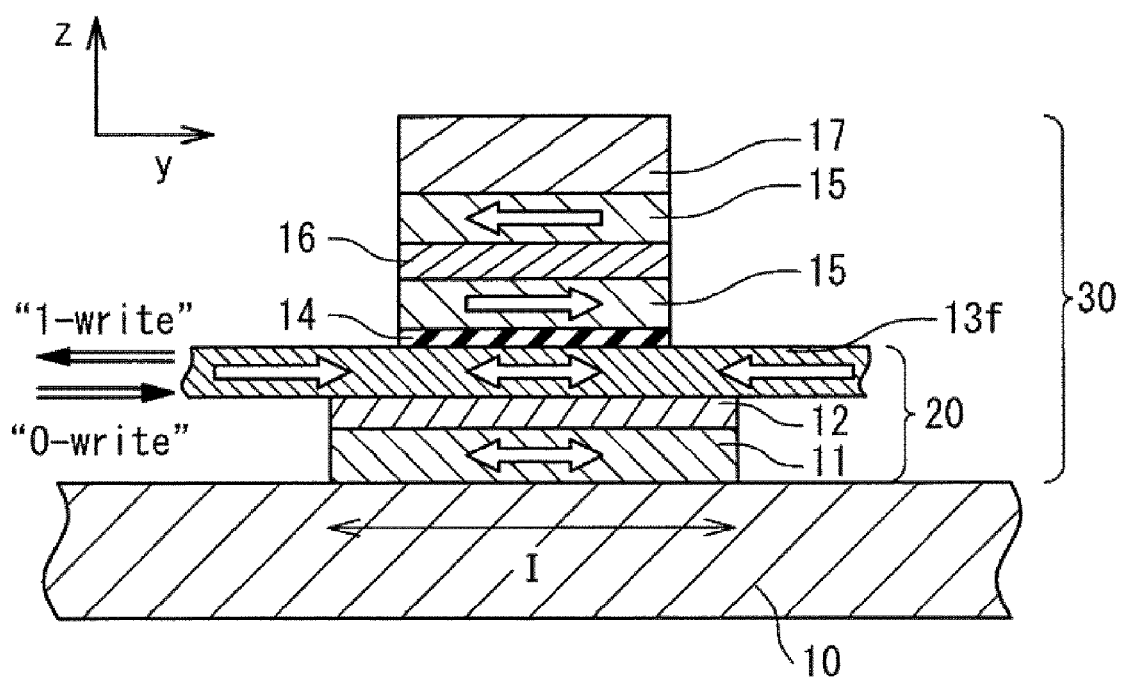
FIG. 64 is a sectional view of the magnetic memory cell in the second modification of the fourth embodiment.

FIG. 62 is a perspective view showing a structure of a second modification of the magnetic memory cell according to the fourth embodiment of the present invention, FIG. 63 is an x-y plan view showing the structure, and FIG. 64 is a sectional view along B-B' (y-z sectional view) in FIG. 63. This modification is similar to the first modification of the magnetic memory cell according to the third embodiment. In this modification, a longitudinal direction of the broad storage layer 13f is provided to be substantially parallel to the y-axis direction like the interconnection layer 10. Magnetic anisotropy of the magnetization fixed layer 15 and the storage layer 13c' is provided to be substantially parallel to the y-axis direction.

According to the write method in this modification, the current passes to the broad storage layer 13f and the magnetic domain wall movement using spin torque transfer described above is utilized, and furthermore, a current passes to the interconnection layer 10 and a magnetic field is applied to the sense layer 11 and the storage layer 13c'. It is noted that the magnetic field applied at this time becomes the hard axis direction of the storage layer 13c'.

Figure 65:
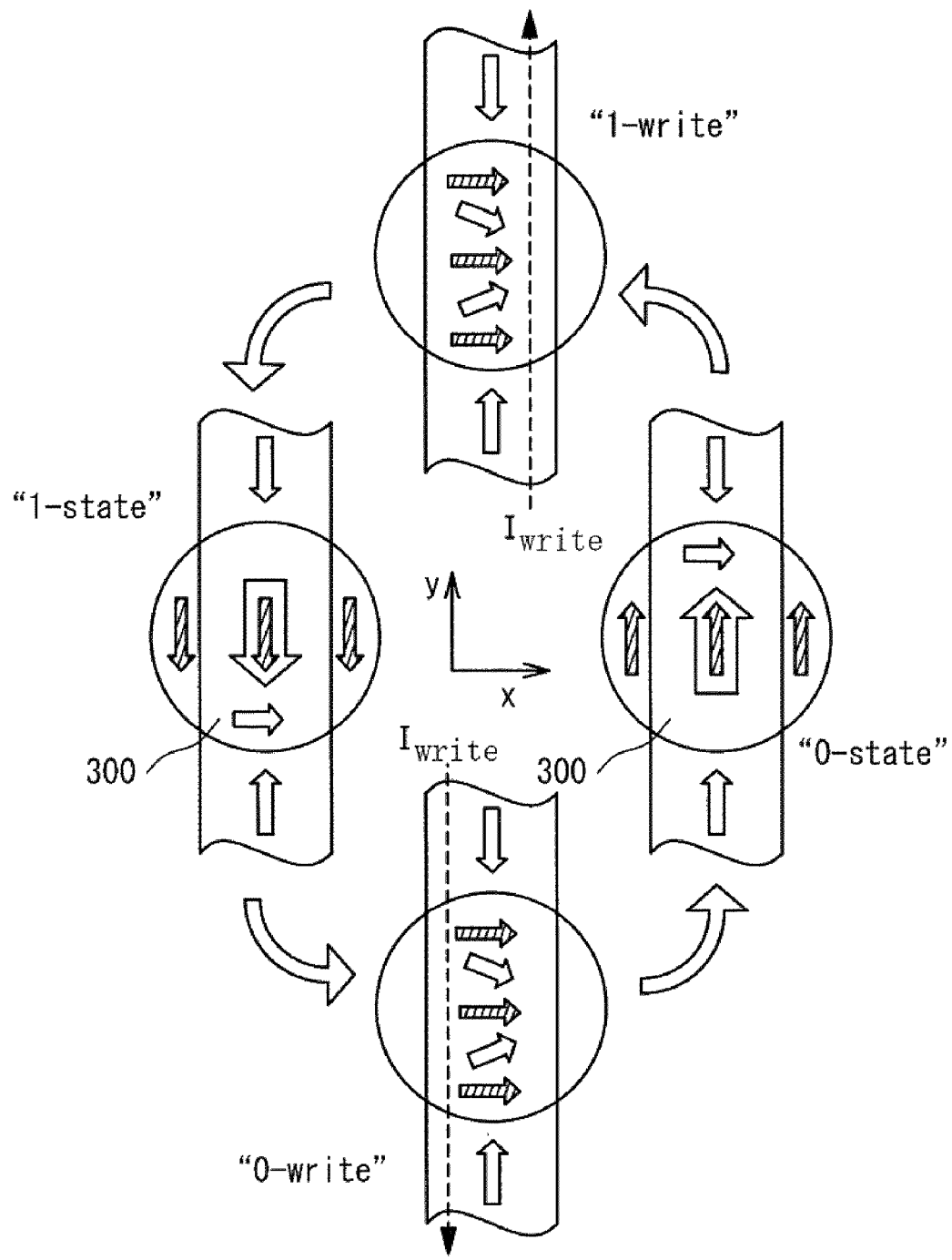
FIG. 65 is a view schematically showing an operating method of a magnetic memory cell in the second modification of the fourth embodiment.

FIG. 65 shows a specific flow. In FIG. 65, hollow arrows schematically represent the magnetic moments of the broad storage layer 13f and hatched arrows schematically represent the magnetic moments of the sense layer 11. In non-writing operation, magnetization of the sense layer 11 and the storage layer 13c' is oriented in the y-axis direction and a magnetic domain wall 300 is formed in the storage layer 13c' and the first magnetization fixed region 13d or the storage layer 13C' and the second magnetization fixed region 13e. In this state, when the current passes to both of the broad storage layer 13f and the interconnection layer 10, magnetization of the sense layer 11 tends to be oriented in the x-axis direction due to the magnetic field induced by the current. The storage layer 13c' is influenced by the sense layer 11 and becomes to have magnetized components in the x-axis direction. At this time, the magnetic domain wall is easy to move by the spin polarization current passing through the broad storage layer 13f.

The directions of the current passing to the interconnection layer 10 in writing "0" and writing "1" may be same or opposite. FIG. 65 shows behavior of the magnetic moments in the case of the same direction.

By applying the magnetic field in the hard axis direction of the storage layer 13c', magnetic domain wall movement with a lower current becomes possible. In this modification, as apparent from FIG. 63, since the longitudinal direction of the broad storage layer 13f is equal to that of the interconnection layer 10, area of the cell can be reduced.

Also in this modification as in the first modification, the broad storage layer 13 may be electrically connected to the interconnection layer 10.

Figure 66:
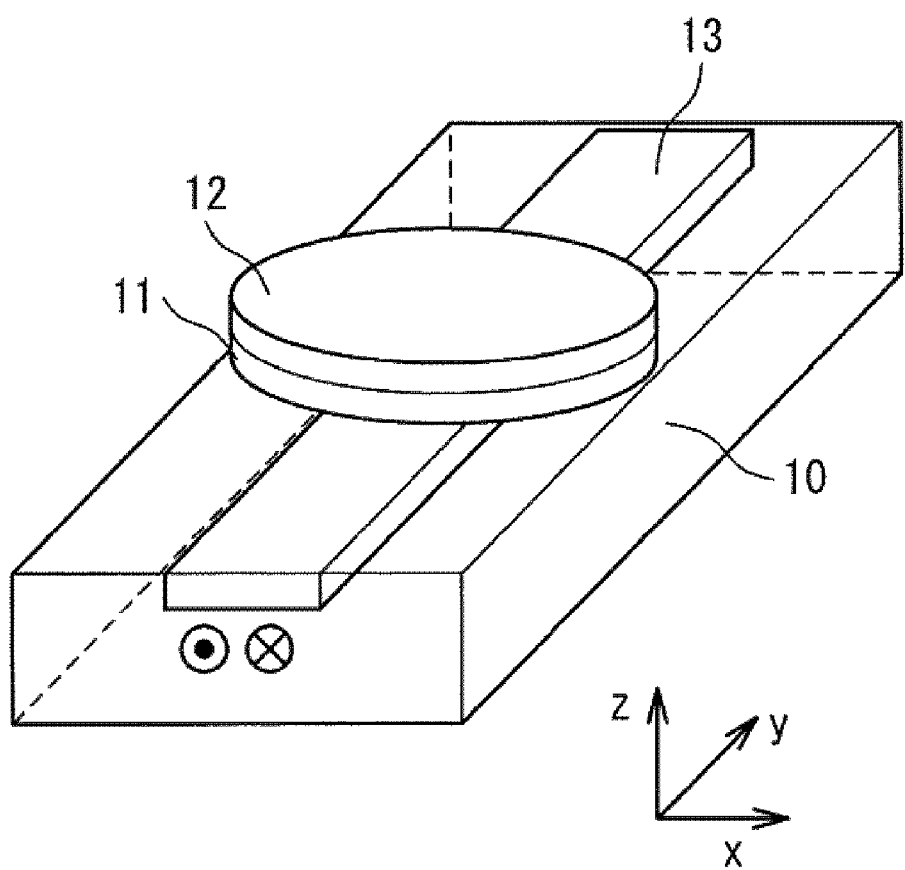
FIG. 66 is a perspective view of a magnetic memory cell in another mode of the second modification of the fourth embodiment.
Figure 67:
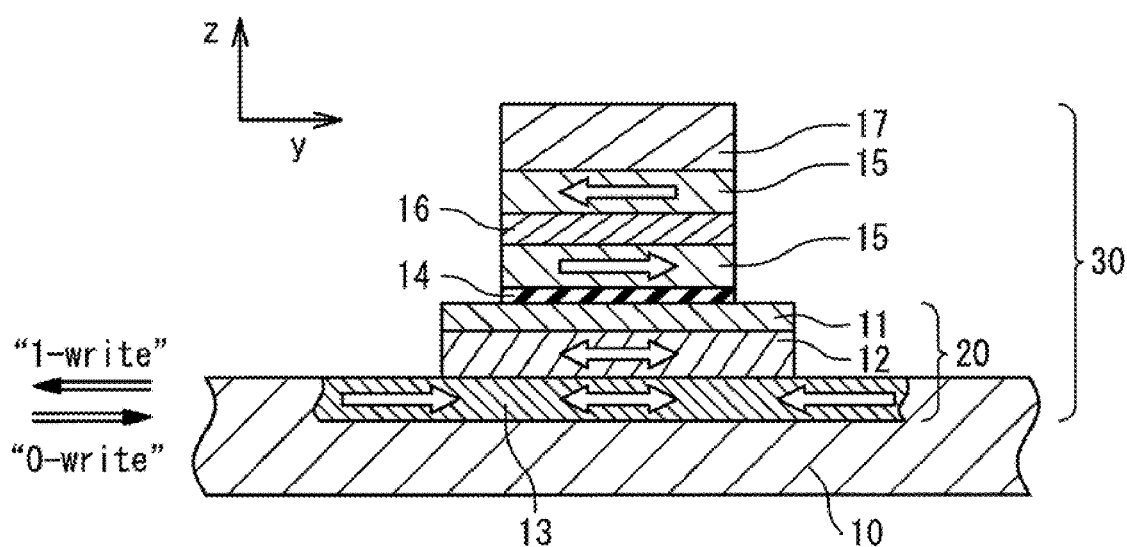
FIG. 67 is a sectional view of the magnetic memory cell in another mode of the second modification of the fourth embodiment.
Figure 68:
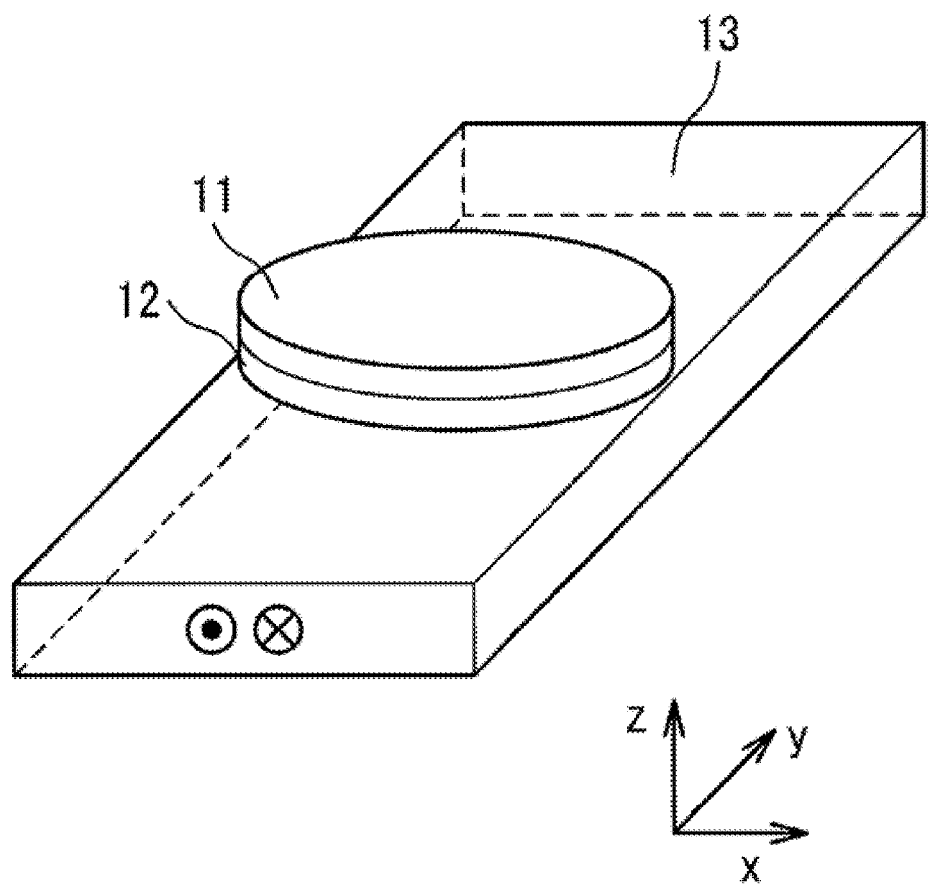
FIG. 68 is a perspective view of the magnetic memory cell in another mode of the second modification of the fourth embodiment.
Figure 69:
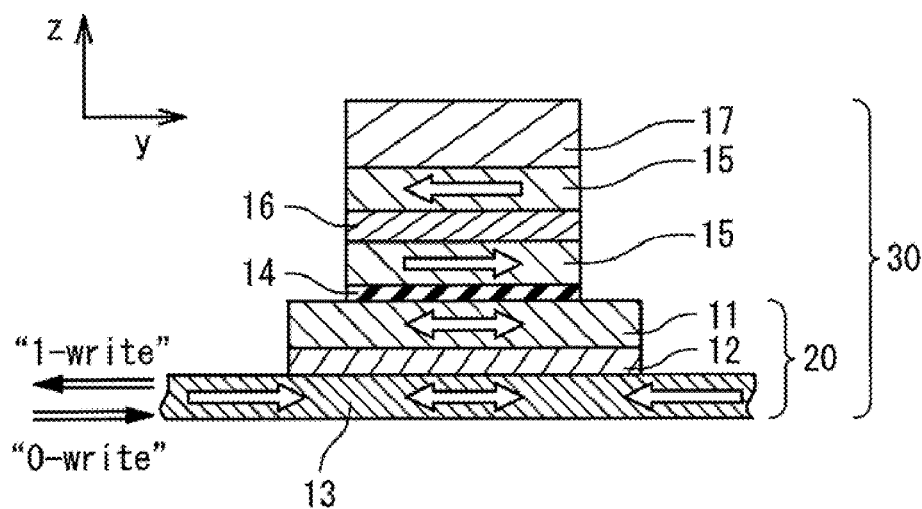
FIG. 69 is a sectional view of the magnetic memory cell in another mode of the second modification of the fourth embodiment.
Figure 70:
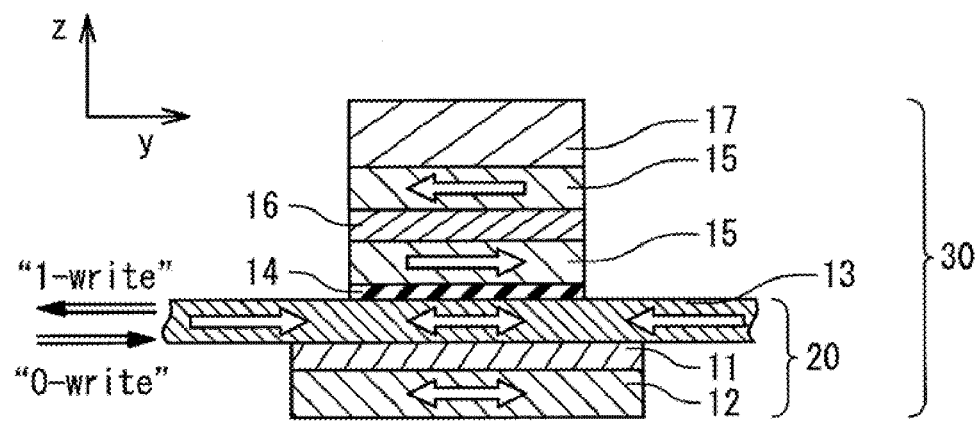
FIG. 70 is a sectional view of the magnetic memory cell in another mode of the second modification of the fourth embodiment.

This modification may be implemented as shown in FIGS. 66 and 67. FIG. 66 is a perspective view and FIG. 67 is a y-z sectional view. Furthermore, this modification may be also implemented as shown in FIGS. 68 and 69. FIG. 68 is a perspective view and FIG. 69 is a y-z sectional view. In addition, this modification may be also implemented as shown in FIG. 70. FIG. 70 is a y-z sectional view.

In FIGS. 66 and 67, the broad storage layer 13f is provided adjacent to the interconnection layer 10. Also in this case, the above-mentioned write method can be adopted. FIGS. 68 and 69 are obtained by omitting the interconnection layer 10 in FIGS. 66 and 67. In this case, in writing, a spin polarization current passes to the broad storage layer 13f, thereby generating magnetic domain wall movement, and at the same time, the magnetic field is applied to the sense layer 11 by a current passing through the storage layer 13 and the magnetic field rotates magnetization of the sense layer 11 in the x direction. The magnetized components in the x direction are conducted to the storage layer 13c' through the first bonding layer 12. Thereby, current driving magnetic domain wall movement is assisted by the effective magnetic field in the hard axis direction. FIG. 70 is different from FIGS. 68 and 69 in that the laminating order of the sense layer 11 and the broad storage layer 13f and the broad storage layer 13f is provided adjacent to the insulating layer 14.

The modifications shown in FIGS. 66 to 70 have more simplified configurations than that of the modifications shown in FIGS. 62 to 64.

The present invention can be applied to, for example, nonvolatile semiconductor memories used in mobile phone, mobile personal computers and PDAs, and microcomputers with a built-in nonvolatile memory used in automobiles and the like.

Several embodiments of the present invention have been described above. However, the above-mentioned embodiments are given to describe the present invention for clarification to those skilled in the art and must not be used to limit interpretation of appended claims.

What is claimed is:

1. A magnetoresistive effect element comprising:
   a magnetization free layer configured to have a reversible magnetization;
   a magnetization fixed layer whose magnetization is approximately fixed to a one direction; and
   an insulating layer between the magnetization free layer and the magnetization fixed layer,
   wherein the magnetization free layer comprises:
      a sense layer;
      a storage layer; and
      a first bonding layer between the sense layer and the storage layer,
      wherein at least a part of the sense layer is magnetically coupled to the storage layer through the first bonding layer,
      a magnetic anisotropy of the storage layer is larger than an magnetic anisotropy of the sense layer, and
      a product of a saturation magnetization and a volume of the sense layer is larger than a product of a saturation magnetization and a volume of the storage layer.

2. The magnetoresistive effect element according to claim 1, wherein an area of the sense layer is larger than an area of the storage layer.

3. The magnetoresistive effect element according to claim 2, wherein the storage layer is included in the sense layer in a direction parallel to a surface of a substrate.

4. The magnetoresistive effect element according to claim 1, wherein at least one of the sense layer and the storage layer has a planar shape other than an ellipse, and the sense layer is configured to become S magnetic domain when a magnetic field is not applied.

5. The magnetoresistive effect element according to claim 1, wherein at least one of the magnetization fixed layer, the sense layer and the storage layer is composed of a plurality of ferromagnetic layers, and neighboring layers among the plurality of ferromagnetic layers are magnetically coupled to one another through a bonding layer.

6. The magnetoresistive effect element according to claim 1, wherein the storage layer is adjacent to the insulating layer.

7. The magnetoresistive effect element according to claim 1, wherein the sense layer is composed of a nanocomposite material.

8. A magnetic random access memory comprising:
   a magnetoresistive effect element according to claim 1; and
   a first interconnection layer electrically connected to an end of the magnetoresistive element,
   wherein by defining a lengthwise direction of the first interconnection layer as a Y direction, and a direction orthogonal to the X direction in a plane vertical to a laminating direction of the magnetoresistive element as a Y direction, a magnetic anisotropy of the storage layer has a component of the X direction, and
   writing of information to the magnetoresistive element is performed by switching a magnetization of the storage layer by applying a magnetic field induced by passing a current to the first interconnection layer.

9. The magnetic random access memory according to claim 8, further comprising:
   a conductive layer arranged between the magnetoresistive element and the first interconnection layer.

10. The magnetic random access memory according to claim 8, wherein writing information to the magnetoresistive element is performed by;
    switching a magnetization of the storage layer by: a magnetic field induced by passing a current to the first interconnection layer; and a torque applied to a magnetic moment of the magnetization free layer through a spin polarized current passing the magnetization free layer, the insulating layer and the magnetization fixed layer.

11. The magnetic random access memory according to claim 8, wherein the storage layer is configured to have: a first magnetization fixed region having a magnetization fixed in one direction positioned at an end of the storage layer; and a second magnetization fixed region having a magnetization fixed in one direction positioned at another end of the storage layer, and
    both of a magnetization of the first magnetization fixed region and a magnetization of the second magnetization fixed region are fixed to be directed towards the storage region, or both of them are fixed to be directed to be away from the storage layer.

12. The magnetic random access memory according to claim 11, wherein writing of information to the magnetoresistive element is performed by switching a magnetization of the storage layer by:
applying a magnetic field induced by passing a current to the first interconnection layer; and
by a pressure applied to a magnetic domain wall formed in the storage layer by a spin-polarized current passing through the storage layer.

13. The magnetic random access memory according to claim 11, wherein an anisotropy of the storage layer is formed to have a vertical component to a Y direction assuming that the Y direction is a lengthwise direction of the first interconnection layer, and
writing of information to the magnetoresistive element is performed by switching a magnetization of the storage layer by:
applying a magnetic field induced by passing a current to the first interconnection layer; and
by a pressure applied to a magnetic domain wall formed in the storage layer by a spin-polarized current passing through the storage layer.

14. The magnetic random access memory according to claim 11, wherein an anisotropy of the storage layer is formed to be approximately parallel to a lengthwise direction to the first interconnection layer, and
writing of information to the magnetoresistive element is performed by switching a magnetization of the storage layer by:
applying a magnetic field induced by passing a current to the first interconnection layer; and
by a pressure applied to a magnetic domain wall formed in the storage layer by a spin-polarized current passing through the storage layer.

15. The magnetic random access memory according to claim 8, wherein by defining a lengthwise direction of the first interconnection layer as a Y direction, and a direction orthogonal to the X direction, a magnetization easy axis of at least one of the sense layer and the storage layer has both of components of the X direction and the Y direction.

16. The magnetic random access memory according to claim 8, further comprising:
a yoke layer including at least one layer composed of a ferromagnetic layer on a surface of the first interconnection layer other than the magnetoresistive effect element.

17. The magnetic random access memory according to claim 8, wherein the sense layer is formed on three surfaces on the first interconnection layer.

18. The magnetic random access memory according to claim 8, wherein the sense layer comprises:
a third sense layer arranged on a side where the magnetization fixed layer is arranged to the first interconnection layer; and
a fourth sense layer arranged on an opposite side to the side where the magnetization fixed layer is arranged.

19. The magnetic random access memory according to claim 18, wherein a sum of: a product of a saturation magnetization and a volume of the third sense layer; and a saturation magnetization and a volume of the storage layer is equal to or more than 0.5 times and equal to or less than 1.5 times to a product of a saturation magnetization and a volume of the fourth sense layer.

20. The magnetic random access memory according to claim 8, wherein at least a part of the first interconnection layer is designed whose resistance is higher than other part of the first interconnection layer.

21. A magnetic random access memory comprising:
a magnetoresistive effect element according to claim 1,
wherein the storage layer comprises a second magnetization fixed region having a first magnetization fixed layer in which a magnetization is fixed in one direction at one end, and having a second magnetization fixed region in which a magnetization is fixed in one direction at another end,
both of a magnetization of the first magnetization fixed region and a magnetization of the second magnetization fixed region are fixed to be directed towards the storage region, or both of them are fixed to be directed to be away from the storage layer, and
writing of information to the magnetoresistive element is performed by switching a magnetization of the storage layer by:
a magnetic influence on the storage layer through the first bonding layer caused by a rotation of a magnetization of the sense layer in accordance with an application of a magnetic field to the sense layer induced by passing a current to the storage layer; and
by a pressure applied to a magnetic domain wall formed in the storage layer by a spin-polarized current passing through the storage layer.

22. The magnetoresistive effect element according to claim 1, wherein an aspect ratio of the sense layer is less than an aspect ratio of the storage layer.

23. A magnetic random access memory comprising:
the magnetoresistive effect element according to claim 1;
a first interconnection layer electrically connected to an end of the magnetoresistive element; and
a second interconnection layer arranged in a vicinity of the magnetoresistive element, and
writing of information to the magnetoresistive element is performed by switching a magnetization of the storage layer by applying a magnetic field induced by passing a current to the first interconnection layer and the second interconnection layer.

24. A magnetic random access memory comprising:
the magnetoresistive effect element according to claim 1; and
a first interconnection layer electrically connected to an end of the magnetoresistive element,
wherein by defining a lengthwise direction of the first interconnection layer as an Y direction, and a direction orthogonal to the X direction in a plane vertical to a laminating direction of the magnetoresistive element as a Y direction, a magnetic anisotropy of the storage layer has a component of the X direction, and
writing of information to the magnetoresistive element is performed by switching a magnetization of the storage layer by: applying a magnetic field induced by passing a current to the first interconnection layer; and a torque applied to a magnetic moment of the magnetization free layer through a spin polarized current passing the magnetization free layer, the insulating layer and the magnetization fixed layer.

25. A magnetic random access memory comprising:
a first interconnection layer electrically connected to an end of the magnetoresistive element according to claim 1,
wherein by defining a lengthwise direction of the first interconnection layer as an Y direction, a magnetic anisotropy of the storage layer is approximately parallel to the Y direction, and
writing of information to the magnetoresistive element is performed by switching a magnetization of the storage layer by: applying a magnetic field induced by passing a current to the first interconnection layer; and a torque applied to the magnetization free layer through a spin polarized current passing the magnetization free layer, the insulating layer and the magnetization fixed layer.

26. A magnetoresistive effect element comprising:
a magnetization free layer configured to have a reversible magnetization;
a magnetization fixed layer whose magnetization is approximately fixed to a one direction; and
an insulating layer between the magnetization free layer and the magnetization fixed layer,
wherein the magnetization free layer comprises:
  a sense layer;
  a storage layer; and
  a first bonding layer between the sense layer and the storage layer,
  wherein at least a part of the sense layer is magnetically coupled to the storage layer through the first bonding layer,
  by defining that a direction along a long axis by an A direction and a direction of a short axis along a short axis by a B direction, a ratio of a length of the storage layer in the A direction to a length of the storage layer in the B direction is equal to or less than 5,
  a ratio of a length of the sense layer in the A direction to a length of the sense layer in the B direction is equal to or larger than 0.5 and equal to or less than 2.0, and
  a product of a saturation magnetization and a volume of the sense layer is larger than a product of a saturation magnetization and a volume of the storage layer.

27. A magnetoresistive effect element comprising:
a magnetization free layer configured to have a reversible magnetization;
a magnetization fixed layer whose magnetization is approximately fixed to a one direction; and
an insulating layer between the magnetization free layer and the magnetization fixed layer,
wherein the magnetization free layer comprises:
  a sense layer;
  a storage layer;
  a first bonding layer between the sense layer and the storage layer,
  wherein at least a part of the sense layer is magnetically coupled to the storage layer through the first bonding layer,
  by defining that a direction along a long axis by an A direction and a direction of a short axis along a short axis by a B direction, a ratio of a length of the storage layer in the A direction to a length of the storage layer in the B direction is equal to or less than 5,
  a length of the storage layer in a B direction is equal to or larger than 0.1 µm and equal to or less than 0.4 µm, and
  a thickness of the storage layer is equal to or larger than 0.5 nm and equal to or less than 5.0 nm, and
  a ratio of a length of the sense layer in the A direction to a length of the sense layer in the B direction is equal to or larger than 0.5 and equal to or less than 2.0, and
  a length of the sense layer in a direction of a short axis is equal to or larger than 0.4 µm and equal to or less than 1.2 µm, and
  a thickness of the sense layer is equal to or larger than 0.5 nm.

* * * * *